(12) United States Patent
Elam et al.

(10) Patent No.: US 8,921,799 B2
(45) Date of Patent: Dec. 30, 2014

(54) TUNABLE RESISTANCE COATINGS

(75) Inventors: Jeffrey W. Elam, Elmhurst, IL (US);
Anil U. Mane, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 13/525,067

(22) Filed: Jun. 15, 2012

(65) Prior Publication Data
US 2013/0335190 A1  Dec. 19, 2013

Related U.S. Application Data

(63) Continuation-in-part of application No. 13/011,645, filed on Jan. 21, 2011.

(51) Int. Cl.
*G01T 3/00* (2006.01)

(52) U.S. Cl.
USPC .................................................. 250/390.01

(58) Field of Classification Search
USPC .................................................. 250/390.01
See application file for complete search history.

(56) References Cited

U.S. PATENT DOCUMENTS

| | | | |
|---|---|---|---|
| 3,673,457 A | 6/1972 | Sackinger et al. | |
| 3,739,216 A | 6/1973 | Pakswer | |
| 4,051,403 A | 9/1977 | Feingold et al. | |
| 4,625,106 A | 11/1986 | Bender et al. | |
| 4,757,229 A | 7/1988 | Schmidt et al. | |
| 5,068,634 A | 11/1991 | Shrier | |
| 5,086,248 A | 2/1992 | Horton et al. | |
| 5,216,249 A | 6/1993 | Jones et al. | |
| 5,334,840 A | 8/1994 | Newacheck et al. | |
| 5,402,034 A | 3/1995 | Blouch et al. | |
| 5,726,076 A | 3/1998 | Tasker et al. | |
| 6,200,893 B1 | 3/2001 | Sneh | |
| 6,420,279 B1 | 7/2002 | Ono et al. | |
| 6,479,826 B1 | 11/2002 | Klann et al. | |
| 6,495,837 B2 | 12/2002 | Odom et al. | |
| 6,503,330 B1 | 1/2003 | Sneh et al. | |
| 6,545,281 B1 | 4/2003 | McGregor et al. | |
| 6,585,823 B1 | 7/2003 | Van Wijck | |
| 6,876,711 B2 | 4/2005 | Wallace et al. | |
| 7,164,138 B2 | 1/2007 | McGregor et al. | |
| 7,233,007 B2 | 6/2007 | Downing et al. | |
| 7,335,594 B1 * | 2/2008 | Wang et al. | 438/677 |
| 7,595,270 B2 | 9/2009 | Elers et al. | |
| 7,759,138 B2 | 7/2010 | Beaulieu et al. | |
| 8,101,480 B1 | 1/2012 | Kim et al. | |
| 2007/0131849 A1 | 6/2007 | Beaulieu et al. | |
| 2009/0212680 A1 | 8/2009 | Tremsin et al. | |
| 2009/0215211 A1 | 8/2009 | Tremsin et al. | |
| 2009/0315443 A1 | 12/2009 | Sullivan et al. | |
| 2010/0044577 A1 | 2/2010 | Sullivan et al. | |

OTHER PUBLICATIONS

PCT/US2011/064593, International Search Report, Jul. 11, 2012.

(Continued)

*Primary Examiner* — David Porta
*Assistant Examiner* — Edwin Gunberg
(74) *Attorney, Agent, or Firm* — Foley & Lardner LLP

(57) ABSTRACT

A method and article of manufacture of intermixed tunable resistance composite materials. A conducting material and an insulating material are deposited by such methods as ALD or CVD to construct composites with intermixed materials which do not have structure or properties like their bulk counterparts.

19 Claims, 49 Drawing Sheets

(56) References Cited

OTHER PUBLICATIONS

Elam et al., "Properties of ZnO/Al2O3 Allow Films Grown Using Atomic Layer Deposition Techniques", *Journal of the Electrochemical Society*, (2003), pp. G339-G347, 150 (6), The Electrochemical Society, Inc., USA.

George, S., "Fabrication and Priorities of Nanolaminates Using Self-Limiting Surface Chemistry Techniques", Dept. of Chemistry and Biochemistry, Dept. of Chemical Engineering, Nov. 2002, 20 pages.

* cited by examiner

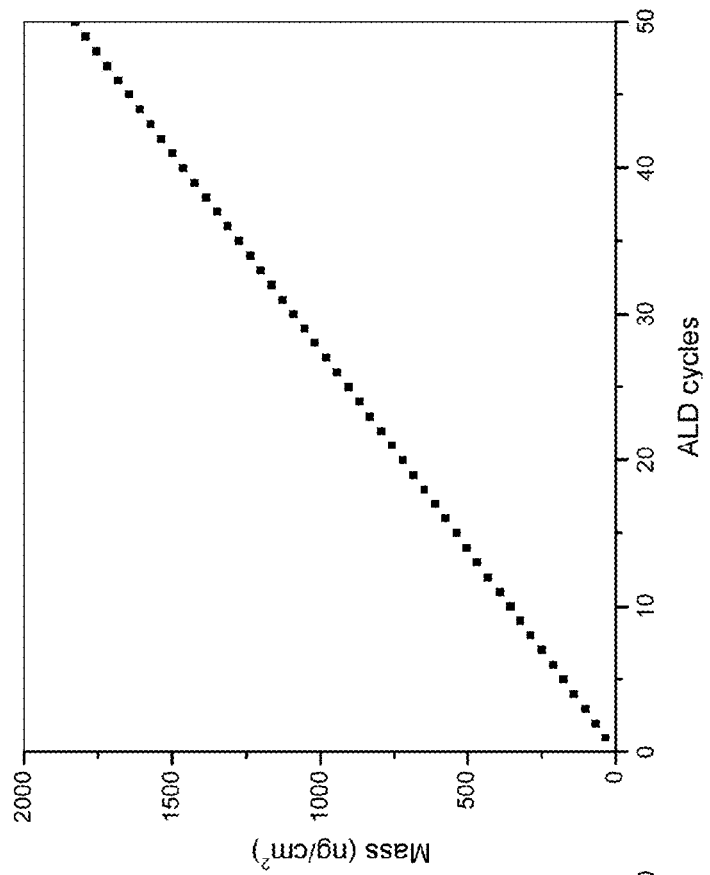
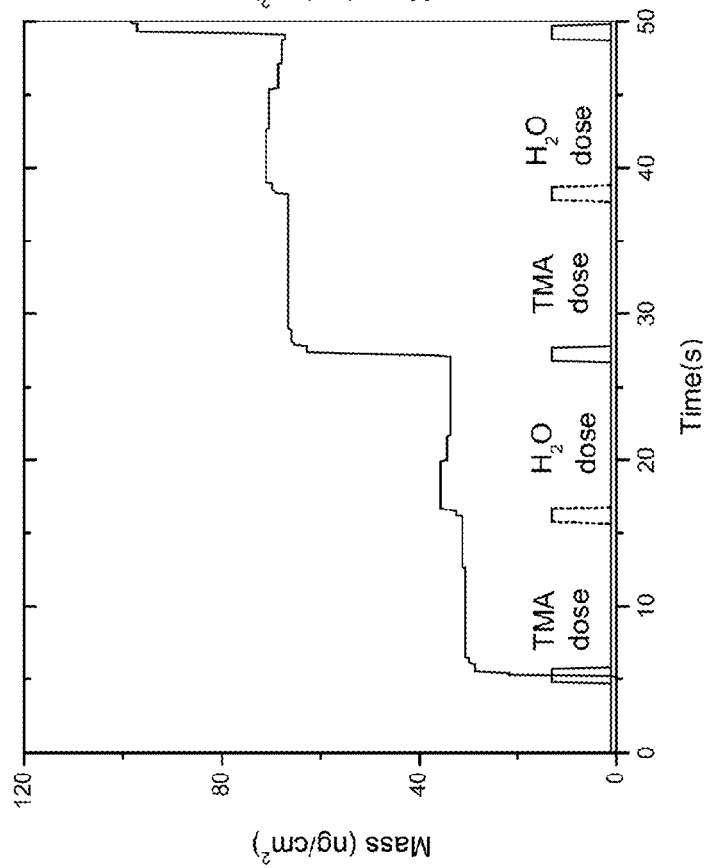
FIGS. 2(b)
FIGS. 2(a)

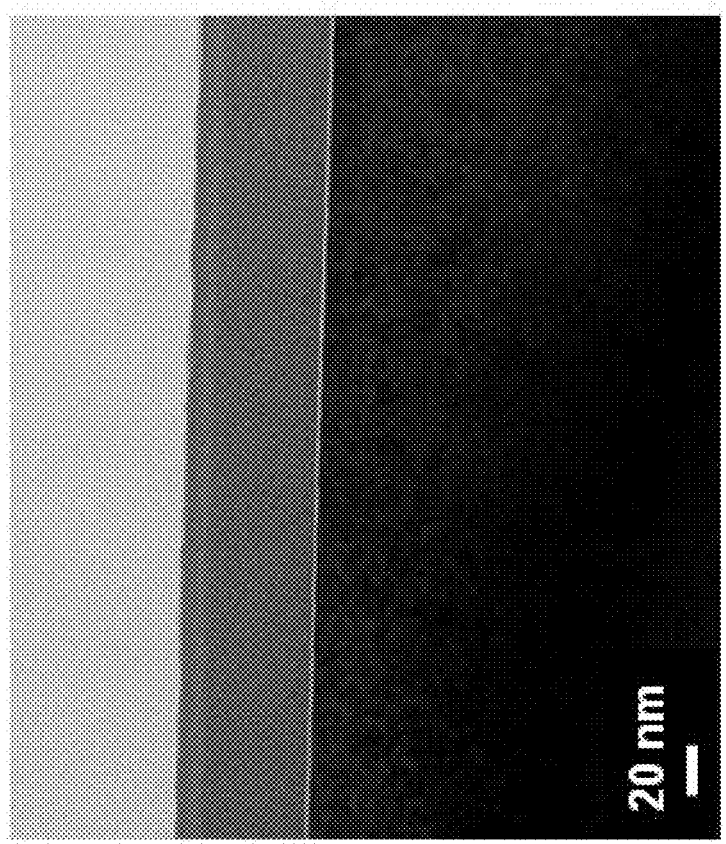
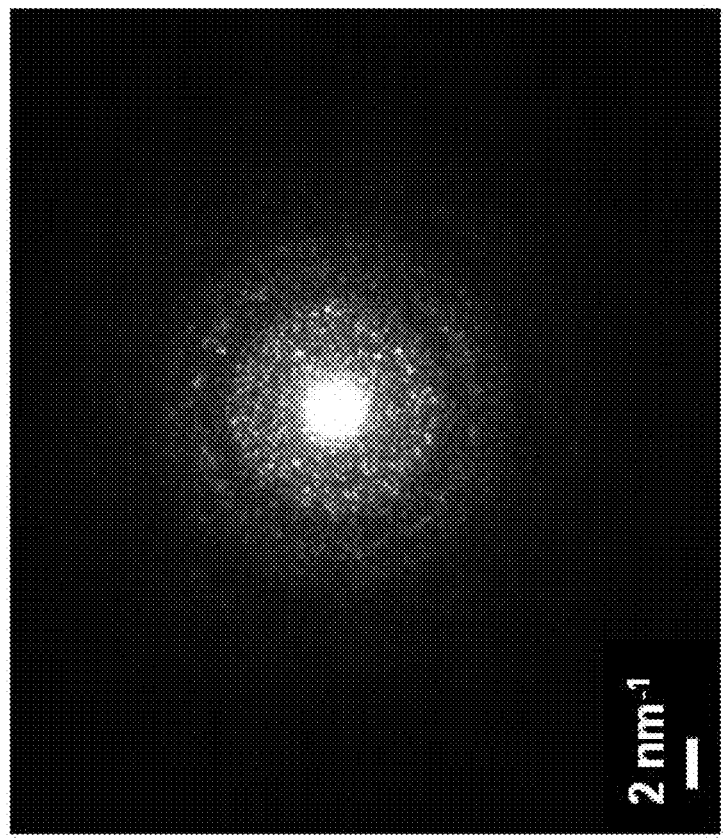
FIG. 10(a)
FIG. 10(b)

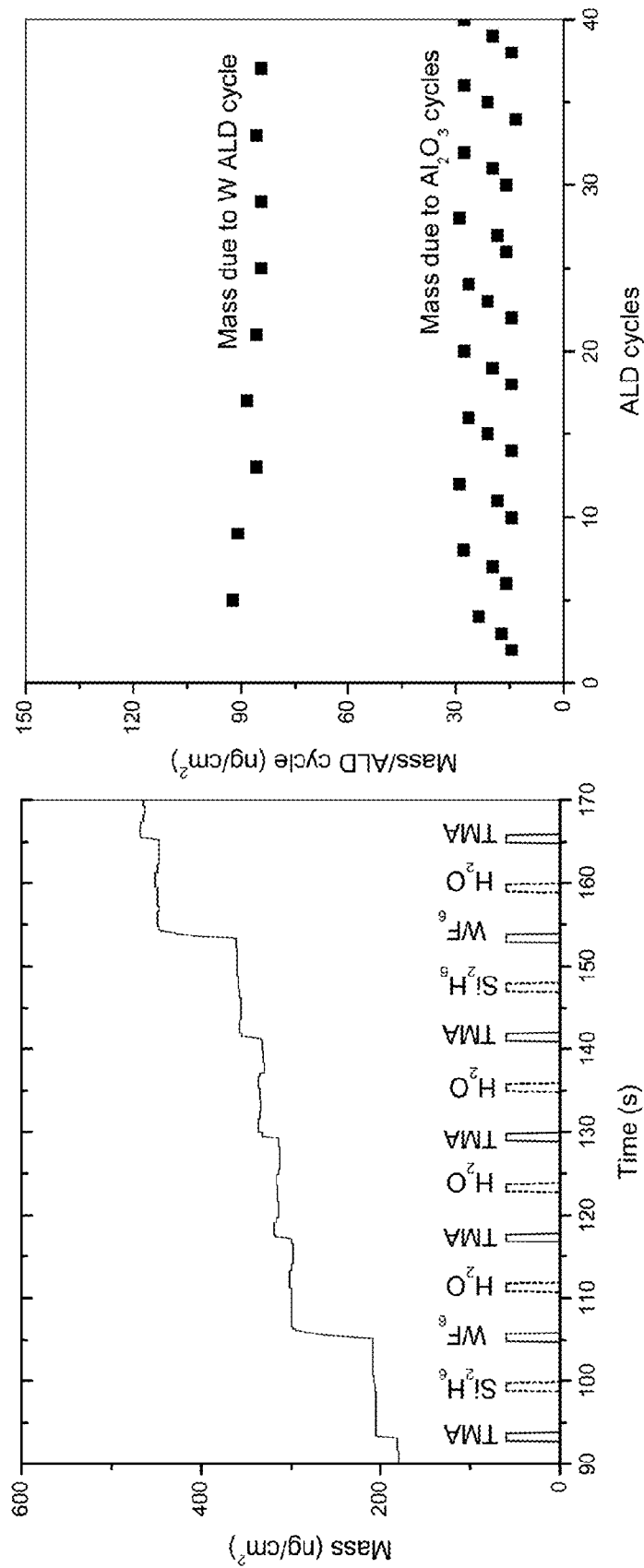

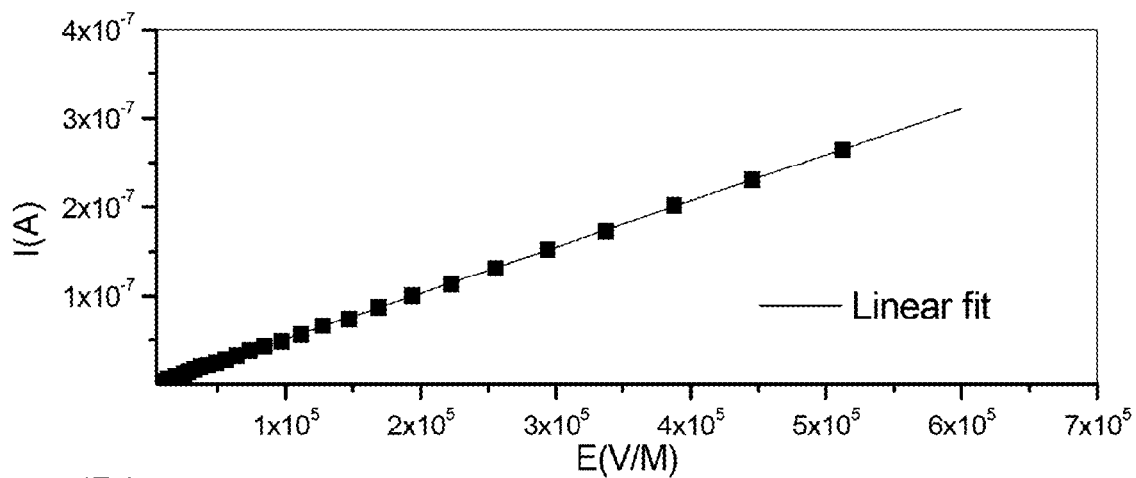
FIG. 20(d)(1)
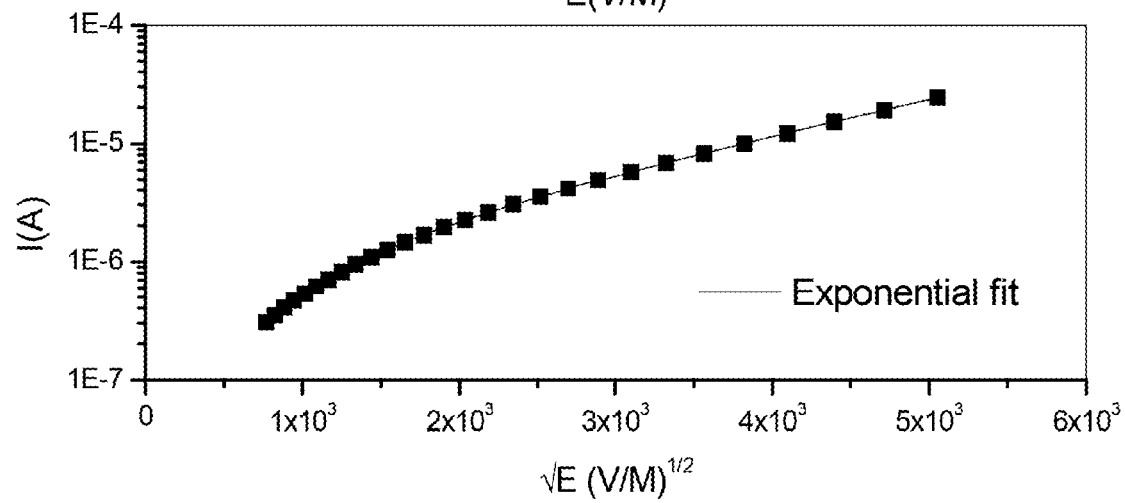
FIG. 20(d)(2)

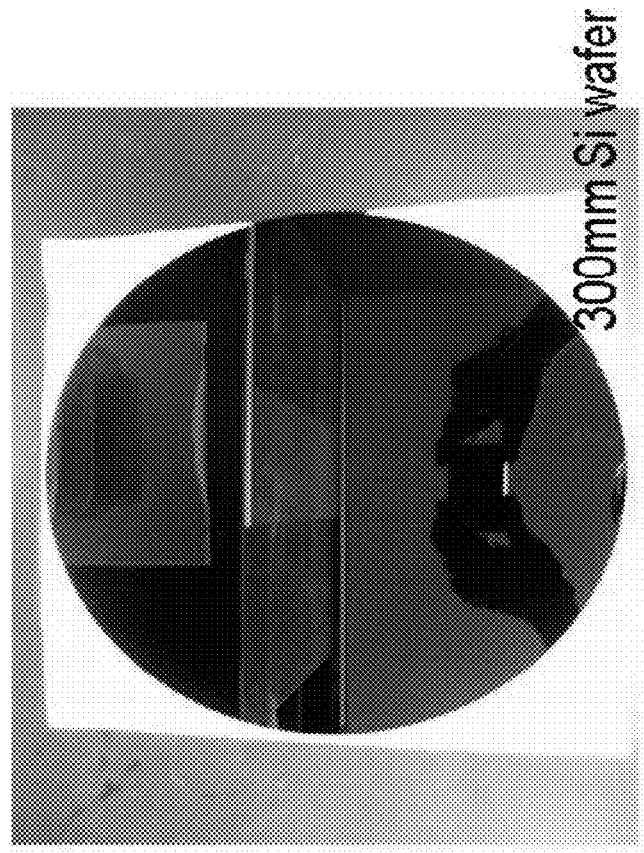
FIG. 26(b) 300mm Si wafer
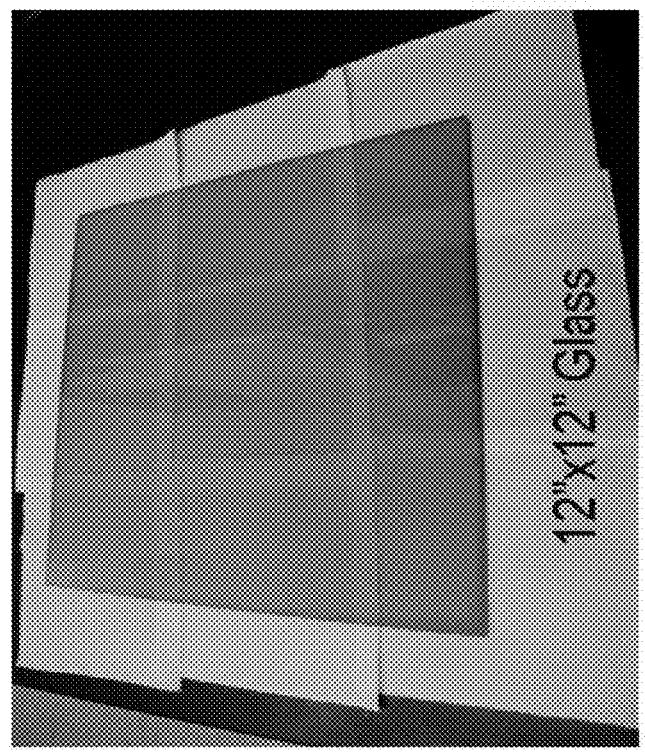
FIG. 26(a) 12"x12" Glass

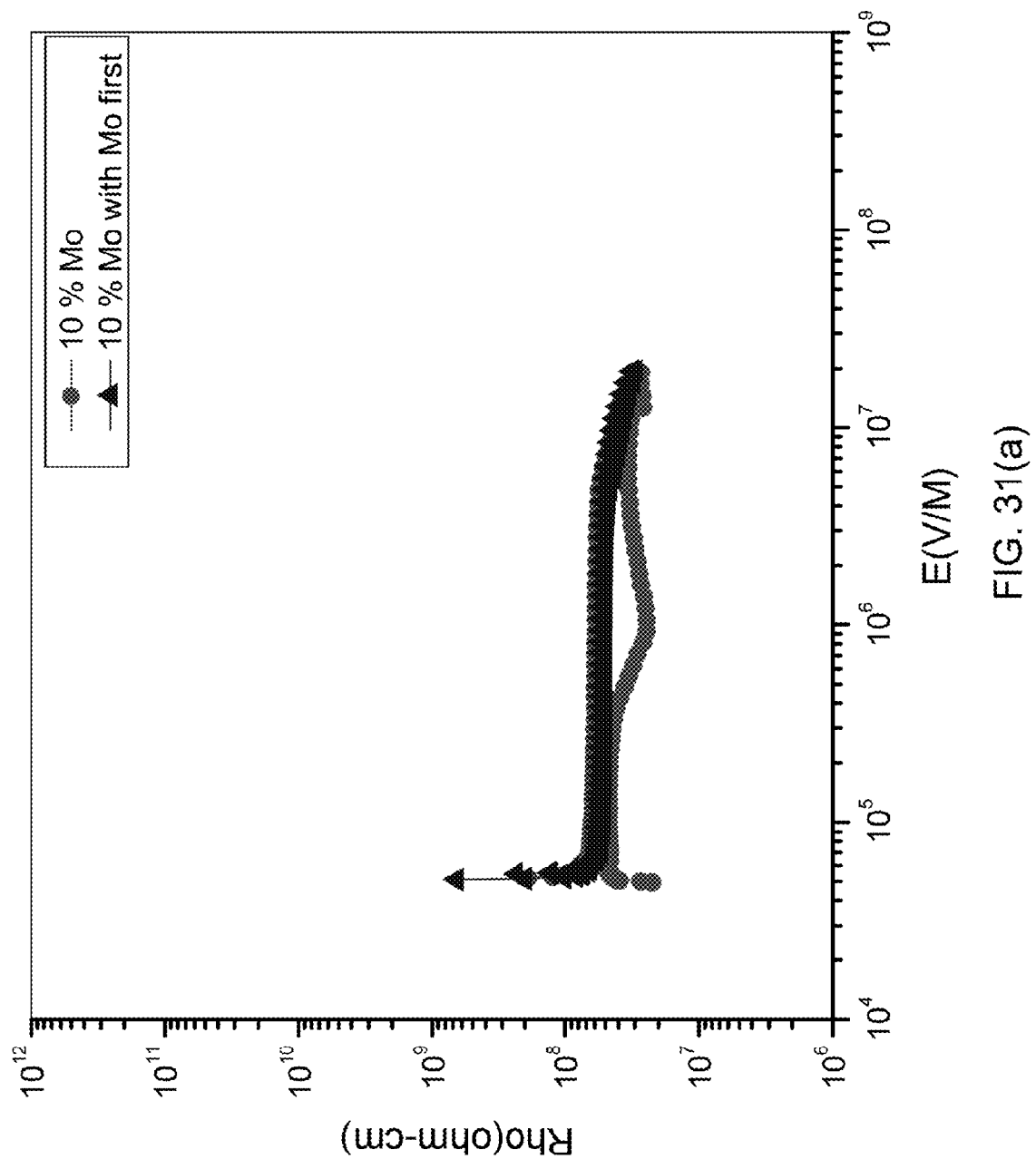

FIG. 34(a)
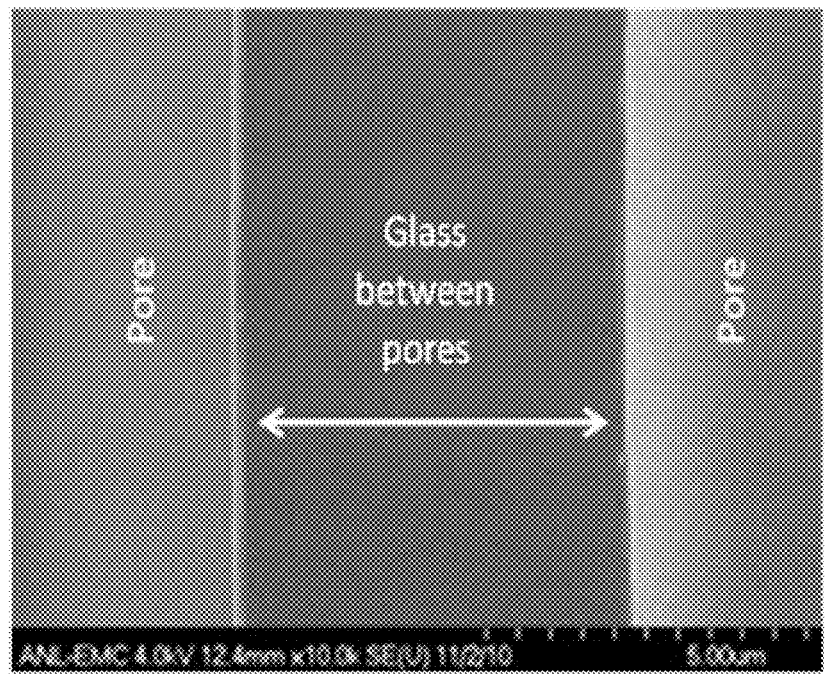
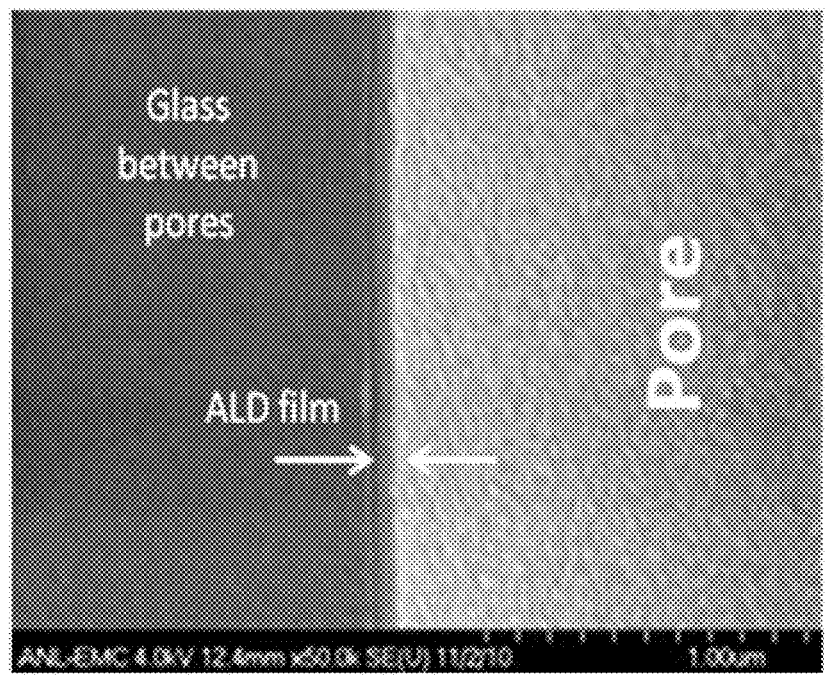
FIG. 34(b)

TUNABLE RESISTANCE COATINGS

CROSS REFERENCE TO RELATED APPLICATIONS

This application claims the benefit, under 35 U.S.C. § 120 as a continuation-in-part (CIP) of U.S. non-provisional application Ser No. 13/011,645, entitled "MICROCHANNEL PLATE DETECTOR AND METHODS FOR THEIR FABRICATION," filed Jan. 21, 2011.

GOVERNMENT RIGHTS

The United States Government has certain rights in this invention pursuant to Contract No. DE-AC02-06CH11357 between the United States Government and UChicago Argonne, LLC, representing Argonne National Laboratory.

FIELD

The present invention relates to tunable resistance coatings. More particularly, the invention relates to compositions of matter and methods of manufacture of $W:AlO_x$ and $Mo:AlO_x$ thin film having tunable resistance.

BACKGROUND

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section. Thin film materials of metal-metal oxides of nanocomposites can have many applications, including resistive layers for electronic applications, such as, for example, electron multipliers like microchannel plates, resistive memories, electro-chromic devices, biomedical devices and charge dissipating coatings on microelectromechanical systems. A related application, U.S. Ser. No. 13/011,645, which is incorporated by reference herein, describes microchannel plate fabrication by atomic layer deposition ("ALD" hereinafter), which provide an example of how one can benefit from the tunable resistance coatings and methods of preparation described herein.

SUMMARY

In one embodiment, thin layers of nanocomposite tungsten-aluminum oxide ($W:Al_2O_3$) can be prepared for various commercial purposes. In another embodiment molybdenum-aluminum oxide ($Mo:Al_2O_3$) with tunable resistivity can be prepared for various commercial purposes. These thin layers preferably were deposited using ALD by combining alternating exposures to disilane and/or tungsten and molybdenum hexafluoride for W deposited by ALD with alternating exposures of trimethyl aluminum and water for $Al_2O_3$ deposition by ALD. The film thicknesses were measured by using ex-situ ellipsometry, cross-sectional scanning electron microscopy, and transmission electron microscopy. The crystallinity and topography were examined using X-ray diffraction and atomic force microscopy, respectively. The composition of the composite layers was investigated by X-ray photoelectron spectroscopy, and the electrical conductivity was evaluated using current-voltage measurements. The thickness, composition, microstructure, and electrical properties of $W:Al_2O_3$ and $Mo:Al_2O_3$ nanocomposite layers were smooth and showed an amorphous nature via X-ray diffraction scans. The growth rate varied between 1.1-5 Å/cycle depending on the precursor ratio as well as sequence ALD precursors. The nature of ALD precursor dose pulses sequencing demonstrated a significant influence on the electrical properties of the desired $W:Al_2O_3$ or $Mo:Al_2O_3$ composite materials. To understand the film growth and electrical properties of $W:Al_2O_3$ and $Mo:Al_2O_3$ layers, in-situ quartz crystal microbalance measurements were performed during the W (Mo),$Al_2O_3$ and W (Mo):$Al_2O_3$ ALD. The electrical properties for various compositions of W (Mo):$Al_2O_3$ nanocomposite layer were studied and advantageous attributes identified for a variety of commercial applications.

BRIEF DESCRIPTION OF THE DRAWINGS

FIG. 2(a) shows QCM measurements performed during $Al_2O_3$ ALD various precursors exposure steps; FIG. 2(b) shows calculated mass add-on QCM for the several $Al_2O_3$ ALD cycles.

FIG. 10(a) shows TEM analysis of (30% W:70% $Al_2O_3$) ALD cycle composite layer cap with 6 nm $Al_2O_3$:Cross section HRTEM micrograph; FIG. 10(b) shows a nano beam diffraction (NBD) image from a composite layer film area.

FIG. 15(c) shows one super cycle of 3x(H$_2$O-TMA)-1x(Si2H$_6$—WF$_6$) vs. dose time; and FIG. 15(d) shows calculated mass per ALD cycle vs. ALD cycle;

FIG. 20(d) shows data fitting to FIG. 20(c) at low field (top graph FIG. 20(d)(1) with linear fit), and high field (bottom graph FIG. 20(d)(2) with exponential fit);

FIG. 26(a) shows a photograph of MoAlO$_x$ films on glass and prepared with 8% Mo with a thickness of 760 Angstrom; FIG. 26(b) shows the film on a 300 mm Si wafer;

FIG. 31(a) shows transverse resistivity from a MoAlO$_x$ film prepared by 10% Mo cycles beginning with Mo and Al$_2$O$_3$.

FIG. 34(a) shows an SEM image of an ALD MoAlO$_x$ tunable resistance coating using 8% Mo ALD cycles in Al$_2$O$_3$ on an inside surface of a form borosilicate glass array and FIG. 34(b) shows a higher magnification image of a portion of FIG. 34(a).

DETAILED DESCRIPTION OF PREFERRED EMBODIMENTS

Figure 1:
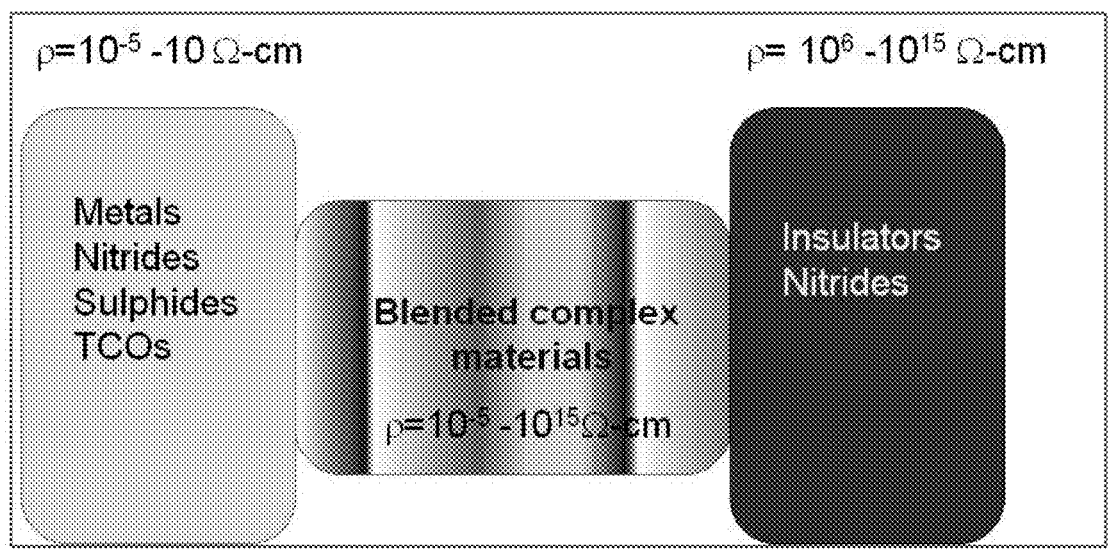
FIG. 1 shows a schematic of resistivity ranges which can be achieved for materials by selected mixing of metal and insulating components by deposition methods.

The tuning of thin film electrical resistance can be done by mixing the conducting and insulating components in a precise controlled manner in composite materials. Schematic of such mixing and the resistivity ($\rho$) range of thin film composite materials is shown in FIG. 1. In the preferred embodiments the metal (Mo or W) and oxide (Al$_2$O$_3$) are combined by a ALD process under various deposition conditions. The materials can also be deposited by chemical vapor deposition type methods (CVD, MOCVD, OMCVD, PECVD) or PVD type methods such as molecular beam epitaxy (MBE), reactive sputtering, pulsed laser deposition (PLD), evaporation, etc.

The physical, electrical and chemical properties of nano-composite thin films can be tuned by adjusting the relative proportions of the constituent materials. Amongst various thin film processes, atomic layer deposition (ALD) is a preferred technique for growing complex layers in a precisely controlled manner with many unique advantages. ALD is based on a binary sequence of self-limiting chemical reactions between precursor vapors and a solid surface. Because the two reactions in the binary sequence are performed separately, the gas phase precursors are never mixed; and this eliminates the possibility of gas phase reactions that can form particulate contaminants that might produce granular films. This strategy yields monolayer-level thickness and composition control. The self-limiting aspect of ALD leads to continuous pinhole-free films, excellent step coverage, and conformal deposition on very high aspect ratio structures. ALD processing is also extendible to very large substrates and batch processing of multiple substrates.

In one embodiment, thin films of W:Al$_2$O$_3$ nanocomposites were synthesized by combining tungsten (W) and aluminum oxide (Al$_2$O$_3$) using ALD processes. The ALD processes for both W and Al$_2$O$_3$ are known (also for Mo:Al$_2$O$_3$ to be discussed hereinafter. In addition, the ALD of W:Al$_2$O$_3$ nanolaminates comprised of alternating, distinct layers of these two materials has been explored, and these nanolaminates have been utilized as thermal barrier coatings and X-ray reflection coatings. In contrast to this previous work on nanolaminates, the instant invention in general focuses on synthesizing, characterizing, and testing nanocomposites where the W or Mo and the Al$_2$O$_3$ components do not exist in distinct layers but are more intimately mixed such that the domains of these materials do not exhibit bulk-like properties or structures (examples will be provided hereinafter). This offers the opportunity to develop very different materials with unique properties that are unlike any other constituents known in the art.

One exemplary use of these methods is to develop tunable resistive coatings using ALD for application in microchannel plate (MCP) electron multipliers. In this application, the ALD resistive layer serves to generate a uniform electrostatic potential along the MCP pores. The W:Al$_2$O$_3$ system was selected as a preferred article for a number of reasons. ALD W has a very low electrical resistivity of $\rho = \sim 10^{-5}$ $\Omega$-cm while ALD Al$_2$O$_3$ is an excellent insulator with a resistivity of $\rho = \sim 10^{14}$ $\Omega$-cm, and this contrast offers the potential for an extremely wide range of tunable resistance. In addition, ALD Al$_2$O$_3$ has a high breakdown electric field and this attribute is beneficial in high voltage devices such as MCPs. Both the W and Al$_2$O$_3$ ALD processes can be performed under similar conditions, and this simplifies the process of synthesizing composite layers. In addition to the wide variance in electrical properties, W and Al$_2$O$_3$ have very different physical and chemical properties. As a result, by adjusting the proportion of W in the Al$_2$O$_3$ matrix, we expect that the optical, mechanical, and physical properties of the W:Al$_2$O$_3$ composite layers can be broadly tuned.

Al$_2$O$_3$ ALD can be accomplished using alternating exposures to trimethyl aluminum (TMA) and H$_2$O according to the following binary reaction sequence:

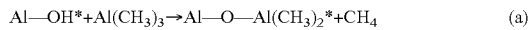

(a)

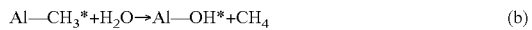

(b)

where the asterisks denote the surface species. Both (a) and (b) reactions are self-limiting and terminate after the consumption of all the reactive surface species. During reaction (a), TMA reacts with surface hydroxyl species, AlOH*, and deposits surface AlCH$_3$* species liberating methane. In reaction (b), H$_2$O reacts with the surface methyl species to form new Al—O bonds and rehydroxylate the surface while again liberating methane. Repeating the (a)-(b) reactions results in the linear ALD of Al$_2$O$_3$ films at a rate of ~1.3 Å/cycle.

The ALD of single-element films requires a different surface chemistry than the surface chemistry employed for binary compounds like Al$_2$O$_3$. For W ALD, one of the reactants is a sacrificial species that serves as a place holder in the AB-AB-AB . . . binary reaction sequence. This sacrificial species is removed during the subsequent surface reaction. The W ALD film growth using Si$_2$H$_6$ and WF$_6$ is accomplished by two self limiting surface reactions described in details and below as a quick reference:

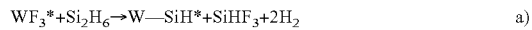

a)

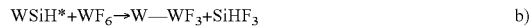

b)

where the asterisks denote the surface species.

During reaction (c), WF$_6$ reacts with the sacrificial silicon surface species, WSiHyFz*, and deposits WFx species. In reaction (d), Si$_2$H$_6$ strips fluorine from the tungsten surface species, WFx*, and reforms the sacrificial silicon surface species. The reaction stoichiometry is kept undefined because the exact identity of the surface species is not known. Repeating these surface reactions (c) and (d), the W ALD growth occurs very linearly.

However initial ALD nucleation of Al$_2$O$_3$ layer on W surface or W layer on Al$_2$O$_3$ surface may not have same ALD growth behavior as pure Al$_2$O$_3$ on Al$_2$O$_3$ or W on W layer. The self limiting surface reaction discussed above changes as compared to pure Al$_2$O$_3$ and W due to mixing of the four precursors TMA, H$_2$O, WF$_6$, and Si$_2$H$_6$ during the growth of W:Al$_2$O$_3$ composite layers. These four precursors can be introduced on the substrate by a choice of precursor sequence in one or multiple ALD cycles. These precursors introduction can result in the presence of various functional groups such as —OH, —WF$_3$, —SiH$_x$, —Al(CH$_3$), —AlF$_x$ on the already partially or fully deposited layer and can result in a complex ALD chemistry. In addition, during the growth of W:Al$_2$O$_3$ composite materials every ALD cycle, whether it is Al$_2$O$_3$ or W, the underneath layer may not have an appropriate surface species to facilitate the ALD growth. Further the reaction byproduct such as AlF$_x$, HF$_x$ and CHF$_x$ may be involved in the ALD growth and may incorporate adverse effect on ALD growth. In addition, the nucleation delay for Al$_2$O$_3$ and W ALD film growth may affect the resulting film growth and the roughness. The roughness (surface area) of each individual layer can affect the nucleation of the W or Al$_2$O$_3$ process. Understanding nucleation is important for selected applications, especially when the ALD method is used to grow precisely controlled composite materials with desirable electrical properties. Various aspects of the ALD synthesis of W:Al$_2$O$_3$ composite layers were examined with variation of composition of the W:Al$_2$O$_3$ layers. The physical and electrical properties of W:Al$_2$O$_3$ composite layers are discussed hereinafter.

In a preferred method the W:Al$_2$O$_3$ composite layer depositions were carried out in a hot wall viscous flow reactor ALD reactor. The W:Al$_2$O$_3$ composite films were deposited on n-type Si(100), fused quartz, glass substrates and high aspect ratio (60:1) borosilicate glass micro-capillary plates. Prior to ALD process all the substrates degreasing was performed using a 10 min dip ultrasonic acetone cleaning. For Al$_2$O$_3$ growth, Al(CH$_3$)$_3$ [TMA] was obtained from Sigma-Aldrich with a 97% purity and deionized (DI) H$_2$O vapor was used as a precursors. For W ALD, tungsten hexafluoride (WF$_6$, Sigma Aldrich, 99.9%) and disilane (Si$_2$H$_6$, Sigma-Aldrich, electronic grade 99.995%) were used as precursors. All precursors were maintained at room temperature at ~20° C. The background N$_2$ flow was set to 300 sccm which gives a base pressure of 1.0 Torr in the ALD reaction chamber and was measured by a heated MKS Baratron 629B model. The precursors TMA and H$_2$O were alternately pulsed in the continuously flowing N$_2$ carrier flow using high speed computer controlled pneumatics valves in a desire ALD sequence. During TMA and H$_2$O dosing, pressure transient increases of 0.2 Torr for TMA and 0.3 Torr for H$_2$O when the reactants were introduced into $N_2$ carrier flow nitrogen carrier flow. Similarly, $WF_6$ and $Si_2H_6$ precursors were alternately injected into $N_2$ carrier flow. During $Si_2H_6$ and $WF_6$ dosing, pressure transient increases of 0.25 Torr for $Si_2H_6$ and 50 mTorr for $WF_6$. The results utilized the optimized process condition and precursor's dose timing sequence for pure W and $Al_2O_3$ ALD processes. The main experimental conditions for ALD are summarized in Table 1.

TABLE 1

ALD experimental parameters and physical properties of various layers

| Parameter | $Al_2O_3$ | W | $W:Al_2O_3$ |
|---|---|---|---|
| Deposition temperature (° C.) | 150-300 | 100-300 | 200-300 |
| ALD Precursors | TMA, $H_2O$ | $Si_2H_6$, $WF_6$ | TMA, $H_2O$, $Si_2H_6$, $WF_6$ |
| Growth rate (Å/cycle) | 1.1-1.3 | 4.5-5.5 | 1.2-1.5 |
| Substrates | Si(100), fused quartz | Si(100), fused quartz | Si(100), fused quartz, glass micro-capillary plate |
| XRD analysis | Amorphous | Nano-crystalline | Amorphous |
| ALD cycle timing (s) | 1-5-1-5 | 1-5-1-5 | W(1-5-1-5):$Al_2O_3$(1-5-1-5) |
| Resistivity (Ω-cm) | $\sim 10^{14}$ | $\sim 10^{-4}$ | $10^{-4}$-$10^{14}$ |

An in-situ quartz crystal microbalance (QCM) study was performed for various ALD processes $Al_2O_3$, W and $W:Al_2O_3$ with a different mixture of ALD cycle ratios. QCM mass gains were recorded for each case. Front sided polished QCM sensors were obtained from Colorado Crystal Corporation. The QCM housing is located inside the uniformly heated reaction zone of the ALD flow tube reaction chamber. The Maxtek BSH-150 sensor housing was modified to provide a slow nitrogen purge of 10-20 sccm over the back of the quartz crystal sensor. This nitrogen purge prevents reactant gases from entering the QCM housing and depositing material on the back surface of the QCM sensor. By preventing this deposition, the QCM yields absolute mass measurements. In addition, the nitrogen purge allows QCM measurements during the ALD of conducting materials such as W. These conducting materials would otherwise electrically short the QCM sensor and prevent oscillation. Mass uptake data was recorded at each ALD cycle in cases of $Al_2O_3$, W and $W:Al_2O_3$ composites with various ALD cycles ratio.

The thicknesses of $W:Al_2O_3$ layers were determined using spectroscopic ellipsometry measurements on the Si monitor coupons. Annealing of $W:Al_2O_3$ composite layers were performed at 400° C. in 500 sccm flowing Ar condition for 4 hrs at pressure of 1 Torr. The film thicknesses were measured using ex-situ ellipsometry and supported by cross-section scanning electron microscopy (SEM) analysis and transmission electron microscopy (TEM). The microstructure and conformality of $W:Al_2O_3$ layer coatings on Si substrates and high aspect ratio glass micro-capillary plates were examined by cross-sectional scanning electron microscopy (SEM) model Hitachi 4700. The electrical I-V characteristics and thermal coefficient of resistance (TCR) of $W:Al_2O_3$ layers were measured using a Keithley Model 6487 pA/V source. Electrical measurements were done using either micro probes or Hg-probe contact method. The resistance stability test was performed for several days under constant applied potential in vacuum.

Prior to ALD growth $W:Al_2O_3$ composite layers, pure $Al_2O_3$ and W layers growth was studied by ALD. Thickness series samples were prepared and characterized. The in-situ quartz crystal microbalance (QCM) was performed during the pure $Al_2O_3$ and W ALD films growth.

Figures 2C, 2D:
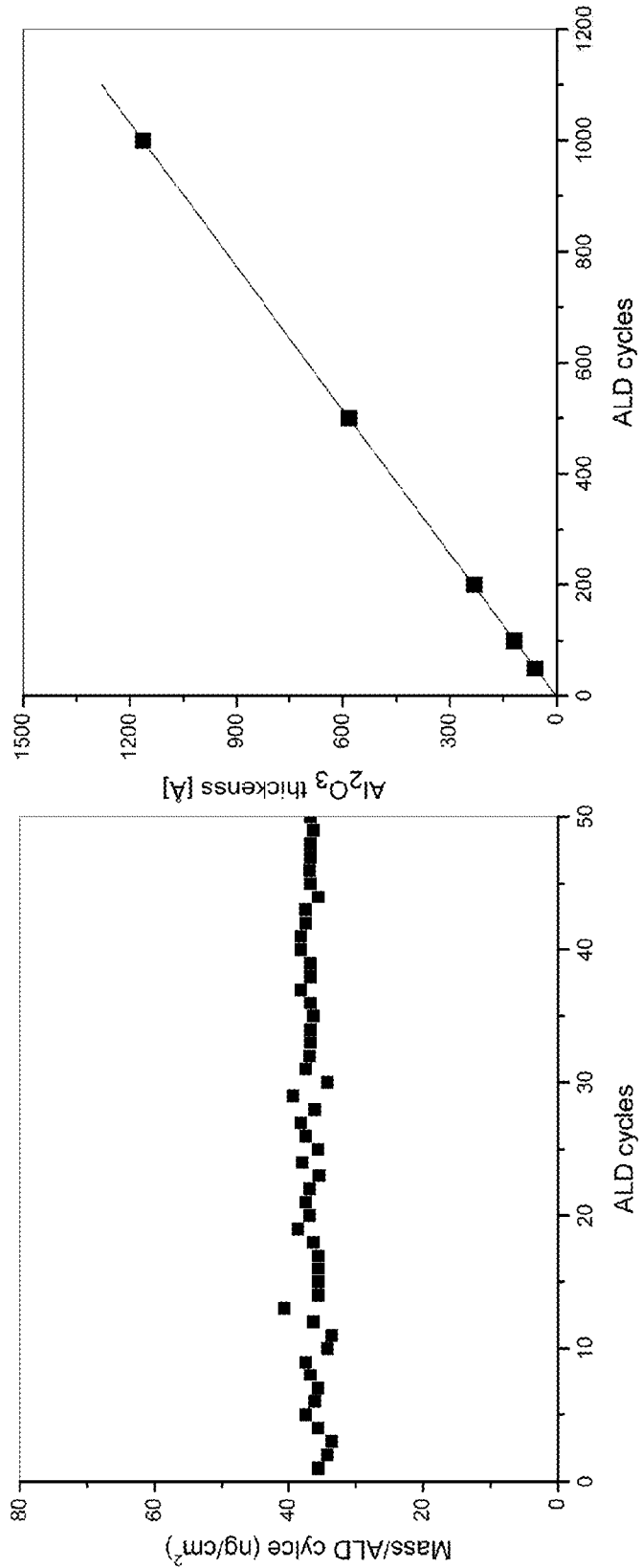
FIG. 2(c) shows calculated mass/ALD cycle of $Al_2O_3$.
FIG. 2(d) shows thickness of $Al_2O_3$ on Si(100) vs. ALD cycles.
Figure 4:
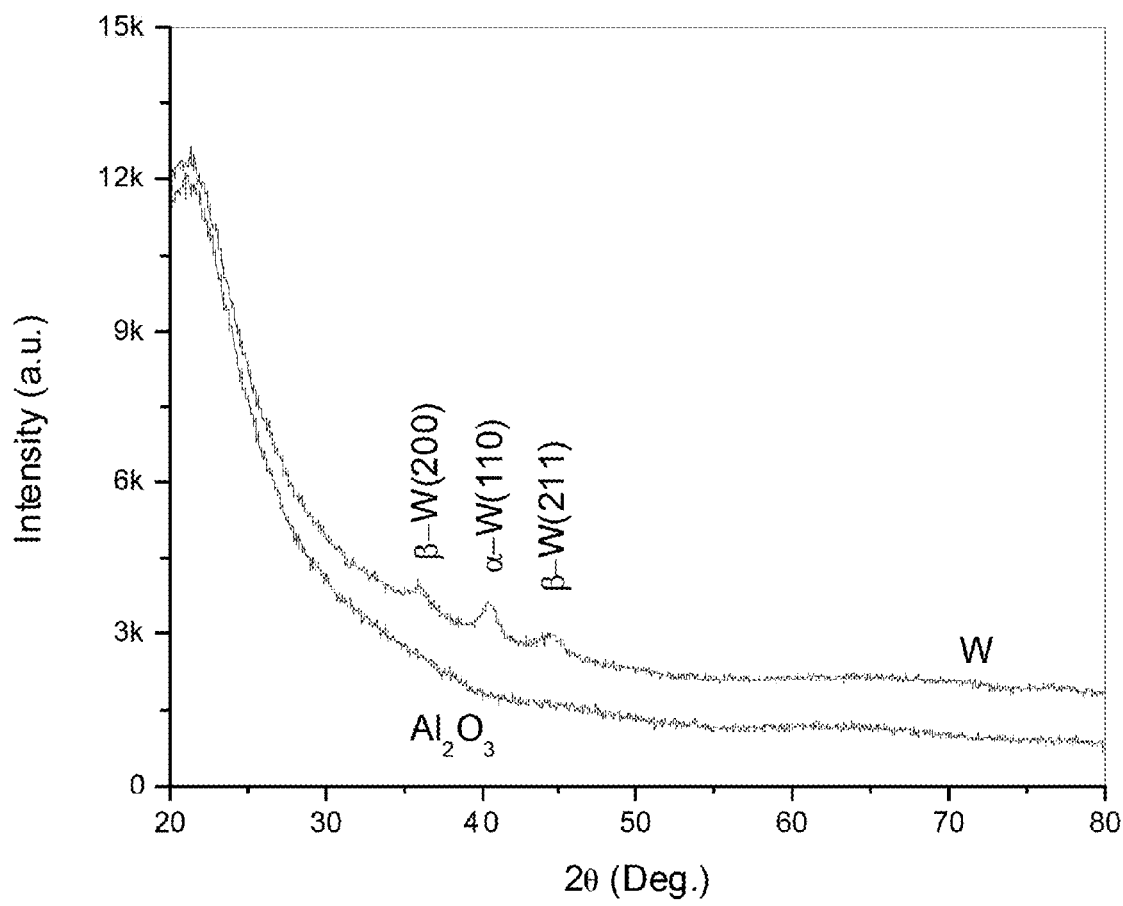
FIG. 4 shows an X-ray diffraction pattern of a 600 Å layer of ALD $Al_2O_3$ (bottom scan) and 500 Å layer of ALD W (top scan)

QCM measurements were performed during $Al_2O_3$ ALD at 200° C. using TMA and $H_2O$ with the timing sequence: (1-10-1-10). These conditions were chosen from the ALD growth saturation studies. Under these conditions FIGS. 2(a)-2(d) explain data acquired from $Al_2O_3$ QCM study and thicknesses of actual $Al_2O_3$ samples grown Si(100) with ALD growth experimental conditions described in Table 1. FIG. 2(a) shows a mass add-on a QCM at various precursor steps in one $Al_2O_3$ ALD cycle. Calculated mass add-on the QCM for the several $Al_2O_3$ ALD cycles are plotted in FIG. 2(b) which illustrates a very linear increase mass as increasing number of ALD cycles. A linear least-square fit to the $Al_2O_3$ QCM mass data indicates an average $Al_2O_3$ growth rate of 37 ng/cm²/cycle. The calculated mass/ALD cycle from FIG. 2(b) are shown in FIG. 2(c). This data confirms the every $Al_2O_3$ ALD cycles deposited under these set of conditions are deposited approximately at the same mass/ALD cycle. A thickness series of samples of $Al_2O_3$ were deposited on Si(100). The ellipsometry measured thicknesses of $Al_2O_3$ layers on Si(100) vs. number of ALD cycles are shown in FIG. 2(d). A linear least-square fit to $Al_2O_3$ thickness data yields to a growth rate of 1.21 Å/cycle. From the $Al_2O_3$ mass/ALD cycle and growth rate on monitor Si(100) data, the calculated $Al_2O_3$ density=3.1 g/cm³ which is lower than the bulk density of crystalline $Al_2O_3$=3.6 g/cm³. This density variation can correlate to the X-ray amorphous nature of the 600 Å $Al_2O_3$ layer shown in FIG. 4. Both the mass uptake and the growth rate data for $Al_2O_3$ per ALD cycle are in good agreement with prior work.

Figures 3A, 3B:
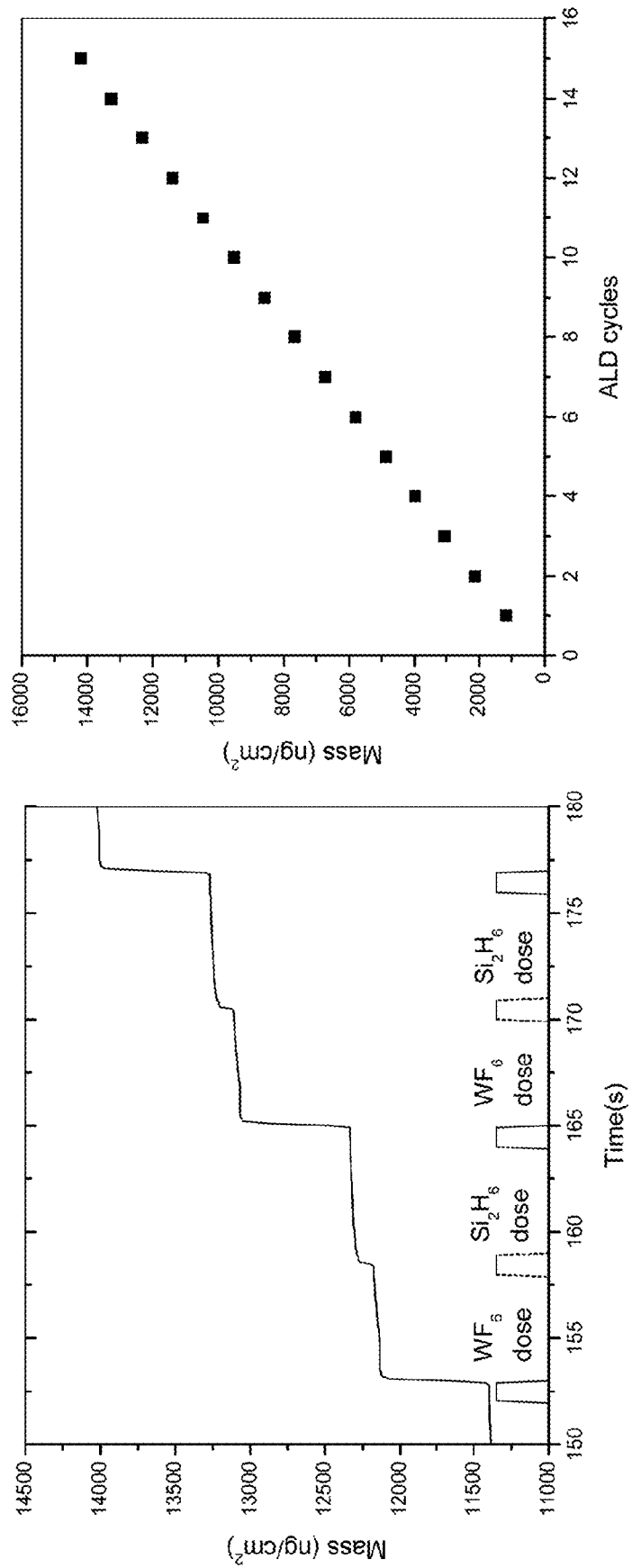
FIG. 3(a) shows mass add-on on QCM during ALD W deposition in various precursor exposure steps.
FIG. 3(b) shows calculated mass add on QCM for the several ALD W cycles.
Figures 3C, 3D:
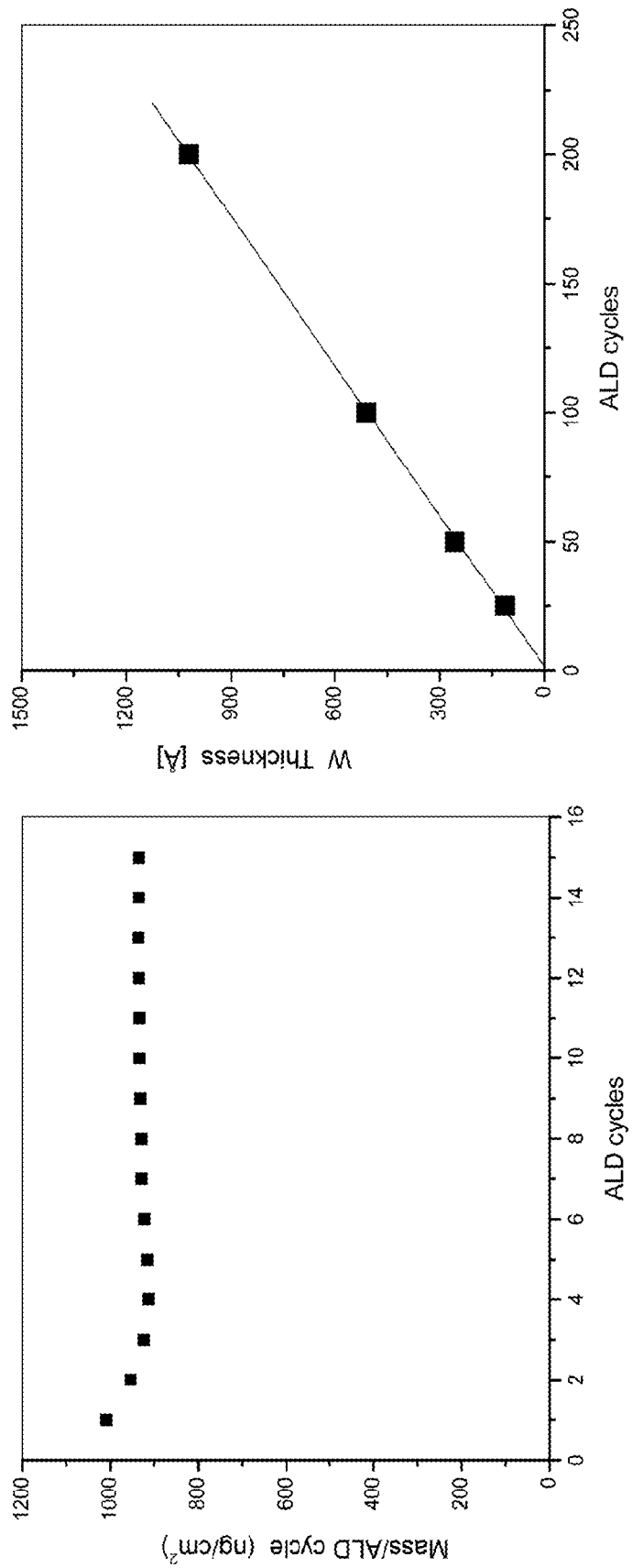
FIG. 3(c) shows calculated mass per ALD cycle of W.
FIG. 3(d) shows thickness of W on (10 nm) $Al_2O_3$ passivated Si(100) vs. ALD cycles.

ALD of W performed on QCM at 200° C. with the repetition of a ALD precursors cycle $Si_2H_6$ (dose)-$N_2$(purge)-$WF_6$ (Dose)-$N_2$(purge) with precursor timings of (1-10-1-10)s. These conditions were chosen from the ALD growth saturation studies. W growth directly on Si(100) substrate has shown poor adhesion whereas $Al_2O_3$ passivated Si(100) substrate shows good adhesion with W layer. FIGS. 3(a)-3(d) describe the QCM and actual thickness data of W samples grown on 10 nm $Al_2O_3$ passivated Si(100) substrates. Mass up-take on QCM during various steps in one W ALD cycles is shown in FIG. 3(a). Calculated mass add-on the QCM for the 15 steady state W ALD cycles are plotted in FIG. 3(b). This data confirms a very linear increase mass growth with increasing number of ALD cycles. A linear least-square fit to the W QCM mass data indicates an average W mass rate of 930 ng/cm²/cycle. The calculated mass/ALD cycle is shown in FIG. 3(c) which confirms that W deposited under this set of experimental conditions are depositing nearly equivalent mass for every ALD cycles is same. Thickness vs. number of ALD cycles for W layer is shown in FIG. 3(d). A linear least-square fit to W thickness data yields to a growth rate of ~5 Å/cycle. From the mass/ALD cycle and the W growth rate data on Si(100) data, the calculated W density=18.6 g/cm³ which is slightly lower than the bulk density of crystalline W=19.3 g/cm³. This variation density can linked to the nano-crystalline nature of ALD grown W layer analyzed by XRD shown in FIG. 4. XRD pattern of the ~500 Å W shows three broad little peaks appearance due to nano-size crystallinity in the range of 2θ=35°-45° and are associated with the presence of α-W and β-W phases in the ALD grown W layer. The both mass/ALD cycle and growth rate/ALD cycles data for W are in-line with prior work.

Figure 5B:
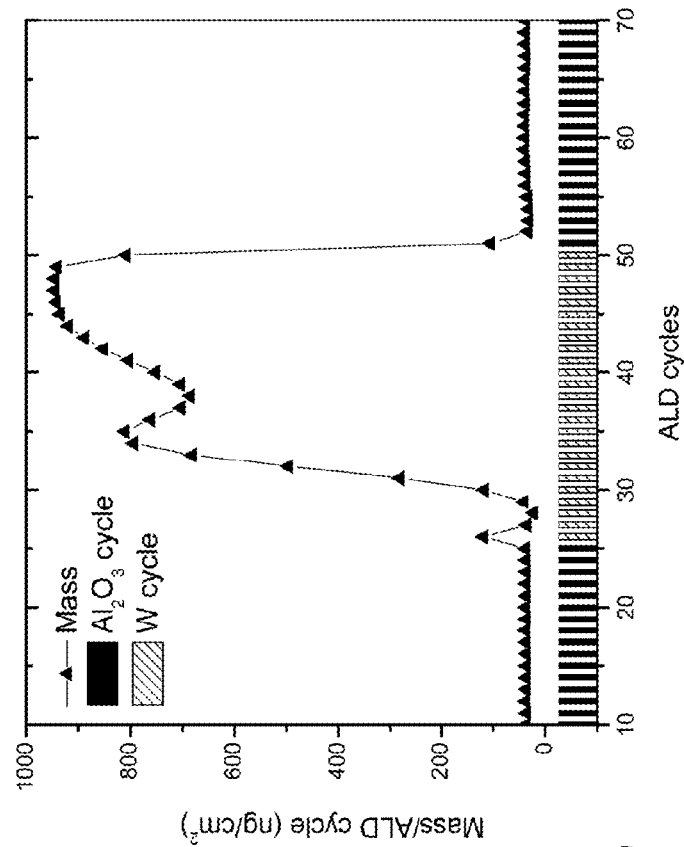
FIG. 5(b) shows calculated mass from FIG. 5(a) per ALD cycles.
Figure 5A:
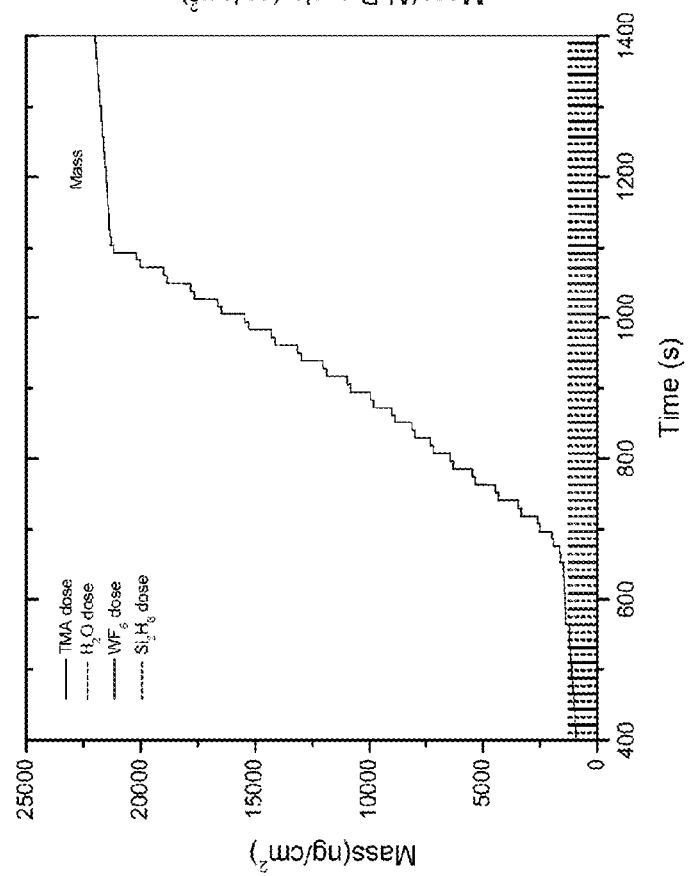
FIG. 5(a) shows QCM during $Al_2O_3$—W—$Al_2O_3$ ALD step with mass uptake during $Al_2O_3$—W—$Al_2O_3$ precursor's exposure.
Figures 5C, 5D:
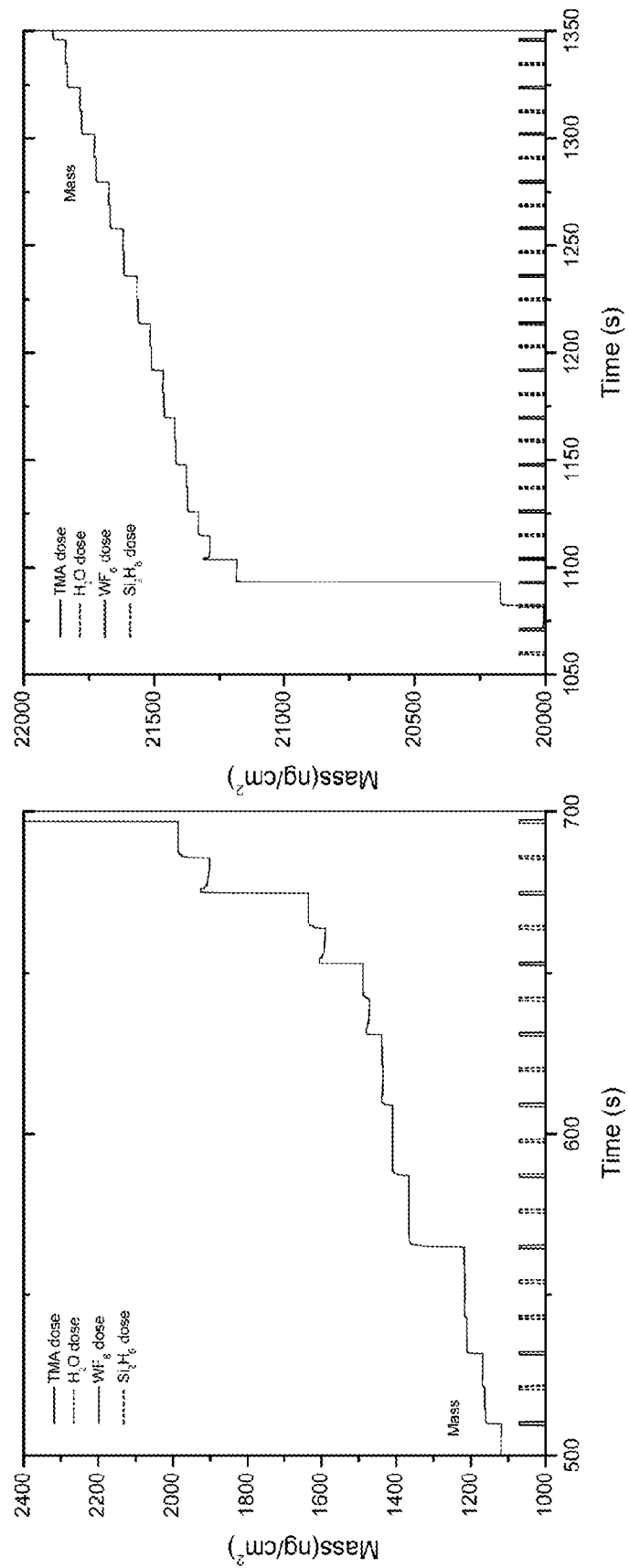
FIG. 5(c) shows zoom-in of $Al_2O_3$—W-section for the first W cycle of mass onto $Al_2O_3$.
FIG. 5(d) shows zoom-in of —W—$Al_2O_3$ sections for first $Al_2O_3$ cycles on a W layer.

Prior to W:Al$_2$O$_3$ composite layers growth, the QCM data were collected for the steady state ALD growth of Al$_2$O$_3$—W—Al$_2$O$_3$ with the precursor sequence of n(TMA-H$_2$O)-m (Si$_2$H$_6$—WF$_6$)-n(TMA-H$_2$O) where n and m are the desire number of cycles and shown in FIGS. 5(a)-5(d). Repeatability of these data sets was collected for few times and confirmed repeatable behavior. FIG. 5(a) represents the mass deposited during ALD Al$_2$O$_3$—W—Al$_2$O$_3$ at various precursor steps for precursor n(TMA-H$_2$O)-m(Si$_2$H$_6$—WF$_6$)-n (TMA-H$_2$O). As expected a rapid increased in mass add-on was noticed during W ALD cycle. This is related to the high growth rate and for high density of the W. The calculated mass add-on for Al$_2$O$_3$ and W calculated for every ALD cycles in Al$_2$O$_3$—W—Al$_2$O$_3$ system and is shown in FIG. 5(b).

In FIG. 5(b) the initial Al$_2$O$_3$ ALD cycles stopped after reaching a steady state mass add-on of 37 ng/cm$^2$/ALD cycle. However, a noticeable change was observed on the mass uptake at the very first W cycle on Al$_2$O$_3$ surface. This mass add-on is ~130 ng/cm$^2$ which is ~7 times lower compared to the W mass uptakes ~930 ng/cm$^2$/ALD cycle under steady-state ALD growth condition which was discussed in the previous section. There was no significant mass add-on for the next 3 W cycles. This can associate with the change in functional group and the reactive sites for the very first W ALD cycle and subsequent W ALD cycles. After this a rapid mass add-on was noticed up to next 8$^{th}$ W ALD cycles and mass add-on reaches ~800 ng/cm$^2$/ALD cycle for few cycles followed by gradual mass drop to ~700 ng/cm$^2$/ALD cycle followed by gradual increases in the mass add-on up to ~930 ng/cm$^2$/ALD cycle, then mass add-on reached a steady-state mass/W ALD cycle. An initial 8 ALD W cycle and very rapid increase in the mass can correlate to island-type growth. These islands can form discontinuous W layers. After the critical island size, the collapse of island might have occurred and the formation of the continuous layer begins where the change in surface area as well as number of reactive sites may have a contribution to the mass-add on rate. The crucial point is the first W ALD cycle mass-uptake can be especially useful in a controlling lower % W in W:Al$_2$O$_3$ composite system. The first total 8-9 W ALD cycles express the amount of higher % W deposits into the W:Al$_2$O$_3$ composite system.

First cycles of Al$_2$O$_3$ mass uptake on W surface was noted to be high ~68 ng/cm$^2$, which is ~1.8 times more than the steady state growth condition 37 nm/cm$^2$/ALD cycle (FIGS. 2(a)-2(d)). In contrast, Al$_2$O$_3$ steady-state mass/ALD cycle on W surface was achieved within next 4-5 ALD Al$_2$O$_3$ cycles. These mass up-take numbers change drastically as relative percentage ratio of the W to Al$_2$O$_3$ ALD cycles was altered and the precursor's sequence. This will be discussed in the next section. This lower amount of mass add-on for initial W ALD cycles was associated with nucleation delay which is dependent on the available functional groups to complete the reaction. This nucleation delay is crucial for the "rule-of-mixture" for the composite materials growth by ALD. The precise mass-up take of W and Al$_2$O$_3$ not only defines the growth and physical properties but also strongly affected the electrical properties of the W:Al$_2$O$_3$ composite layers.

Figure 6:
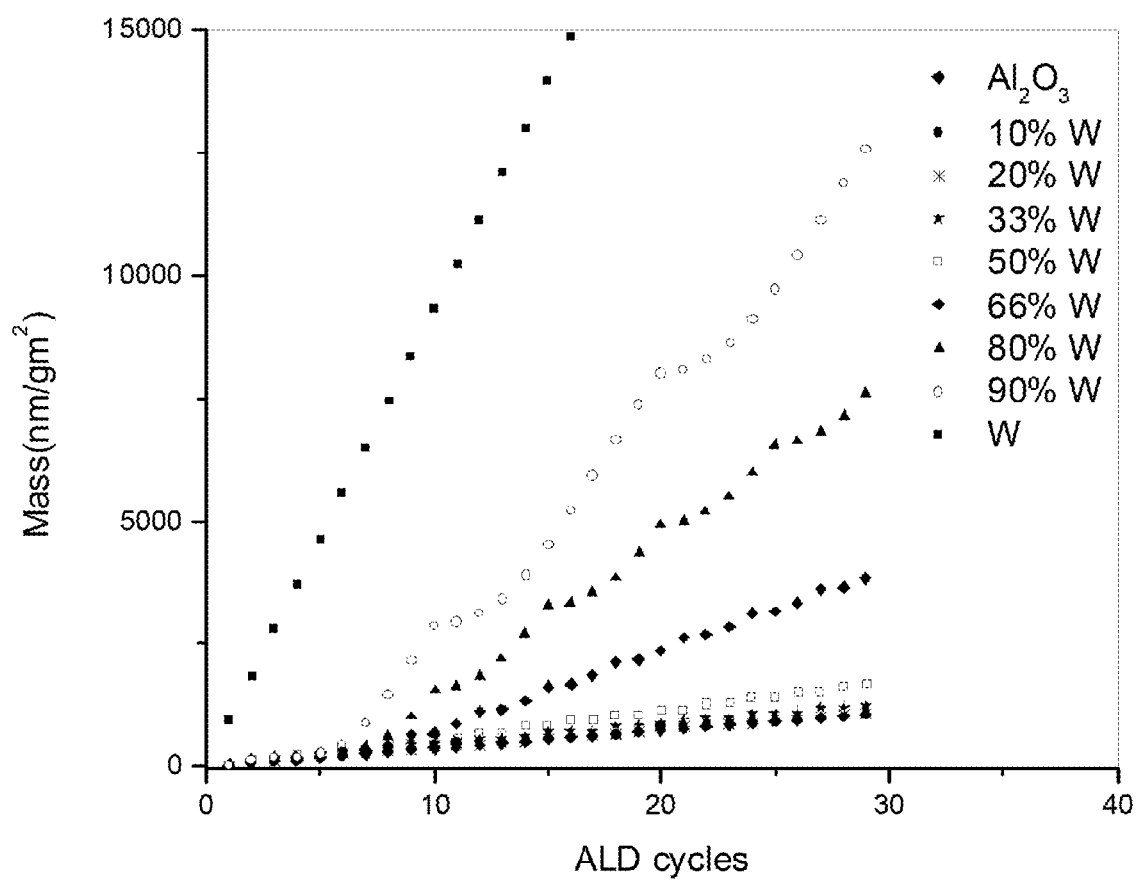
FIG. 6 shows mass add-on on QCM for $W:Al_2O_3$ composites grown with different % W ALD cycles.
Figure 7A:
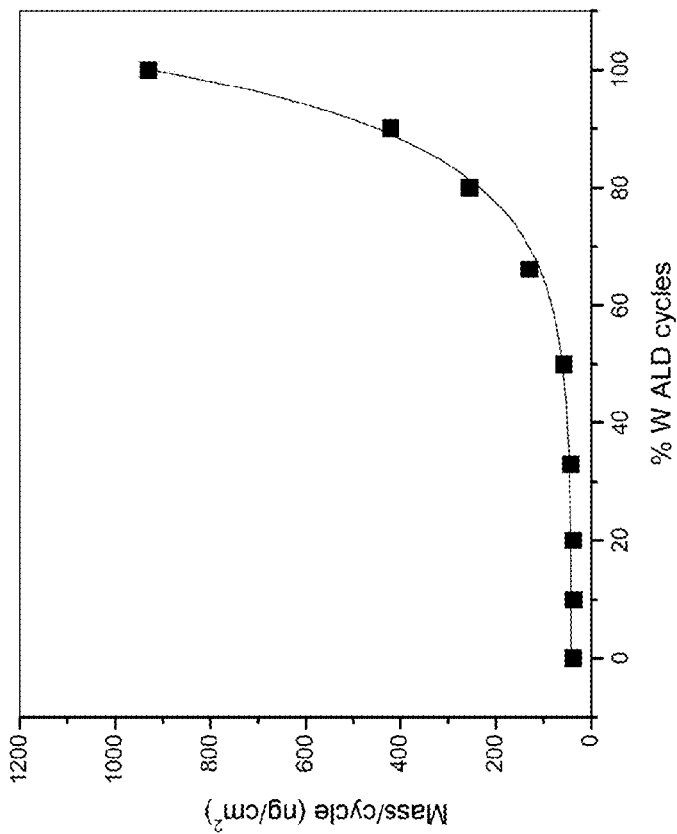
FIG. 7(a) shows mass/ALD cycle and FIG. 7(b) shows actual W mass into the $W:Al_2O_3$ system vs. % W ALD cycles.
Figure 7B:
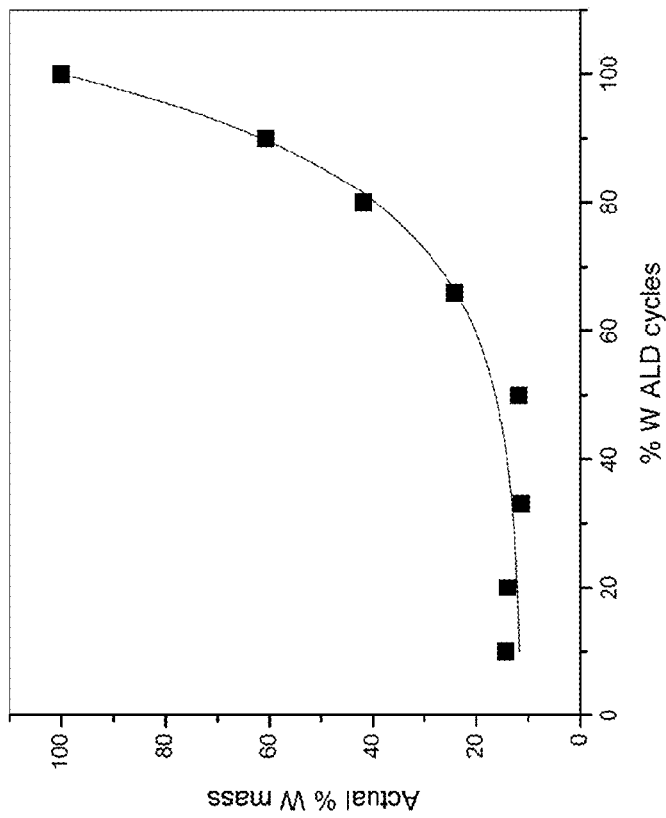

Alteration of electrical properties of W:Al$_2$O$_3$ composite layers are preferably accomplished by adjusting relative ratio of the W to Al$_2$O$_3$ ALD cycles. The QCM study was performed at 200° C. for various compositions of the W:Al$_2$O$_3$ (i.e. x % Al$_2$O$_3$:y % W) ALD cycles using precursors sequence n[x(TMA-N$_2$—H$_2$O—N$_2$)+y(Si$_2$H$_6$—N$_2$—WF$_6$—N$_2$)] where x and y can vary between 0-100; and n is adjusted as per the desired ALD cycles which relate to the thickness. The precursors were dosed for 1 s followed by a 10 s N$_2$ purge. FIG. 6 describes the QCM mass add-on data for various compositions of W:Al$_2$O$_3$ system. Three trends were observed: i) within each composition a linear increase of cyclic mass add-on as per increase in ALD cycles, ii) gradual increase of mass add-on up to 50%-50% W to Al$_2$O$_3$ ALD cycles which is associated with the disorder in ALD growth due to mixing of more or less W or Al$_2$O$_3$ and iii) >50% W ALD cycles conditions provide an exponential increase in mass uptake which can be associated with the increased number of W cycles that can lead to the rapid increase in the W mass portion in the composite layer as shown in FIG. 5(b). A calculation of the mass/ALD for each % W ALD cycle condition from FIG. 6 is expressed in FIG. 7(a). The exponential function fits well to this data set which confirms the mass/per ALD cycles increased exponentially with increasing % W ALD cycles. The actual W mass added per composition of W:Al$_2$O$_3$ is calculated by taking an average by adding actual W mass add-on from 30 ALD cycles for each of the W:Al$_2$O$_3$ compositions and dividing by the number of only W ALD cycles and normalized with 100% W mass/ALD cycles (930 ng/cm$^2$/ALD cycle). It is noteworthy that this is the actual amount of W in the W:Al$_2$O$_3$, and it did not increase even up to 50% W ALD cycles (in Al$_2$O$_3$ dominated region). Whereas in ≥50% W ALD cycles conditions (in W dominated region), actual W mass rapidly increased mass behavior and also showed the exponential increasing trend for mass/per ALD cycle.

Figure 8B:
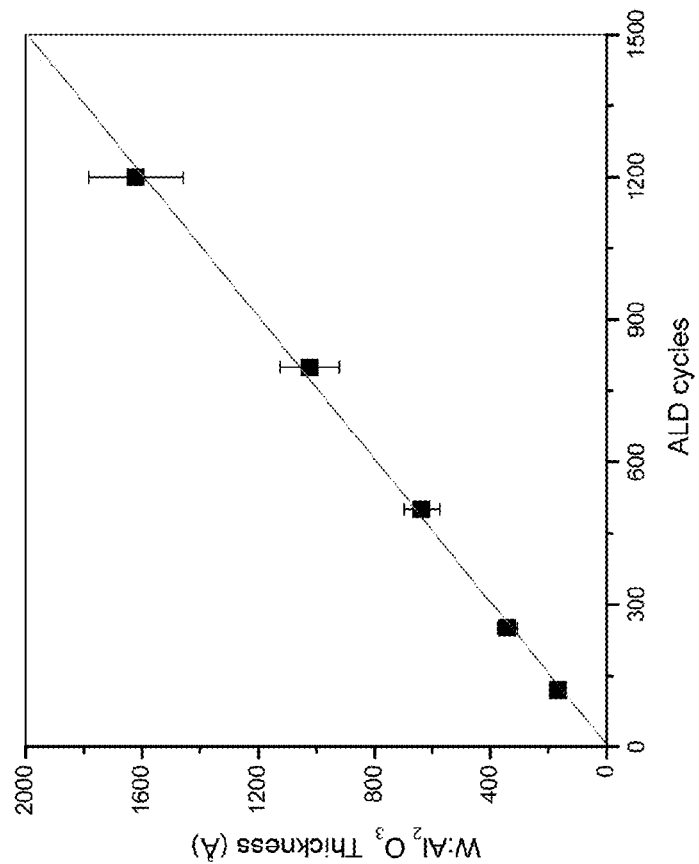
FIG. 8(b) shows thickness of (30% W:70% $Al_2O_3$) ALD cycle composition case and all these layers were deposited with an ALD precursor sequence of $[x(TMA-H_2O)-y(Si2H_6—WF_6)]$.
Figure 8A:
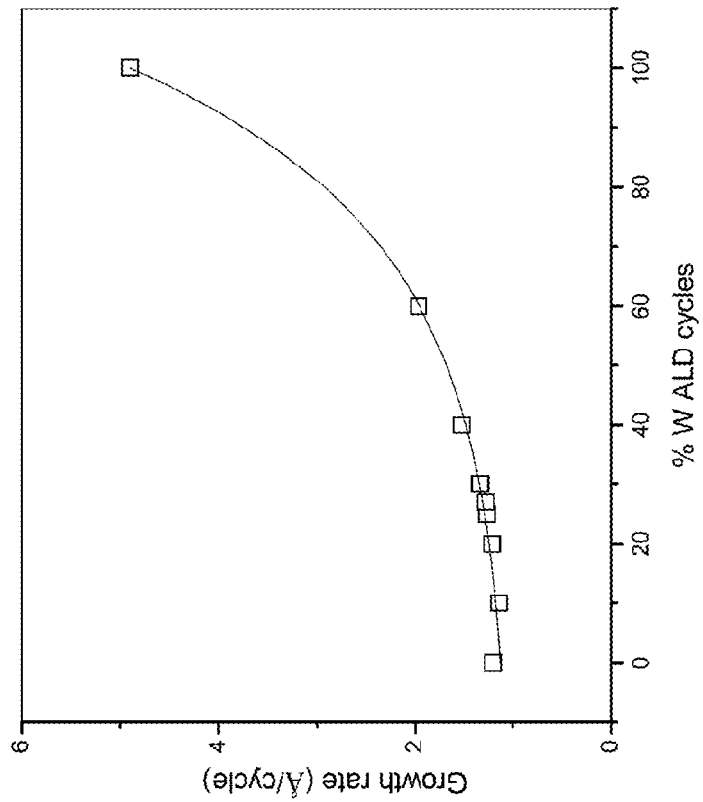
FIG. 8(a) shows growth rate of $W:Al_2O_3$ deposited on Si(100) vs. W % ALD cycles

Thickness series samples of W:Al$_2$O$_3$ system with % W ALD cycles variations were deposited under similar conditions on Si(100) and thicknesses measured spectroscopic ellipsometry. FIG. 8(a) represents a growth rate vs. % of W ALD and shows an exponential increasing behavior. Data from both FIG. 7(a) and FIG. 8(a) support each other. Besides of this, the thickness series samples were deposited for the (30% W:70% Al$_2$O$_3$) ALD cycle composition by adjusting simply the number of ALD cycles and are plotted in FIG. 8(b). A linear least-square fit to thickness data yields a growth rate of 1.33 Å/cycle for W:Al$_2$O$_3$.

Figure 9B:
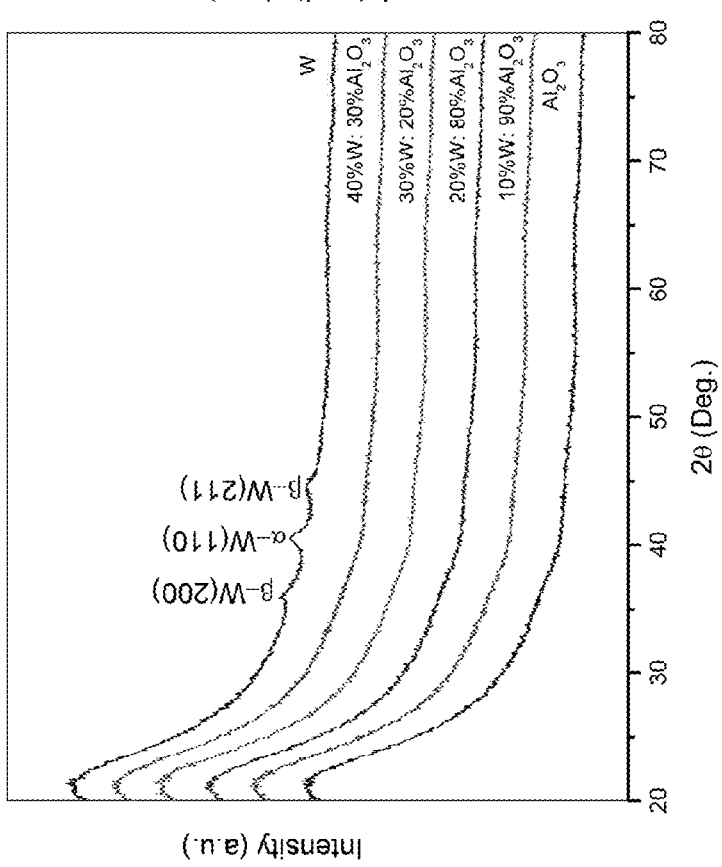
FIG. 9(b) shows an X-ray scan of (30% W:70% $Al_2O_3$) ALD cycle condition sample that was annealed at 400° C. in Ar.
Figure 9A:
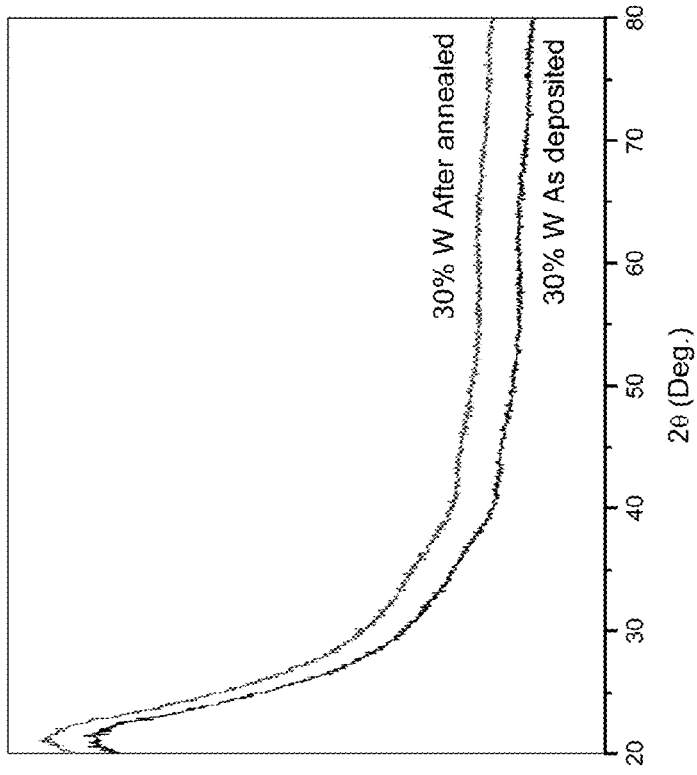
FIG. 9(a) shows an X-ray diffraction scan of the $W:Al_2O_3$ system vs. W % ALD cycles layers which were deposited on fused quartz substrates

As deposited pure Al$_2$O$_3$, pure W as well as composite W:Al$_2$O$_3$ layers were uniform and smooth over the 300 mm Si substrate area. These layers were analyzed by X-ray diffraction analysis shown in FIG. 9(a). All the W:Al$_2$O$_3$ composite layers were shown to have an X-ray amorphous diffraction pattern. A further (30% W:70% Al$_2$O$_3$) ALD cycle condition sample was annealed at 400° C. in 300 sccm Ar at 1 Torr for 4 hours which also shows an X-ray amorphous behavior as illustrated in FIG. 9(b). For this growth condition the microstructure and thickness were also verified with cross-section TEM analysis for an as deposited sample capped intentionally with the 60 Å Al$_2$O$_3$ as shown in FIGS. 10(a)-10(d).

Cross-section TEM samples were analyzed at Evans Analytical Group (EAG). TEM ready samples were prepared using the in-situ FIB lift out technique on an FEI Strata Dual Beam FIB/SEM. The samples were capped with a protective layer of carbon prior to FIB milling. The samples were imaged with a FEI Tecnai TF-20 FEG/TEM operated at 200 kV in bright-field (BF) TEM mode, high-resolution (HR) TEM mode, high-angle annular dark-field (HAADF) STEM mode and nano-beam diffraction (NBD) mode.

Figure 10D:
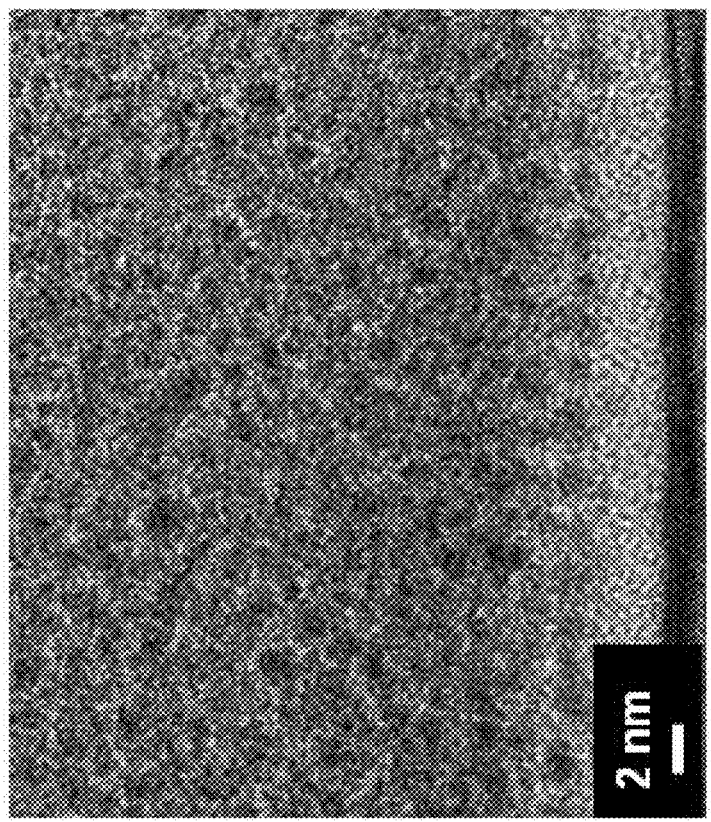
FIG. 10(d) shows a high resolution and high magnification cross-section TEM image.
Figure 10C:
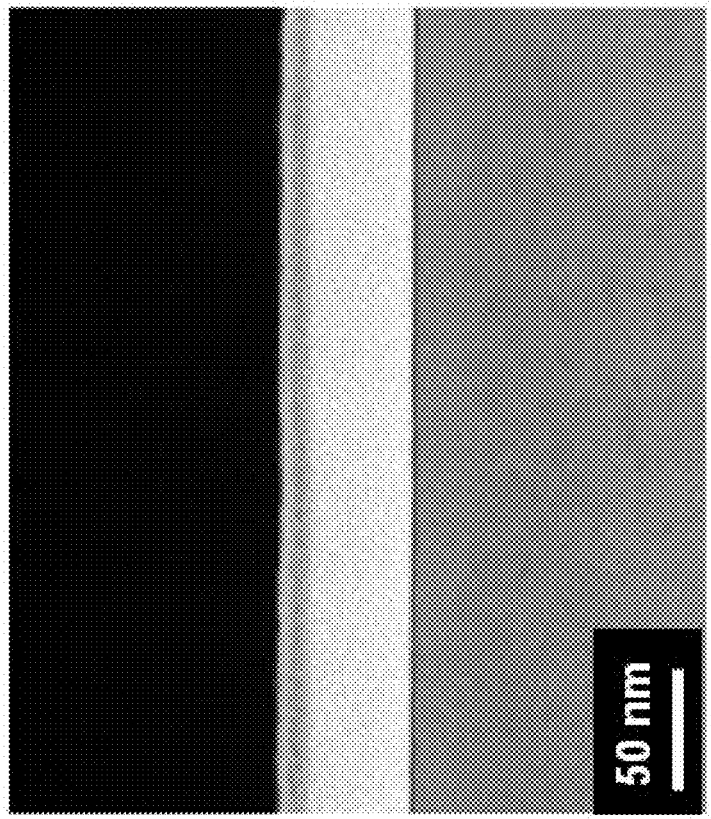
FIG. 10(c) shows a High Angle Annular Dark Field (HAADF) STEM Tomography image of composite layer.

It is clear from the FIG. 10(a) cross-section TEM image that the surface of the sample is very smooth; and TEM thickness data are in good agreement with spectroscopic ellipsometry data. The film substrate interface has a very clean amorphous layer due to native Si(100)+few ALD cycles of $Al_2O_3$. Cross-section TEM data also confirms the thickness of an amorphous $Al_2O_3$ capping layer. TEM nano-beam diffraction (NBD) data was captured from the film region and shown in FIG. 10(b). The NBD image did not illustrate either a clear diffuse pattern that one can expect from amorphous $Al_2O_3$ or a crystalline pattern associated with that of W. The TEM data and XRD data are inline. A possible explanation of such a type of TEM bright field diffraction pattern is that the W:$Al_2O_3$ layer shows X-ray amorphous nature which can contain a mixture of amorphous and nano-crystalline materials. FIG. 10(c) represents a high-angle annular dark-field (HAADF) STEM image which shows a very uniform distribution of nano-size particles (bright white) homogeneously embedded in a continuous amorphous matrix. A very high resolution cross-section TEM image shown in FIG. 10(d) confirms the presence of 1-2 nm size particles dark spots (W) embedded in an amorphous matrix ($Al_2O_3$). Magnification of this image clearly shows the nano-crystallites at the dark spot locations. The XPS analysis of this layer confirms the W is in metallic state and is discussed in the next section. Further, the thickness measured by spectroscopic ellipsometery [see FIG. 8(b)] and cross-section TEM [see FIG. 10(a)] results are in agreement.

Figure 11:
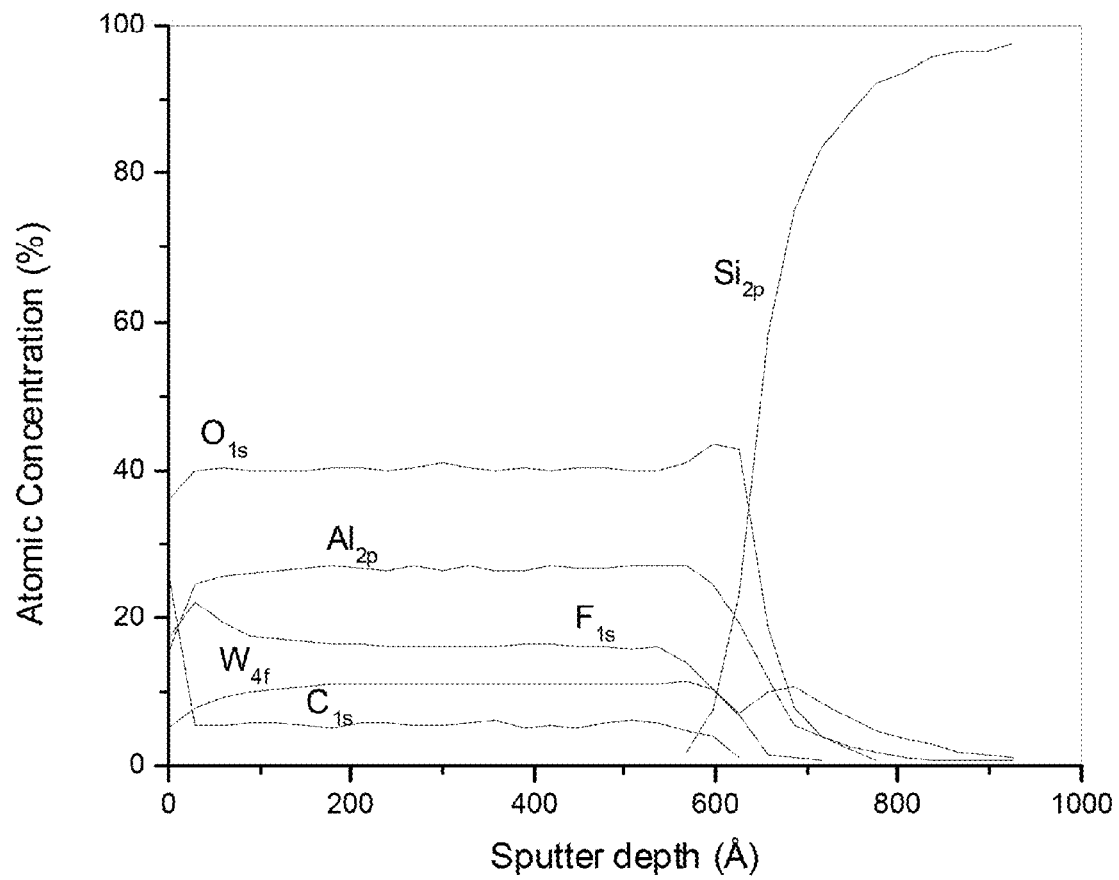
FIG. 11 shows a sputter XPS depth profile of W:Al$_2$O$_3$ composite layer cap with 6 nm Al$_2$O$_3$; this layer was deposited with (30% W:70% Al$_2$O$_3$) ALD cycle composition grown at 200 C.

The elemental composition across the layer of the (30% W:70% $Al_2O_3$) ALD cycle condition case for an as deposited sample capped intentionally with the 60 Å $Al_2O_3$ is shown in FIG. 11. Composite analysis of this layer was investigated by X-ray photo electron spectroscopy (XPS). XPS depth profiles were obtained by alternating an acquisition cycle with a sputter cycle during which material was removed from the sample using a 4 keV $Ar^+$ source. In order to eliminate crater wall effects, the data were acquired from a smaller region in the center of the sputter area. In addition, Zalar rotation was used to help minimize sample roughening during the sputtering process. The sputter rate is calibrated using $SiO_2$. Note that the sputter rate of this material is likely different than that of $SiO_2$. XPS measurements performed on PHI Quantum 2000 with X-ray source monochromated Alk$_\alpha$ 1486.6 eV. The acceptance angle was ±23° and takeoff angle 45°. The analysis area was 1400 μm×300 μm and the sputter rate 39.8 Å/min ($SiO_2$ Equivalent). XPS data is quantified using relative sensitivity factors and a model that assumes a homogeneous layer. The analysis volume is the product of the analysis area (spot size or aperture size) and the depth of information.

FIG. 11 shows the sputter-XPS depth profile, and after removal of an $Al_2O_3$ cap or top layer, the overall elemental composition of the W:$Al_2O_3$ composite layer is very uniform across the layer thickness. This sputter data also confirms the thickness of the sample (~570 Å) and is good agreements with thickness measured by spectroscopic ellipsometry (~570 Å) and cross-section TEM (550 Å). The coating is composed primarily of Al, W, O and F with lower but significant levels of C. A thin oxidized Si layer and a thin W/WSi$_x$ layer were present between the coating and Si substrate. Calculated average atomic concentration from a uniform region is in the inserted table in the FIG. 11. Note that the ratio of Al (26.6%) to O (40.1%) concentration is 2:3 which is constant with the formation of the $Al_2O_3$. Secondly, impurities such as F and C are also present uniformly across the film thickness. The percentage of F concentration in an as deposited film is as high as 16.5% and 5.6% for C. It is noteworthy that the W atomic percentage from XPS is about 10.8% which is also consistent across the film thickness. This W atomic percentage for (30% W:70% $Al_2O_3$) ALD cycle condition sample is in good agreement with the calculated actual % W mass for (11.3%) by QCM mass add-on study for (33% W:66% $Al_2O_3$) ALD cycle condition sample and should be slightly higher due to 3% W more ALD cycles.

Figure 12B:
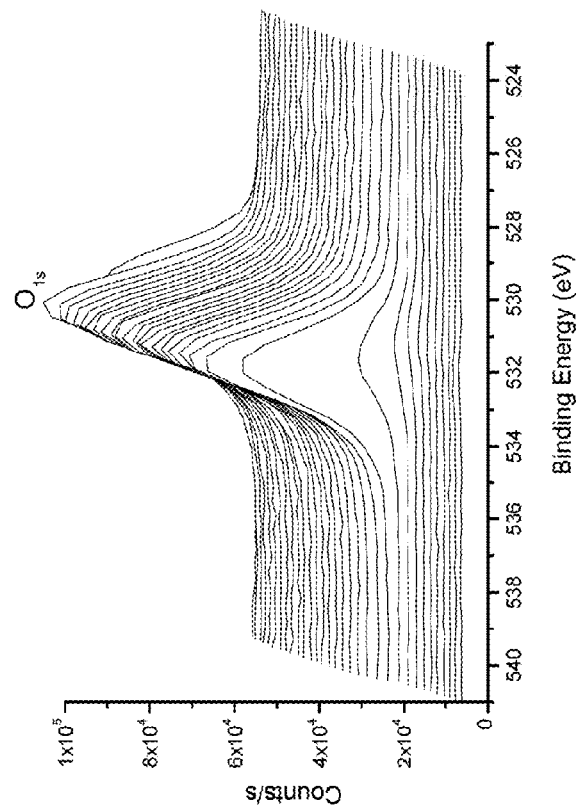
FIG. 12(b) shows Al 2p.
Figure 12A:
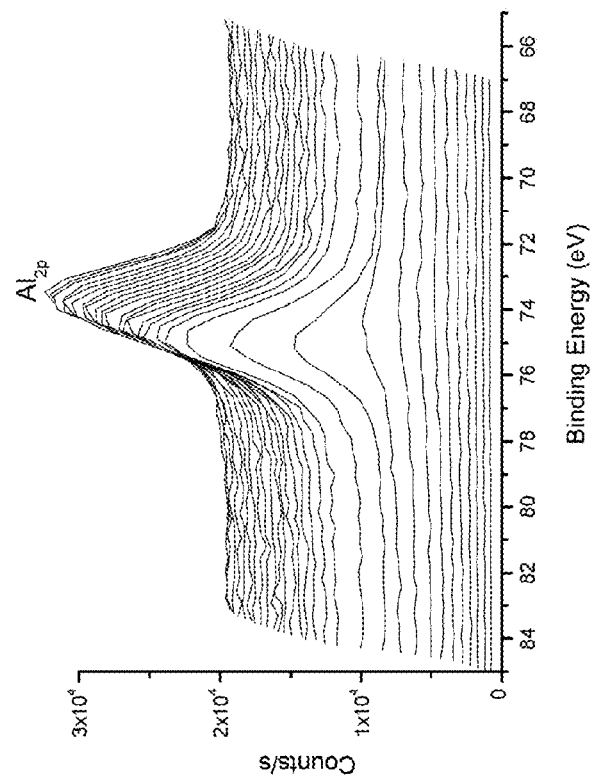
FIG. 12(a) shows sputter-XPS scans of (30% W:70% Al$_2$O$_3$) ALD cycles composite layer: W4f.
Figures 12C, 12D:
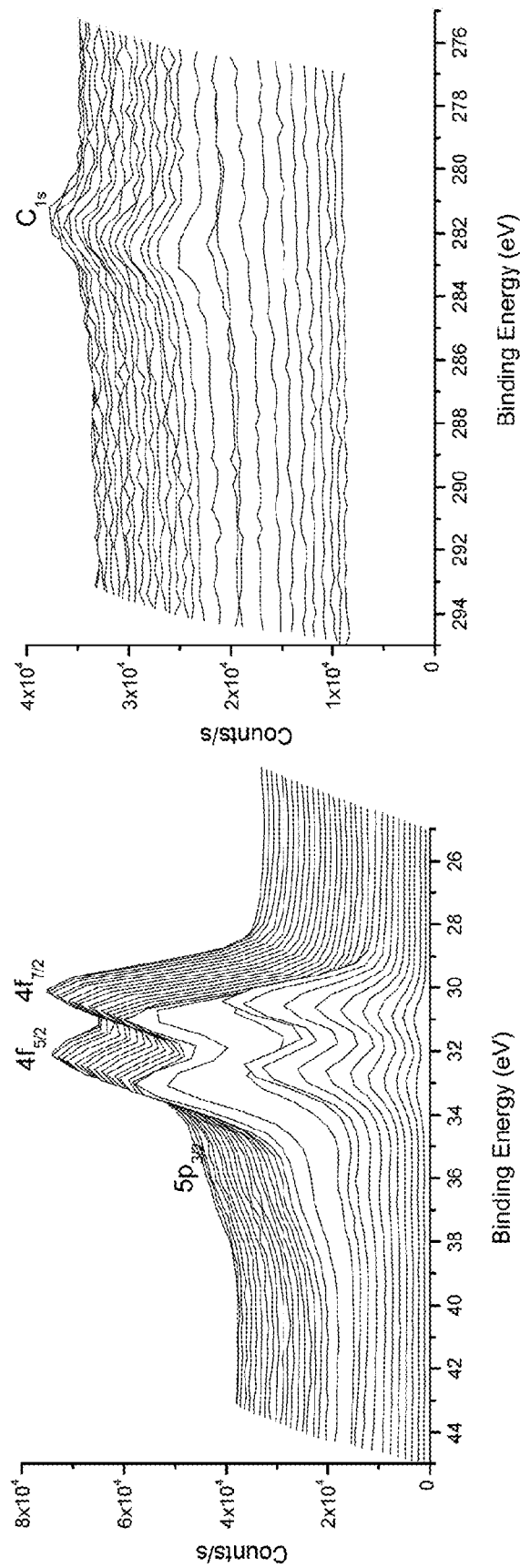
FIG. 12(c) shows O 1s.
FIG. 12(d) shows C 1s.
Figures 12E, 12F:
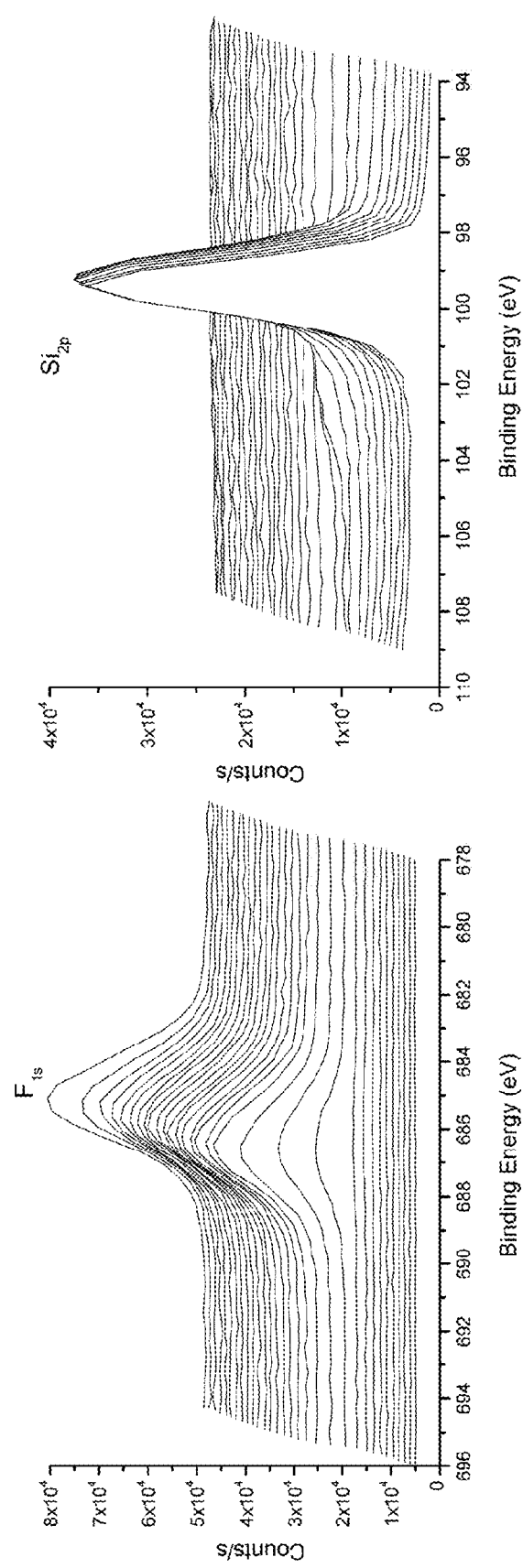
FIG. 12(e) shows F 1s.
FIG. 12(f) shows Si 2p.

XPS spectra of individual elements were taken with respect to their binding energies after removing the W:$Al_2O_3$ composite layer with a sputter rate of (~30 Å/min) and are shown in FIGS. 12(a)-12(f) and summarized in Table 2. The XPS spectral regions of Al 2p (FIG. 12a), O 1s (FIG. 12b), W4f (FIG. 12c), F 1s (FIG. 12d), C 1s (FIG. 12e) and Si 2p (FIG. 12f) signals collected across the sample. Spectral features of Al 2p with BE=75.8 eV and O 1s with BE=532.34 eV are very comparable across the films which confirms a uniform arrangement of $Al_2O_3$ surroundings for other elements within the film thickness. Amazingly, W 4f spectral region in FIG. 12(c) shows characteristically strong presence of metallic W throughout layer thickness. These XPS data supports the nanostructures observed in HAADF STEM and HRTEM images (FIG. 11) where 1-2 nm metallic W particles embedded homogeneously in $Al_2O_3$ amorphous matrix. The W 4f features of metallic W and tungsten carbides appear at 31.4 eV and 33.4 eV, while those of oxidized W are characterized by peaks at 35.5 and 37.7 eV. The W4f peaks show a small shoulder in between 36-38 ev range and can be associated with evidence of formation of small tungsten oxide that might have formed as a native oxide on W nanoparticles. The XPS spectra of C1s features has a peak position at 283.8 eV in FIG. 12(e) which shows a broadening with weak signal. The source of C signal is from —(CH$_3$)* group form the TMA ALD precursor. We believed that this C1s position at 283.8 eV is mostly due to carbide formation. In this case C may have bonded to the W which can contribute to the very small fraction of formation of WC in the W:$Al_2O_3$ composite layer.

TABLE 2

Summary of XPS binding energy regions for W:$Al_2O_3$

| Element | XPS reference peak position at BE (ev) taken from | XPS Peak positions form sample at BE (ev) | Possible elemental bonding |
| --- | --- | --- | --- |
| Al2p | 73 | 75.8 | Al in $Al_2O_3$ |
| O1s | 531 | 532.3 | O in $Al_2O_3$ |
| W4f | 31.4 | 31.6 | Metallic W or WC |
| F1s | 685 | 687.1 | $AlF_3 \cdot 3H_2O$ |
| C1s | 284.5 | 283.8 | Carbide, WC |
| Si2p | 99.3 | 99.4 | Si(100) substrate |

Figures 13A, 13B:
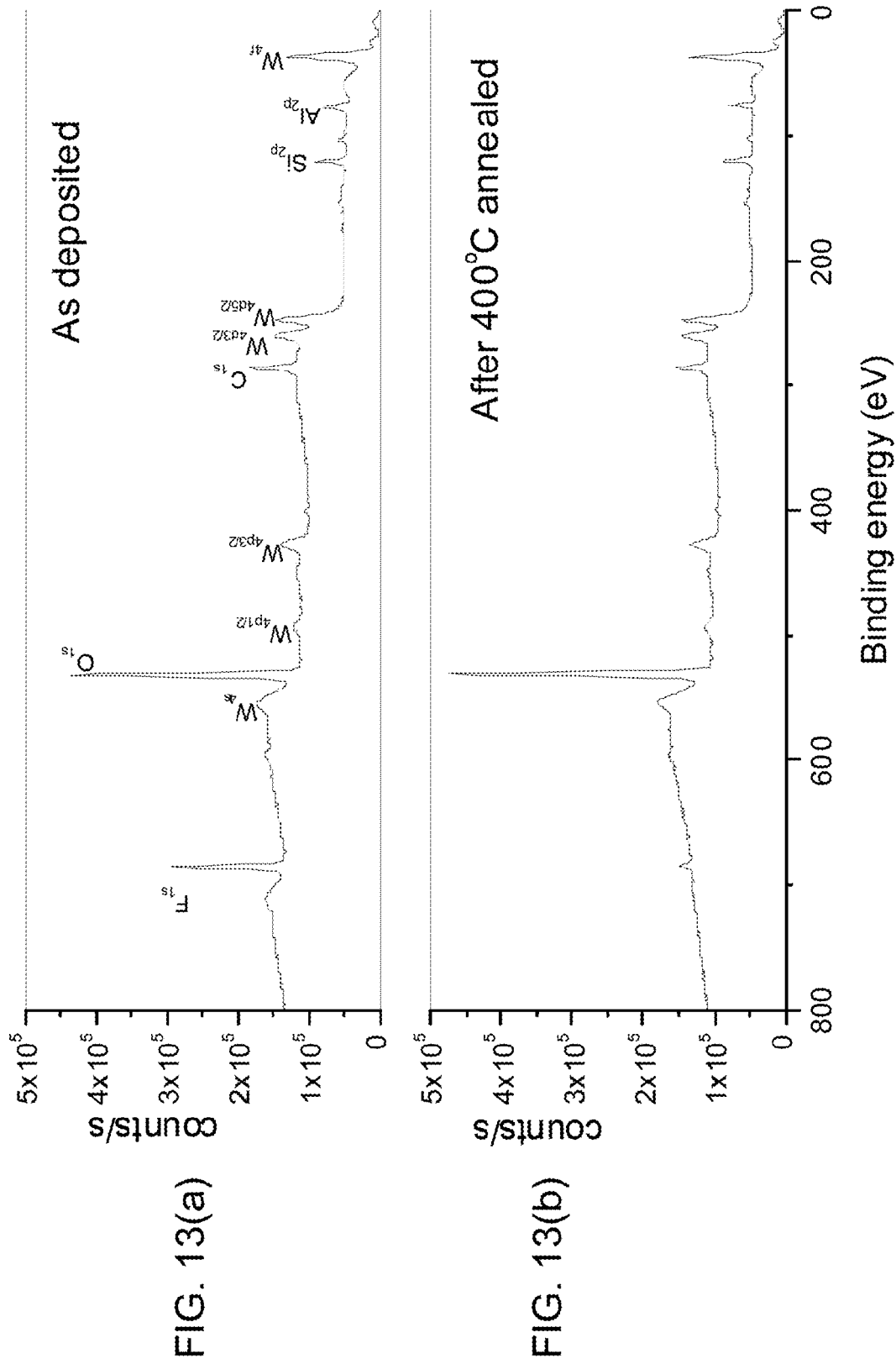
FIG. 13(a) shows an XPS scans of an as grown W:Al$_2$O$_3$ sample with of (30% W:70% Al$_2$O$_3$) ALD cycles and FIG. 13(b) after 400° C. annealing in 300 sccm Ar for 4 hours at pressure of 1 Torr.
Figure 14B:
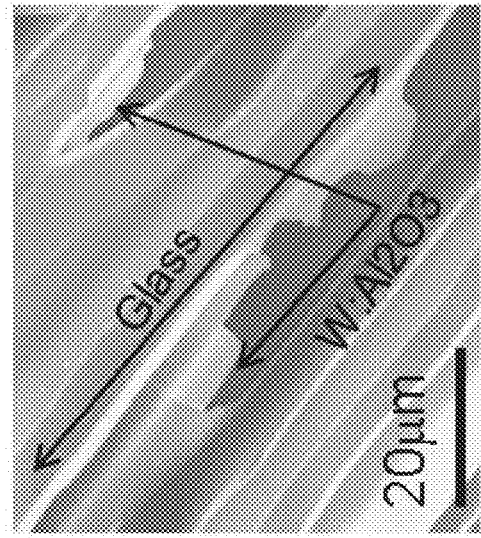
FIG. 14(b) shows a high magnification SEM image from the cross section of glass-capillary pores which shows the presence of a thin layer in the area where micro-capillary glass plate was uneven.
Figure 14D:
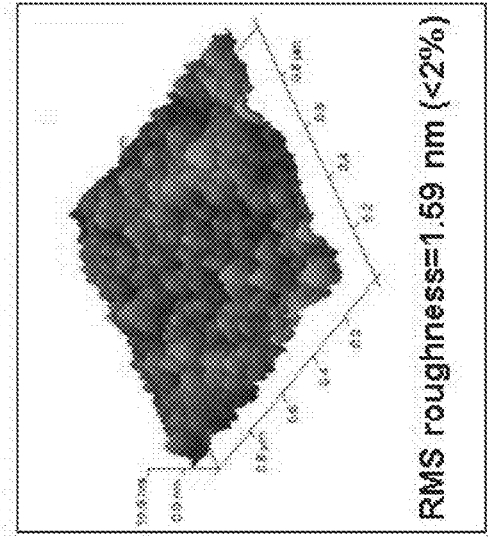
FIG. 14(d) shows an AFM scan on the collated inner surface of the one of the pores.
Figure 14A:
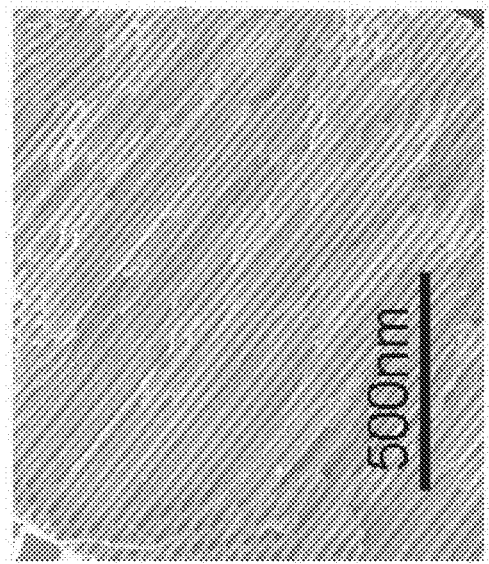
FIG. 14(a) shows microstructure and conformality of the W:Al$_2$O$_3$ system: SEM W:Al$_2$O$_3$ on micro-capillary glass plate substrates.
Figure 14C:
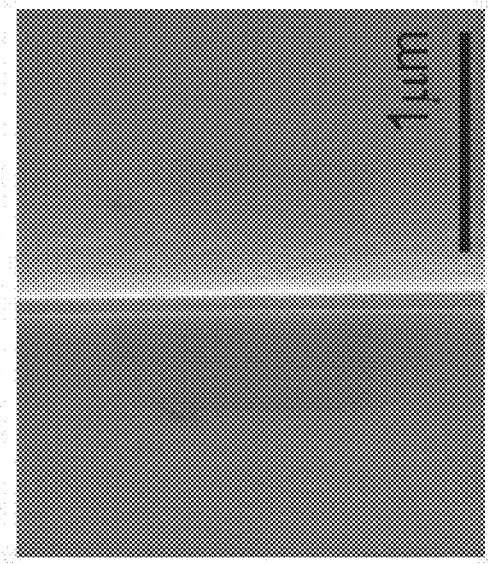
FIG. 14(c) shows a cross section of one of the micro capillary pore walls which show W:Al2O3 deposited uniformly.

Evidently, F1s features in FIG. 12(d) are a strong signal and associated with $AlF_3 \cdot 3H_2O$ (aluminum fluoride trihydrate). Formation of $AlF_3 \cdot 3H_2O$ percentage might have a relationship to the ALD precursors, especially TMA and $WF_6$ and precursor cycles sequence. This particular sample was prepared using (30% W:70% $Al_2O_3$) ALD cycle ratio using the ALD precursor cycle sequence of n[x(TMA-$H_2O$)-y(Si2H$_6$—$WF_6$)]. Note that for n[x(TMA-$H_2O$)-y(Si2H$_6$—$WF_6$)] ALD cycle, the $WF_6$ precursor dose will leave reactive species *$WF_3$ on the deposition surface; and on top of this we introduced TMA which can produce $AlF_3$ as a reaction by-product which has high melting point, boiling and low volatility. Furthermore this $AlF_3$ subsequently is hydrated as a result of a follow-up $H_2O$ precursor dose. This could explain the formation of $AlF_3 \cdot 3H_2O$ in the film with respect to use of ALD precursors and their sequence. Formation of $AlF_3 \cdot 3H_2O$ could also cause different mass uptake when introduced TMA after a $WF_6$ precursor dose. This mass-add on is about twice the mass in comparison to TMA-H$_2$O as shown in FIG. 5. As thickness of the layer is increased, AlF$_3$.3H$_2$O mass add-on could change. Nevertheless the AlF$_3$.3H$_2$O concentration will depend on n, x, y and ALD precursor sequence n[x (TMA-H$_2$O)-y(Si2H$_6$—WF$_6$)] for any given ALD condition as a result of the nature of the precursor, especially TMA and WF$_6$ that is used for W:Al$_2$O$_3$ ALD growth. After annealing of this composite layer the F amount is reduced to 7.8% compared to an as grown sample F amount (16.5%) shown in FIGS. 13(a) and (b) which represent XPS scans of as grown samples and after 400° C. annealing in Ar for 4 hours at pressure of 1 Torr.

The conformality of the composite W:Al$_2$O$_3$ layer was studied by depositing this layer on the high aspect ratio (AR=60) micro-capillary borosilicate glass plate shown in FIGS. 14(a)-(d). Cross-section SEM analysis confirms the layer was deposited conformally on the wall of the glass pores. As deposited pure Al$_2$O$_3$ (600 Å) and W (500 Å) layers grown on Si(100) show an AFM RMS roughness of 5.1 Å and 9.5 Å, respectively. This can be compared to a 650 Å (30% W-70% Al$_2$O$_3$) ALD condition composite sample which shows an RMS roughness of 14.1 Å on Si(100) substrate and 15.9 Å inside of glass capillary pore which is less than 2% of actual thickness of composite W:Al$_2$O$_3$ layer.

Figures 15A, 15B:
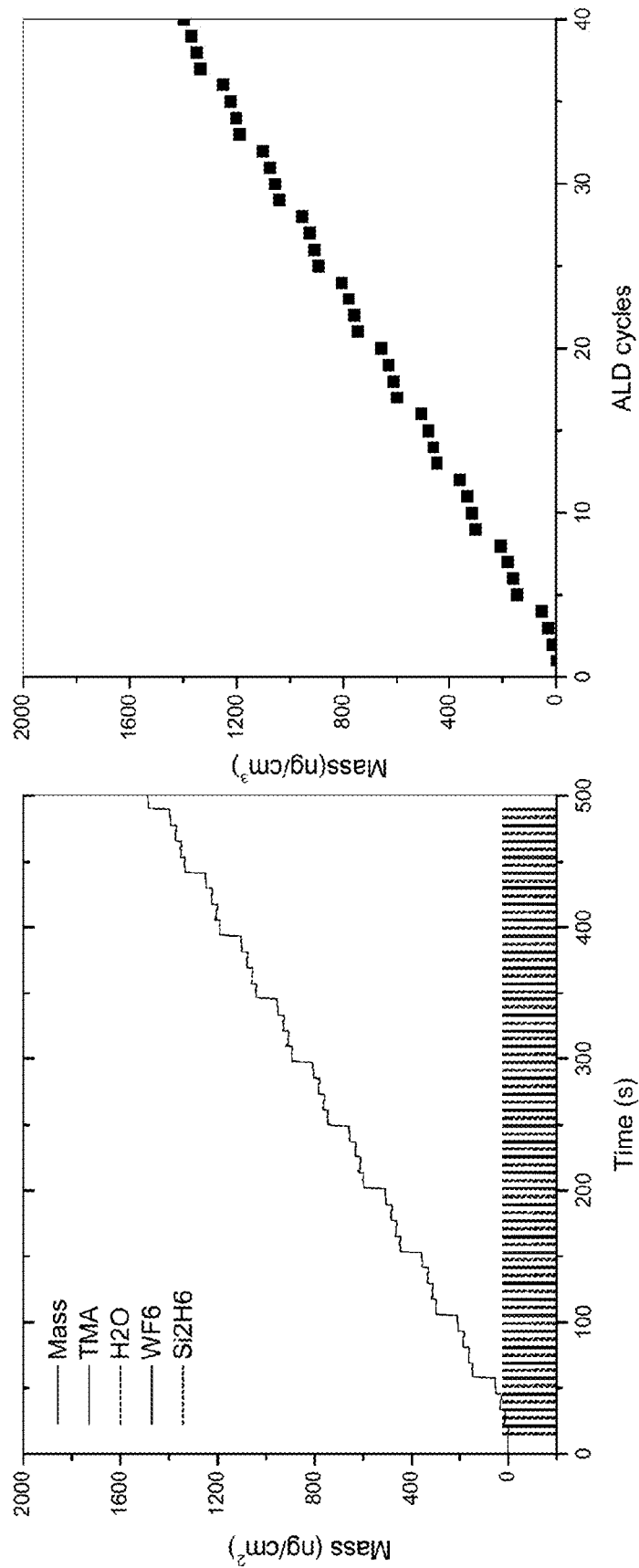
FIG. 15(a) shows mass uptakes on QCM during W:Al$_2$O$_3$ composite layer grown with (25% ALD W:75% ALD Al$_2$O$_3$)=3x(H$_2$O-TMA)-1x(Si2H$_6$—WF$_6$) precursor exposures sequence; ALD precursors dose vs. mass uptake.
FIG. 15(b) shows calculated mass uptake after each completion of cycle vs. ALD cycle.

The precursor sequence in ALD has an important role, and this will define the functional group or reactive side for a sequential precursor dose. FIGS. 15(a)-(d) display the data from the QCM study performed at 200° C. for (25% W:75% Al$_2$O$_3$) ALD cycle case. This is a simple repetition of an ALD super cycle which includes [3x(TMA-N$_2$—H$_2$O—N$_2$)+1x (Si$_2$H$_6$—N$_2$—WF$_6$—N$_2$)] cycles up to the desired thickness. All precursors were dosed for 1 s and 10 s purge after every precursor dose shown in FIG. 15(a). A linear mass add-on behavior was observed for an ALD super cycle and within the super cycle. Magnification or zoom-in data of one of such a super cycle is shown in FIG. 15(b) which shows the actually mass add-on from each ALD cycle within one super ALD cycle. The calculated mass add-on/ALD cycle from the FIG. 15(a) is plotted as per the ALD cycles shown in FIG. 15(c). This shows liner mass add-on/ALD cycle. Mass uptake for every single ALD cycles is plotted against the number of ALD cycles. FIG. 15(d) shows four distinct mass add-on regions, with the bottom three being masses add-on due to 3x(TMA-N$_2$—H$_2$O—N$_2$) ALD cycles. Top mass add-on was due to 1x(Si$_2$H$_6$—N$_2$—WF$_6$—N$_2$) ALD cycles.

This mass add-on for one super ALD cycle or within the super cycle is significantly lower than the steady state mass uptakes for W and Al$_2$O$_3$ shown in FIGS. 2(a)-2(d) and 3(a)-3(d). The sum of mass uptakes for 3x(TMA-N$_2$—H$_2$O—N$_2$) ~63 nm/cm$^2$ give an average of ~21 nm/cm$^2$ that is ~45% lower than the steady state mass uptakes (37 ng/cm$^2$/ALD cycle) for Al$_2$O$_3$. From the total mass of 3x(TMA-N$_2$—H$_2$O—N$_2$) ~63 nm/cm$^2$ this corresponds to the ~2 Å of Al$_2$O$_3$ thickness that corresponds to formation of ~$^{3}/_{4}$$^{th}$ monolayer of AlO$_x$ based on the physical thickness of AlO$_x$ monolayer=~2.7 Å. For this particular ALD cycle condition the average mass adds-on/per W ALD cycles after every 3xAl$_2$O$_3$ cycles is ~130 nm/cm$^2$ which is ~7 times lower than the W mass uptake for a steady state ~930 ng/cm$^2$/ALD cycle and gives a growth rate for W ~5 Å. This is an equivalent thickness of W for mass ~130 ng/cm$^2$=~0.7 Å which=$^{1}/_{5}$$^{th}$ of monolayer thickness of W, based on the physical thickness of monolayer of W ~4 Å with equivalent mass ~745 ng/cm$^2$. It is clear that the W layer will not be continuous and will not form even a monolayer up to 95% of W ALD cycles condition and is supported by mass update data from FIG. 7(a). Nevertheless, this ~0.7 Å layer could deposit clusters of W which may be sub-nanoparticles in size. We believe these QCM mass add-on calculations data and the existence of nano size W particles that we observed in HRTEM micrographs support each other. On the other hand, the mass uptakes are very linear and reproducible for each ALD super cycle.

Figure 16:
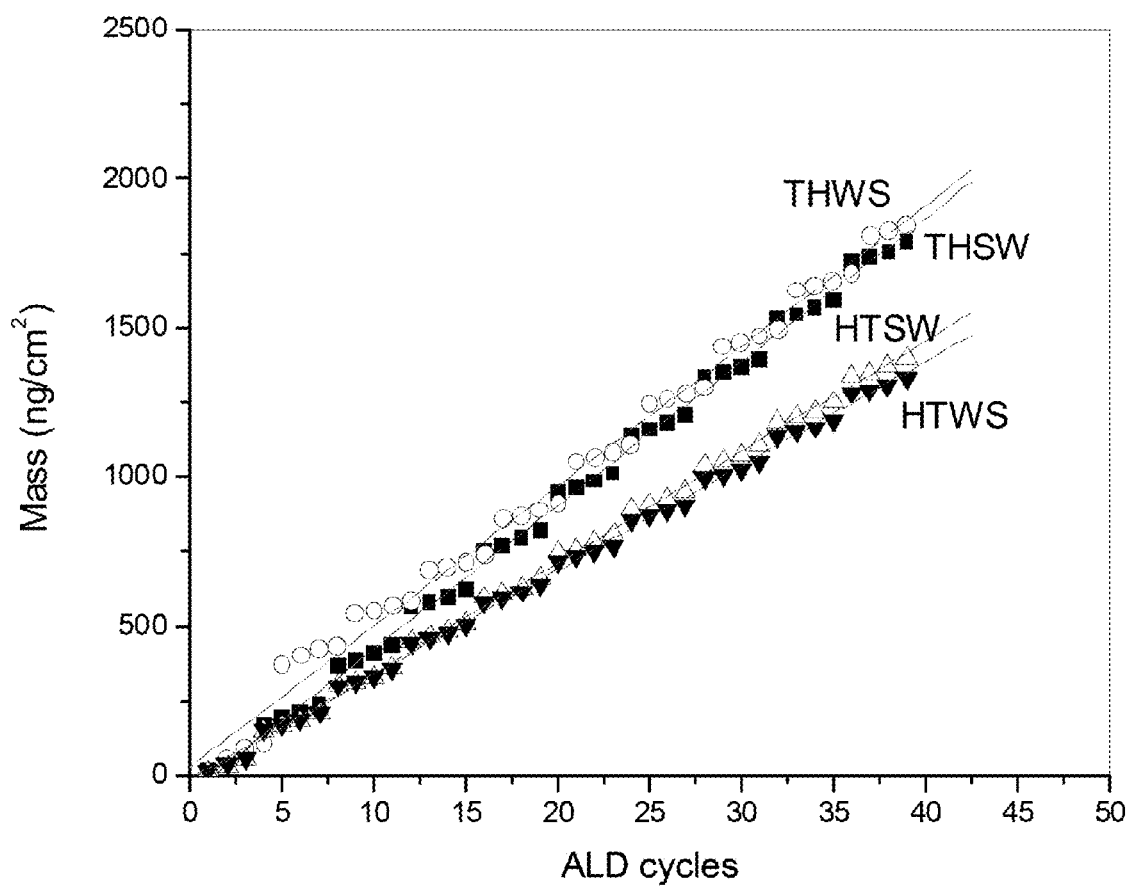
FIG. 16 shows mass add on QCM during W:Al$_2$O$_3$ composite layer grown with (25% W:75% Al$_2$O$_3$) ALD cycle condition with variation in the precursor dose sequence in ALD reactor.

Similar to the FIG. 15(a) data, the add-on for the various ALD precursors sequence for 25% W:75% Al$_2$O$_3$ ALD cycles growth were recorded and summarized as all-in-one in FIG. 16. The mass/per ALD for super ALD cycle are extracted for all the conditions and are summarized in Table 3. The major mass add-on occurs during exposure of TMA and WF$_6$ precursors. Si$_2$H$_6$ exposure on H$_2$O or H$_2$O exposure on Si$_2$H$_6$ has shown very little effect on the mass add-on.

TABLE 3

Mass uptakes on QCM during various ALD cycle precursor sequence

| Layer | Precursors sequence | Notation | Average Mass uptake (ng/cm$^2$/ALD cycle) | | |
|---|---|---|---|---|---|
| Al$_2$O$_3$ | 1x(TMA-H$_2$O) | | 37 | | |
| W | 1x(Si$_2$H$_6$-WF$_6$) | | 930 | | |
| | | | 3xAl$_2$O$_3$ | 1xW | Total |
| W:Al$_2$O$_3$ | 3x(TMA-H$_2$O)-1x(Si$_2$H$_6$—WF$_6$) | THSW | 63 | 129 | 192 |
| W:Al$_2$O$_3$ | 3x(TMA-H$_2$O)-1x(WF$_6$—Si$_2$H$_6$) | THWS | 52 | 136 | 188 |
| W:Al$_2$O$_3$ | 3x(H$_2$O-TMA)-1x(Si$_2$H$_6$—WF$_6$) | HTSW | 62 | 87 | 149 |
| W:Al$_2$O$_3$ | 3x(H$_2$O-TMA)-1x(WF$_6$—Si$_2$H$_6$) | HTWS | 53 | 89 | 142 |

Figure 17A:
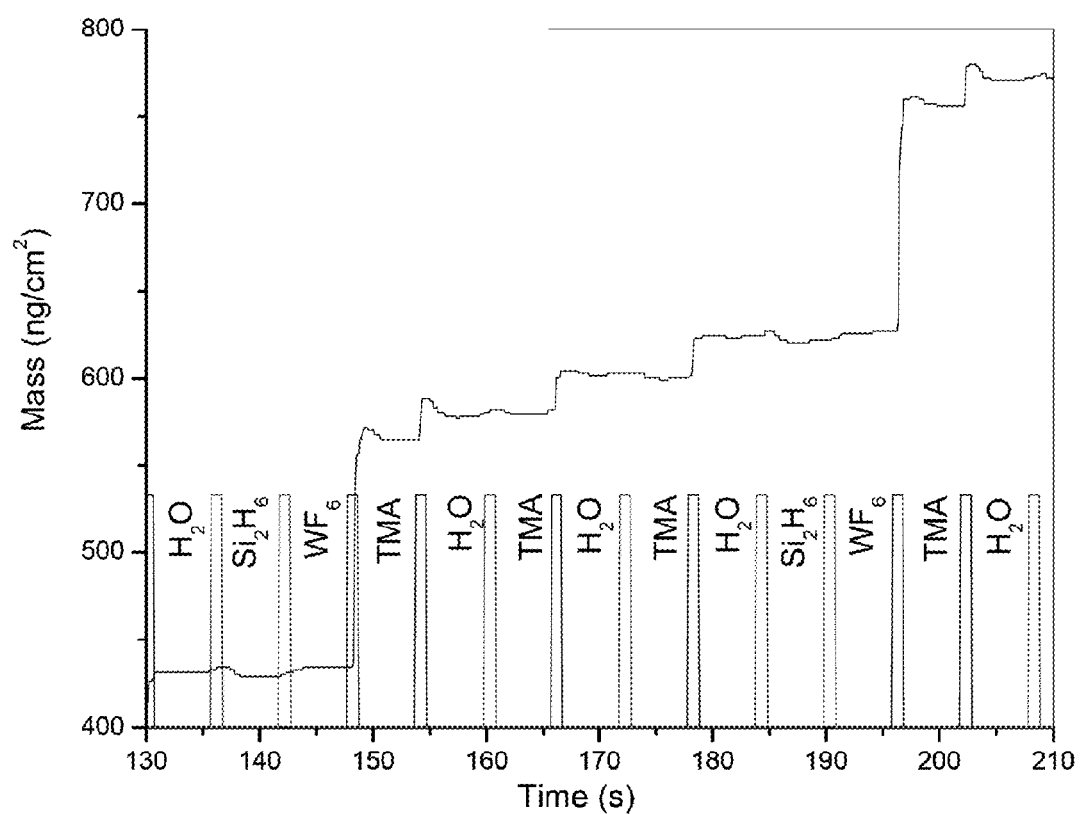
FIG. 17(a) shows QCM mass add on for one super cycle (25% W:75% Al$_2$O$_3$) ALD cycle condition for various ALD precursor sequence: THSW.
Figure 17B:
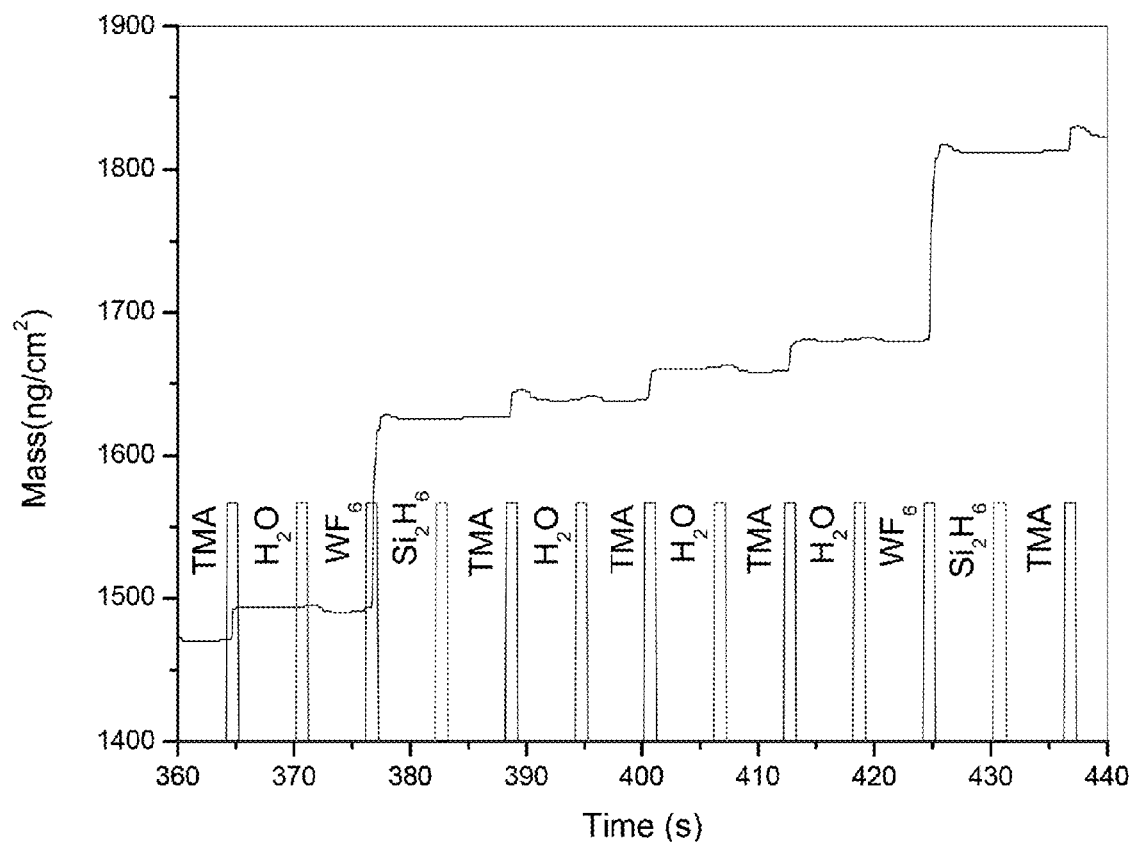
FIG. 17(b) shows THWS.
Figure 17C:
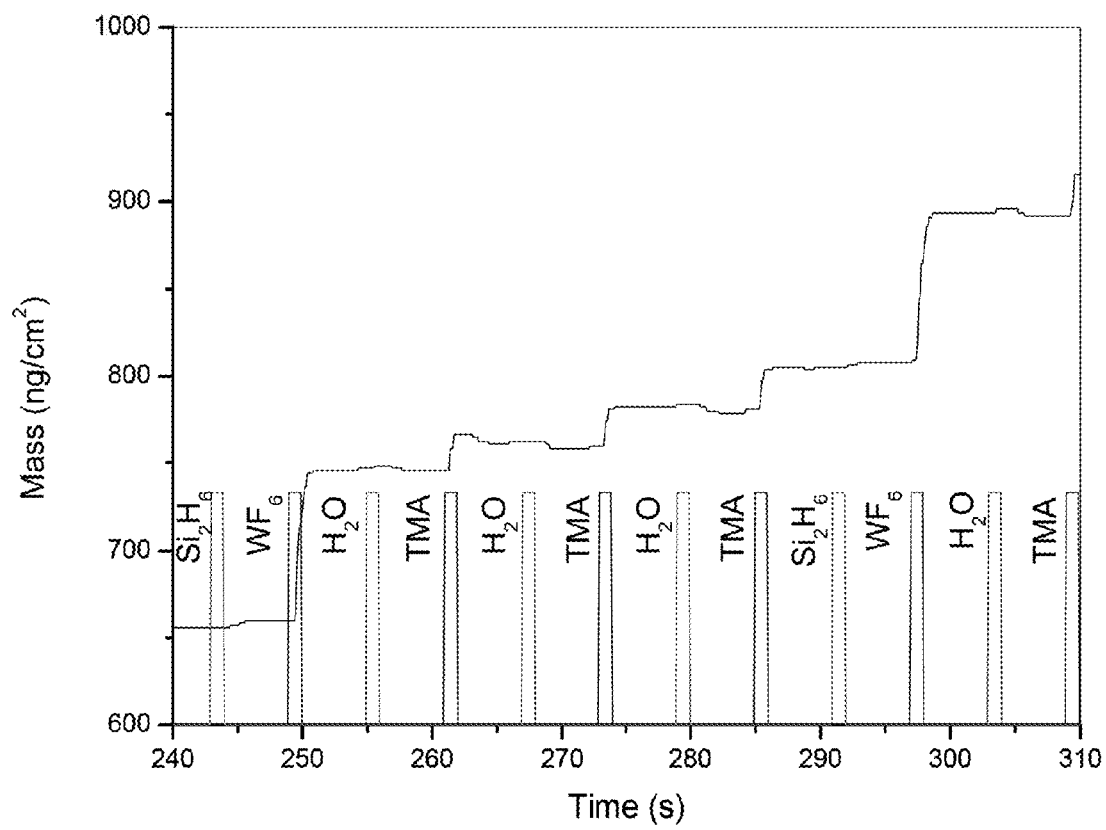
FIG. 17(c) shows HTSW.
Figure 17D:
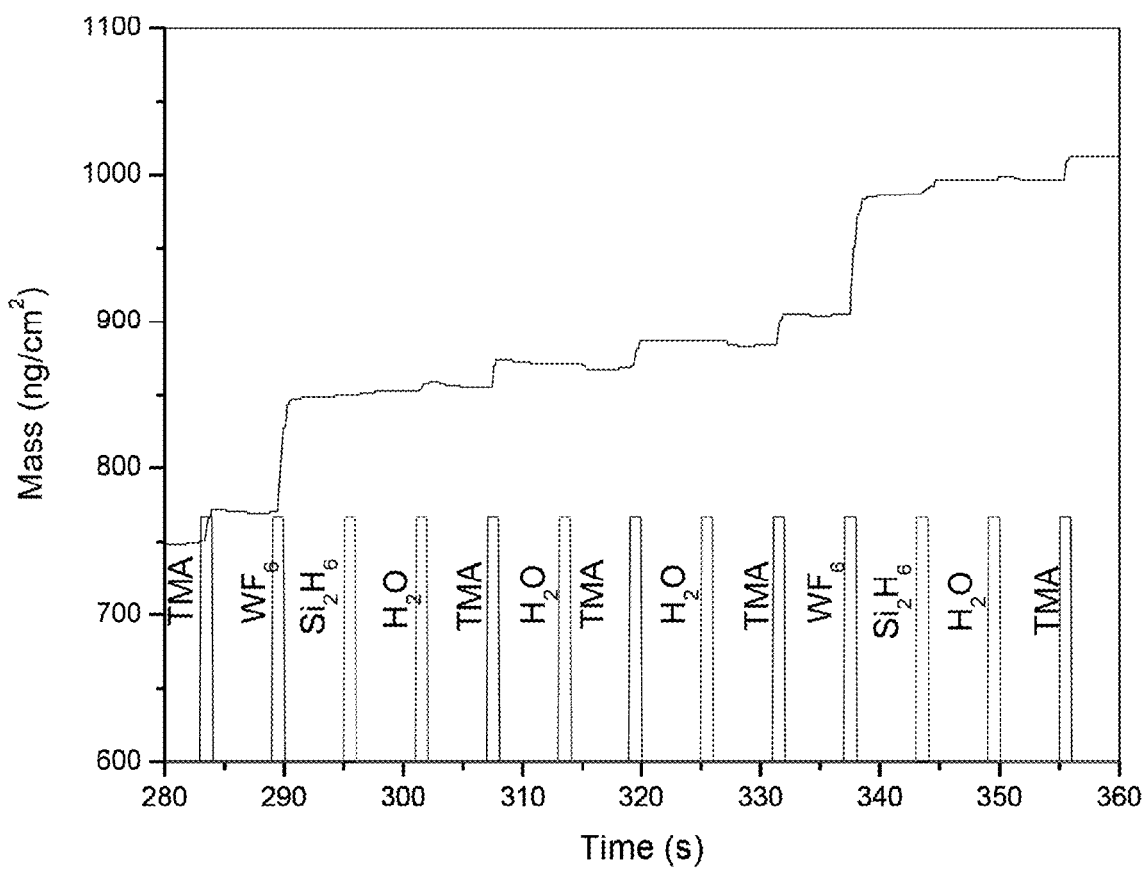
FIG. 17(d) shows HTWS.

A similar mass uptake was noticed for the ALD precursor sequence THWS and THSW and can relate to W growth on —OH rich surface. AlF$_3$.3H$_2$O can cause exposure of TMA on W which actually adds the mass shown in FIGS. 17(a) and (b). In contrast to ALD with THWS and THSW precursor sequence ~25% less mass uptake rate was recorded when ALD was performed with a HTWS and HTSW precursor sequence in ALD cycle. This lesser mass uptake can be linked to the W growth on —Al(CH$_3$) rich surface and to after W exposure of H$_2$O precursor which did not add any mass in both HTWS and HTSW as shown in FIGS. 17(c) and (d).

Figure 18:
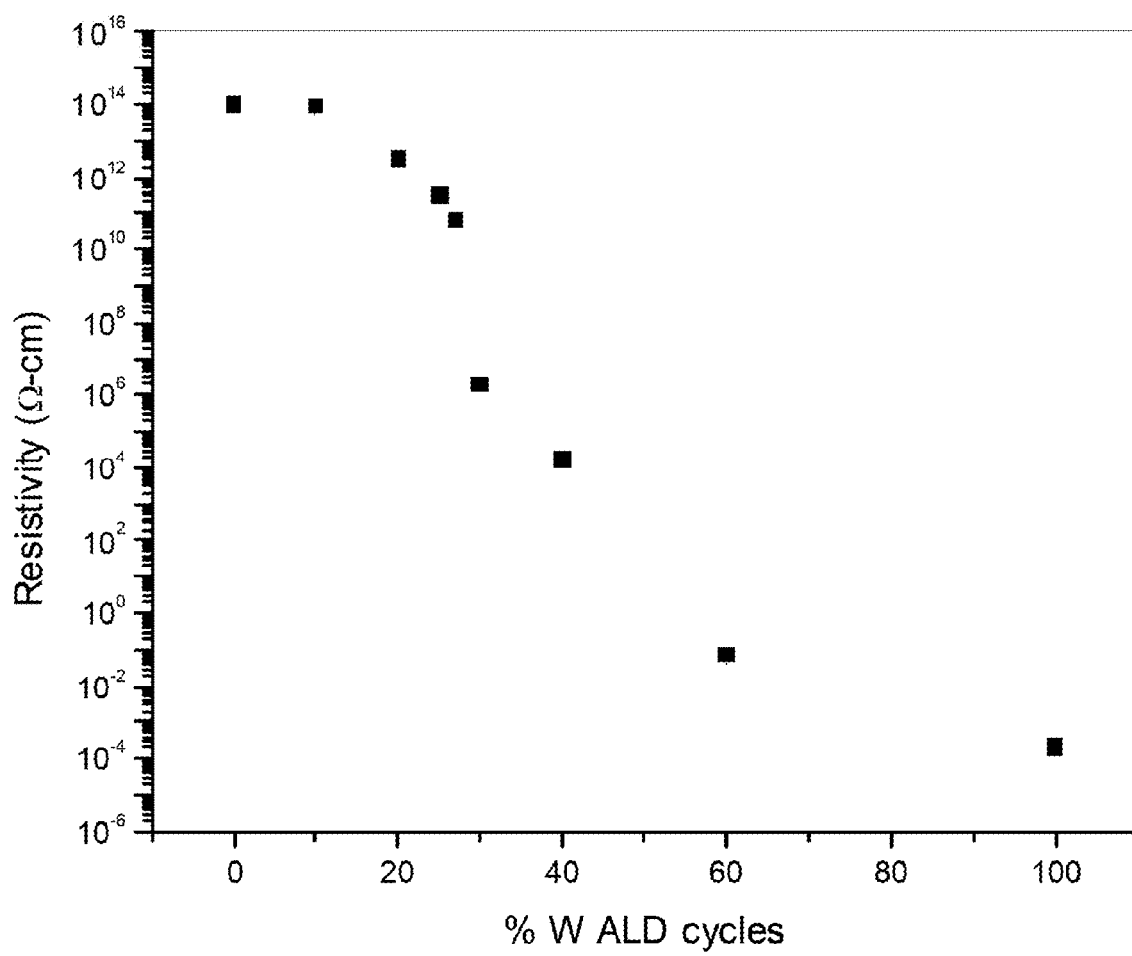
FIG. 18 shows resistivity of W:Al$_2$O$_3$ composite layers as a function of % W ALD cycles with all the other parameters kept identical and the sequence of precursor=[x(TMA-H$_2$O):y(Si2H$_6$—WF$_6$)] where x and y varied between 0-100.

Current-Voltage (I-V) characteristics of the W:Al$_2$O$_3$ with various compositions were measured. FIG. 18 represents the measured resistivity from an I-V analysis vs. % of W ALD cycles in W:Al$_2$O$_3$ composites. A wide span of resistivity was observed and resistivity decreases rapidly when % W ALD cycles increased in W:Al$_2$O$_3$ composite growth. This type of controlled tunable resistive coating was applied as a resistive layer for a microchannel plate and can be used in photodetection applications, as well as in other applications previously cited herein.

Transverse (⊥) characteristics were determined by appropriate contacts where the electric field is perpendicular and longitudinal (∥) characteristics where the electric field is parallel to the W:Al$_2$O$_3$ composite layers I-V. In the longitudinal measurement the high surface area microchannel plate was used and a gold pattern comb structure contained 80000 sq and 2 μm spacing. For transverse measurements a TiN deposited Si substrate was used which makes bottom contact; and a top contact was made with a Hg drop set-up with dot size of about 812 μm.

Figure 19:
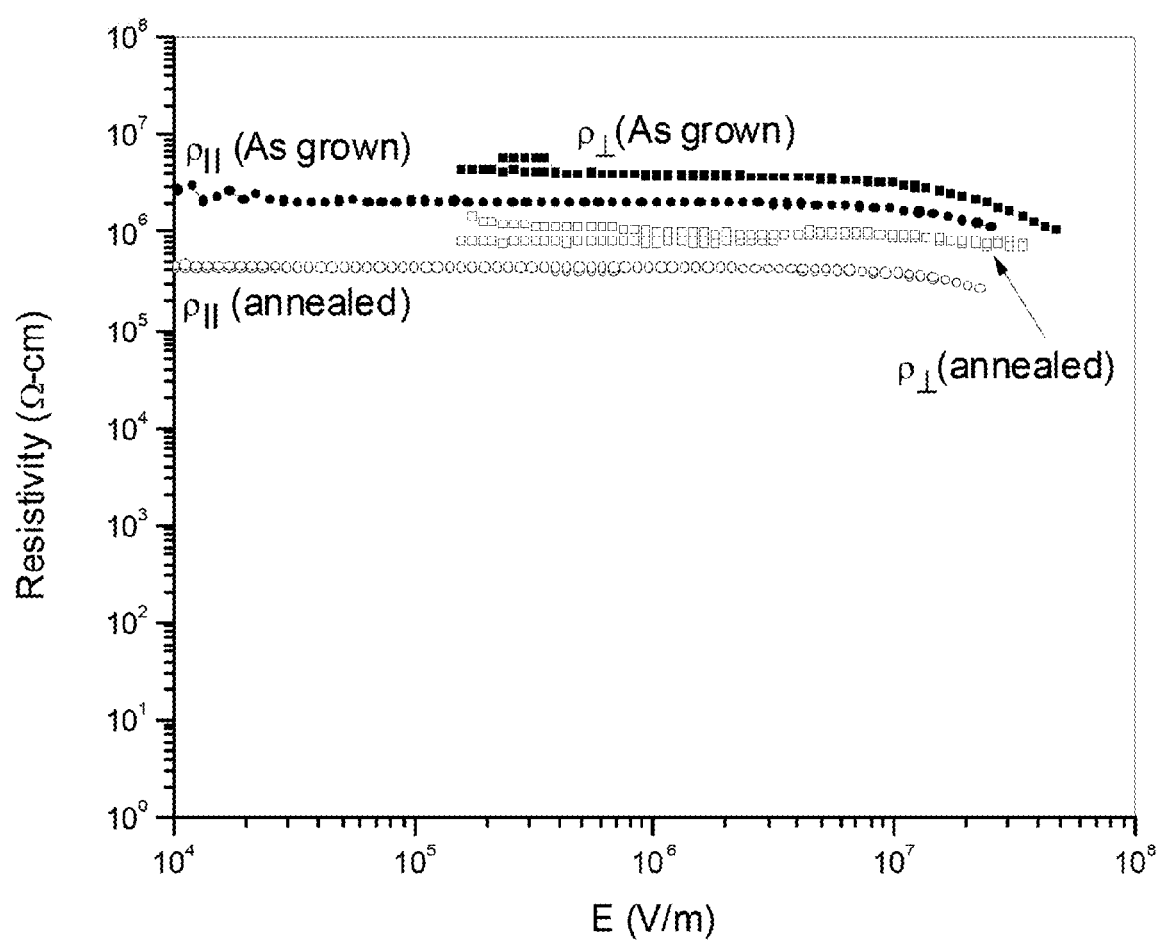
FIG. 19 shows transverse ($\perp$) and longitudinal ($\parallel$) resistivity data for the as deposited and 400° C. annelid Ar samples of W:Al$_2$O$_3$ composite layer deposited with (30% ALD W:70% ALD Al$_2$O$_3$).=x(TMA-H$_2$O):y(Si2H$_6$—WF$_6$)

In FIG. 19 the transverse and longitudinal resistivities were plotted against the electric field for W:Al$_2$O$_3$ layer deposited with the 30% W ALD cycle condition sample from FIG. 18. Both transverse and longitudinal resistivity show slight differences. Annealing this sample at 400° C. in 300 sccm argon at 1 Torr for 4 hours resulted in both transverse and longitudinal resistivity decreasing by nearly one order of magnitude. In both as grown and annealed condition measurements transverse resistivity is slightly higher than the longitudinal resistivity. Resistive values vs. field shows more or less a flat response up to electric field ~10$^7$V/m and follows the rapid decrease in resistivity as field increases which can correlate to a conduction mechanism in the layer.

The possibility of Fowler-Nordheim tunneling mechanism here is low because it normally requires very high electric field (E) for reasonable conduction which is about ~1 GV/m. Instead of this conduction for the W:Al$_2$O$_3$ composite it is likely to occur through one of the two predominant conduction mechanisms for insulators, Frankel-Poole (FP) emission, which has the following form, $$J \propto E \exp(-q(\phi_b - (qE/\pi\epsilon)^{1/2}/k_BT)) \quad (1)$$

or Space-Charge Limited (SCL) emission, which at high field is $$J \sim \epsilon\mu(V^2/L^3) \quad (2)$$

These two mechanisms have different IV behavior. At lower field the IV curve follows linear ohm's law (V=IR) where as the I-V curve of FP emission is characterized by a straight line at large E on a semi-log plot of J/E vs. E$^{1/2}$. In contrast to this the IV curve of SCL emission has a second order dependence on E. In addition to this only FP emission will show the temperature dependence, whereas both SCL and FN tunneling will not.

Figure 20A:
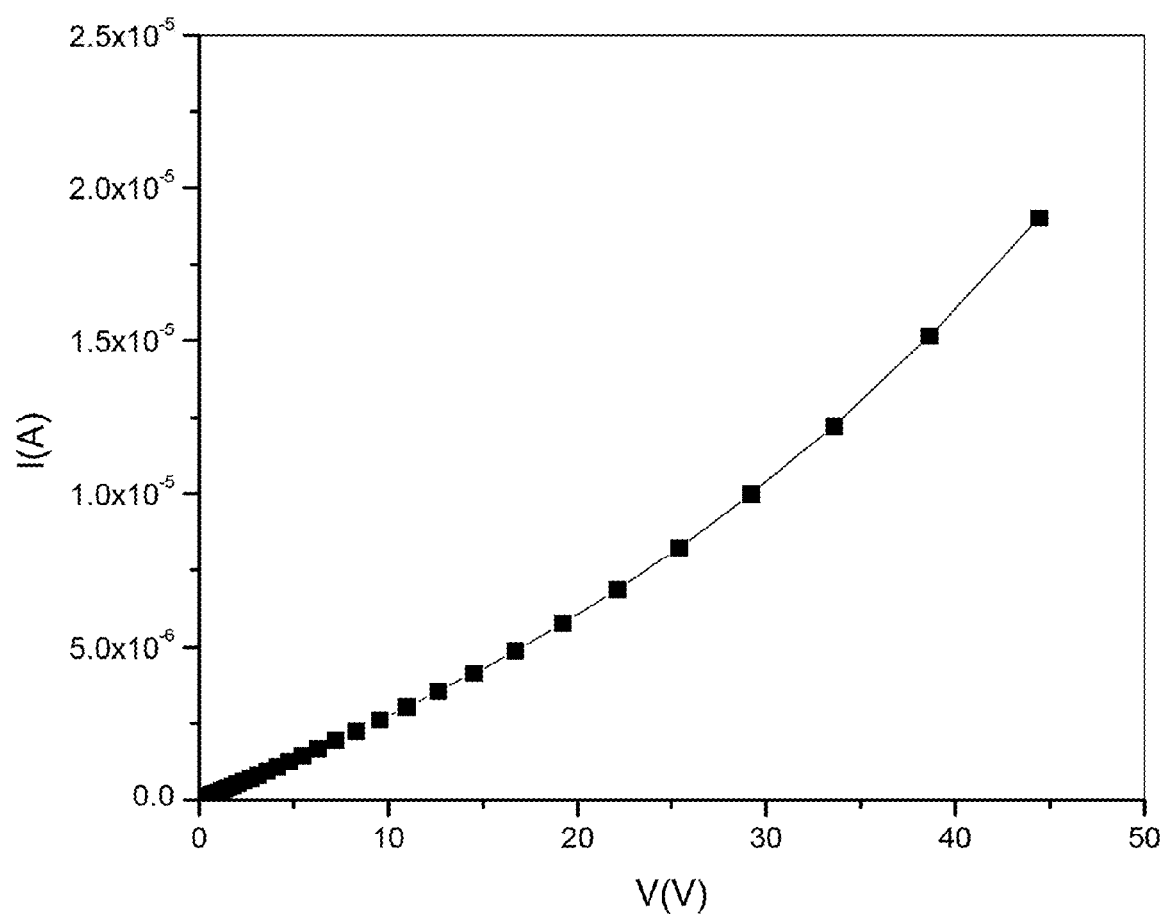
FIG. 20(a) shows an IV curve of a film.
Figure 20B:
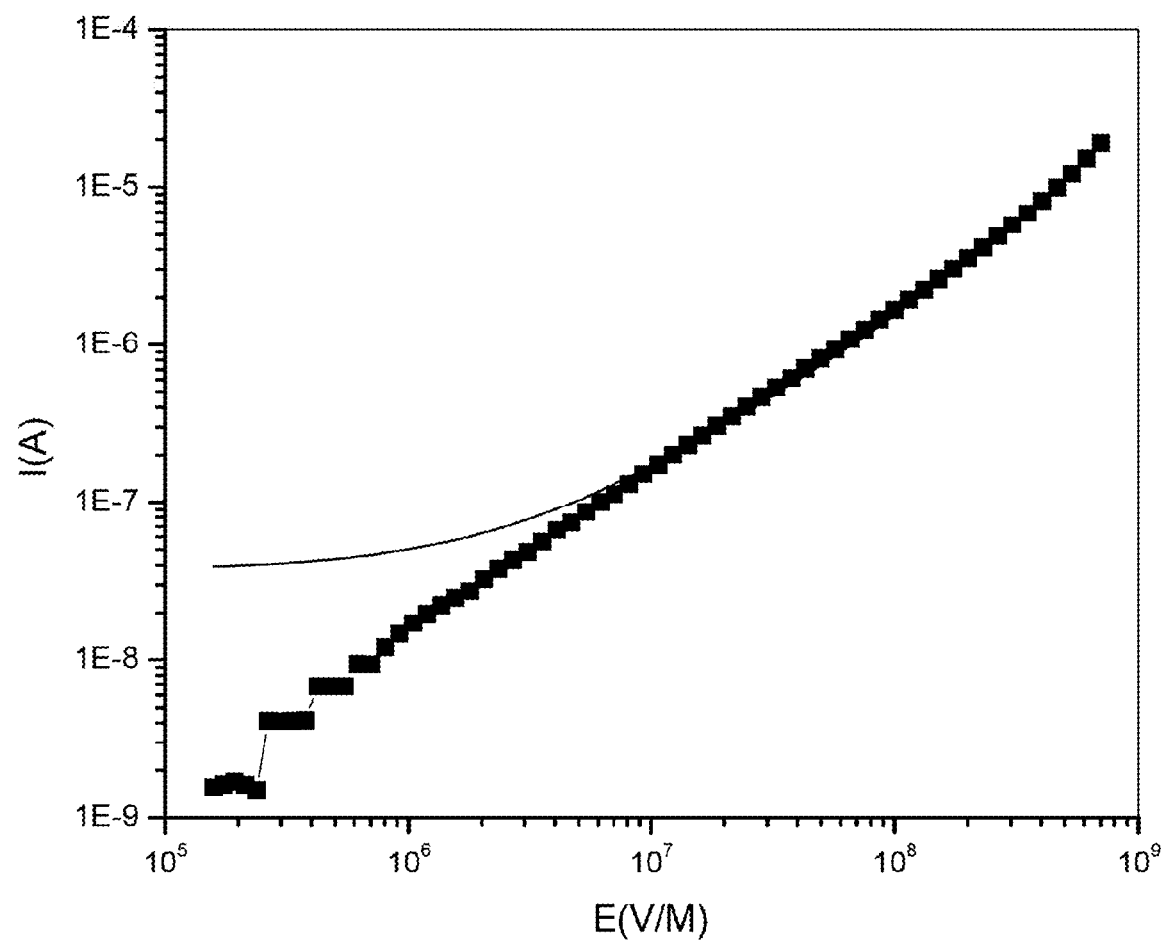
FIG. 20(b) shows log(J/E) vs. log (E)
Figure 20C:
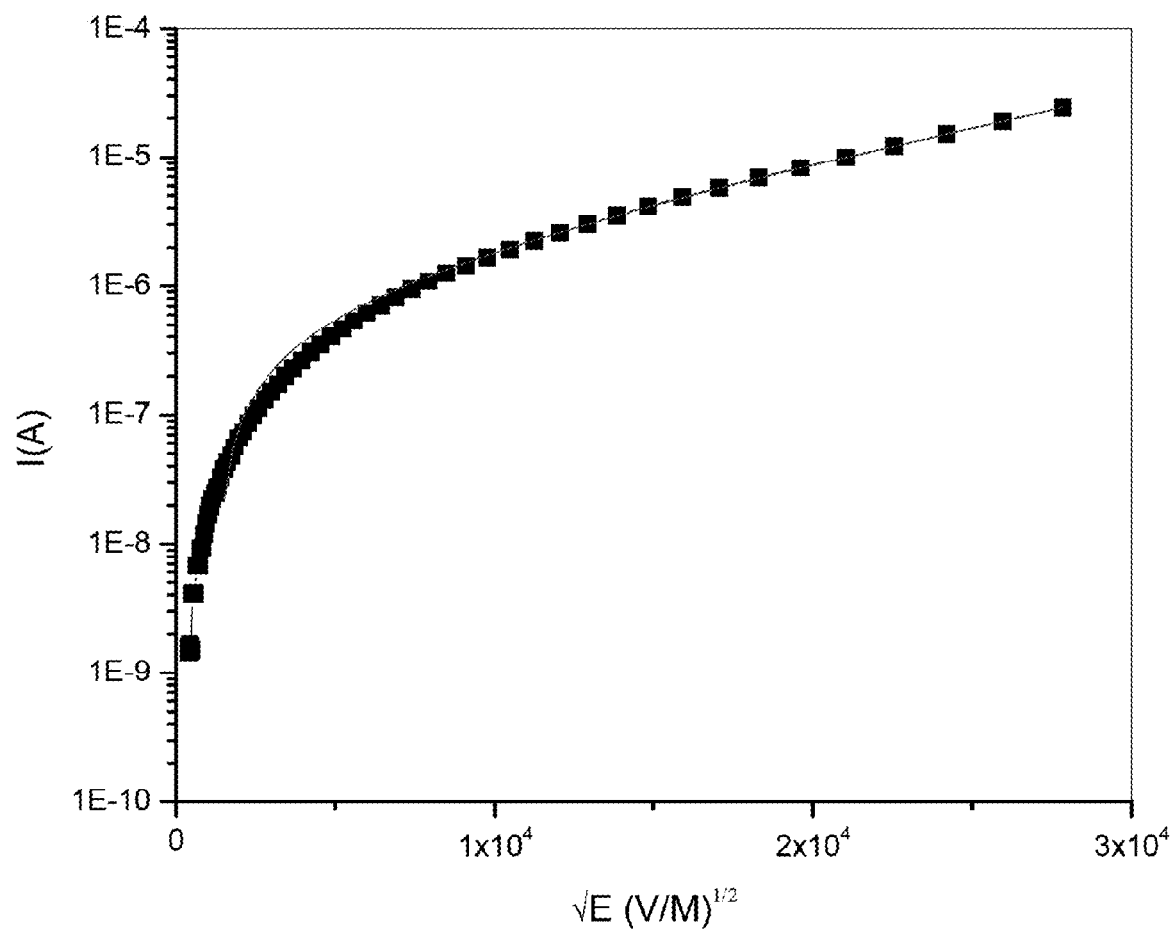
FIG. 20(c) shows on a semi-log scale J/E vs. E$^{1/2}$.

FIGS. 20(a)-20(d)(2) represent electrical measurements for a W:Al$_2$O$_3$ layer grown with a 30% W ALD cycle condition, IV curve of a film in FIG. 20(a) for log(J/E) vs. log (E) 20(b), on a semi-log scale J/E vs. E$^{1/2}$ in FIG. 20(c), and in 20(d) data fitting at low and high field with two different fits (at low field a linear least-square fit and exponential fit). Lower field data follows Ohm's law for J vs. E. At high electric fields the data forms a line which is consistent with the FP emission mechanism. To establish straight SCL emission characteristics, the data is plotted on a log-log scale FIG. 20(b) and J/E did not show 2$^{nd}$ order dependence on E. Also we noticed that the electrical behavior of the film was dependent on temperature (discussed later and shown in FIGS. 21(a) and (b)). As a result it is likely that the electron transport in W:Al$_2$O$_3$ composite layer is FP emission, and not SCL emission.

The overall picture of the electrical transport mechanism for the W:Al$_2$O$_3$ composite is likely due to W nano clusters/particles embedded in an amorphous Al$_2$O$_3$ matrix. It is unlikely that SCL emission or FN tunneling plays a significant role. The fundamental mechanism appears to be FP emission. The majority of the carriers are likely to be from the W nano-clusters, which have their Fermi level pinned at the Al$_2$O$_3$ defects and which are likely to reside on the W/Al$_2$O$_3$ interface. The ionization probability follows the Fermi-Dirac distribution, which is already incorporated into the FP emission equation. Nevertheless, these W nano clusters/particles embedded in a homogeneous amorphous Al$_2$O$_3$ matrix show a useful and distinctive conducting mechanism.

Figure 21A:
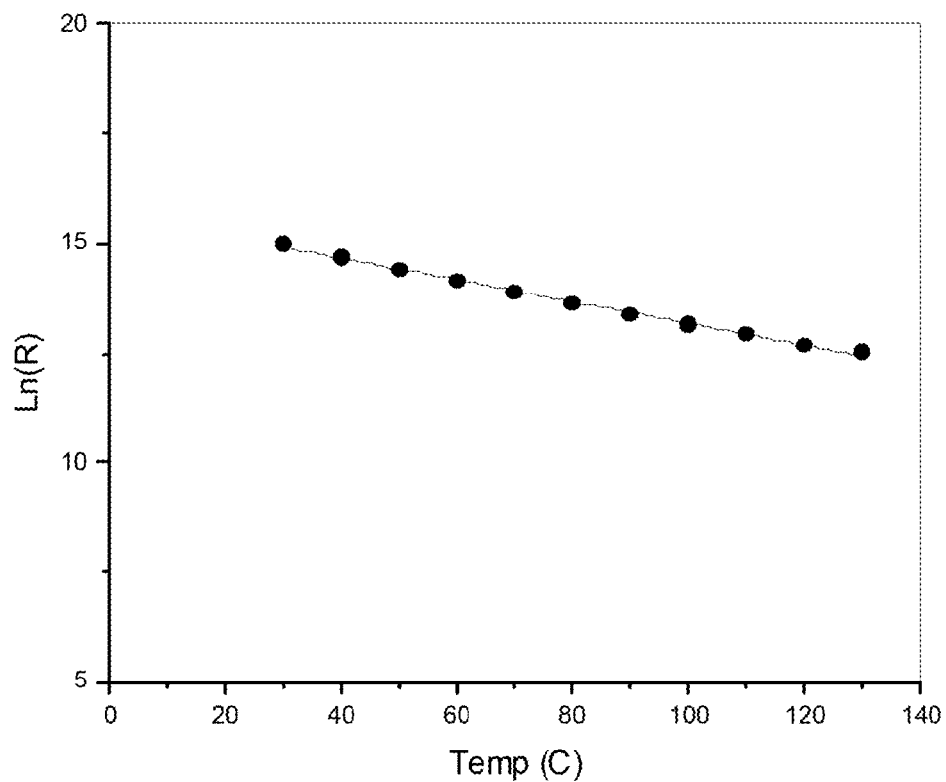
FIG. 21(a) shows ln(R) vs. Temperature

I-V behavior in the temperature range 30-130° C. were measured for (30% W:70% Al$_2$O$_3$) ALD cycle case sample. The resistance at different temperatures are shown in FIG. 21(a) and plotted per the known Steinhart-Hart equation. A linear fit to this data give a negative slop which is a temperature coefficient of resistance=-0.024 for The W:Al$_2$O$_3$.

Figure 21B:
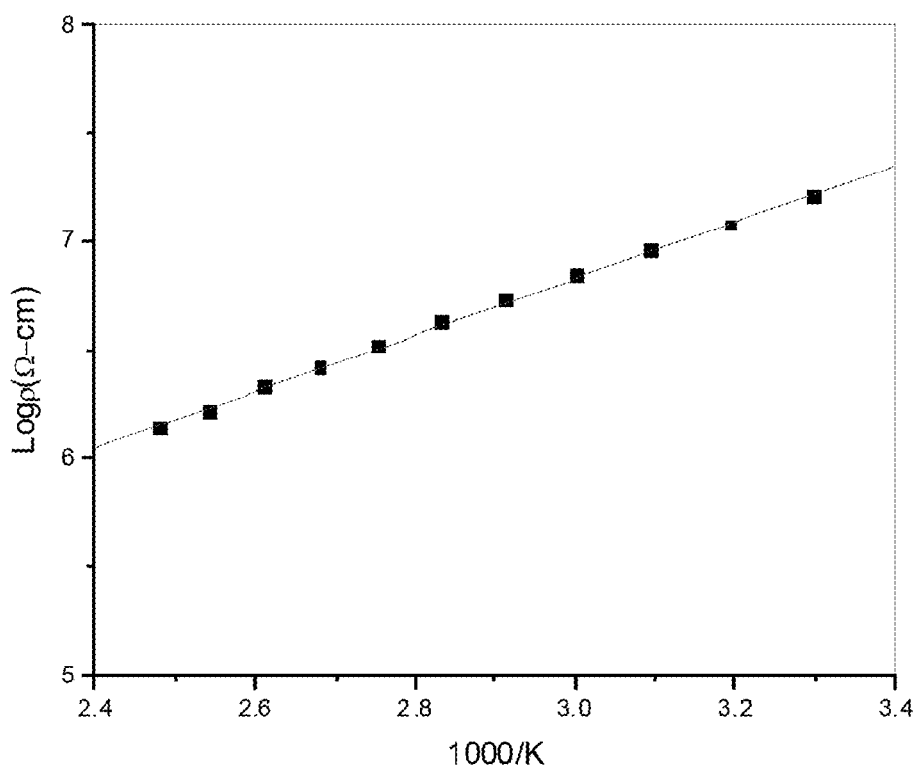
FIG. 21(b) shows log(resistivity) vs. temperature for W:Al2O3 composite layer deposited with 30% W ALD cycle condition.

The W:Al$_2$O$_3$ composite layer shows a negative temperature coefficient of resistance (PTCR) effect from 30° C. to 130° C. The PTCR effect is a very common phenomenon observed in semiconducting layers and defines the thermal runaway of the materials. FIG. 21(b) shows log(R) vs. 1/T plots for the W:Al$_2$O$_3$ composite layer films on comb structure wafer substrates. The IV data were collected from room temperature (300 K) to 403K. The films show resistivities of the order of 3.2 to 0.27 MΩ-cm over this temperature range. The straight-line nature of the Arrhenius plots indicates thermally activated conduction, as often found in semiconductors. From the slope of the curves the values of the activation energy (Ea) are obtained, which correspond to the minimum energy required to transfer electrons from the donor level to the conduction band. Values of E$_a$ obtained are 110 meV. This thermal coefficient and activation energy data are useful in for thermistor and MEMS devices.

In another embodiment of the invention involving Mo:Al$_2$O$_3$ (or MoAlO$_x$) the Mo:Al$_2$O$_3$ composite layer depositions were preferably carried out in a hot wall viscous flow reactor ALD reactor. The Mo:Al$_2$O$_3$ composite films were deposited on n-type Si(100), fused quartz, glass substrates and high aspect ratio (60:1) borosilicate glass micro-capillary plates. Prior to ALD processing all the substrates were degreased using a 10 min dip ultrasonic acetone cleaning. For Al$_2$O$_3$ growth, Al(CH$_3$)$_3$ [TMA] was obtained from Sigma-Aldrich with a 97% purity and deionized (DI) H$_2$O vapor was used as a precursors. For W ALD, tungsten hexafluoride (MoF$_6$, Alfa Aser, 99.9%) and disilane (Si$_2$H$_6$, Sigma-Aldrich, electronic grade 99.995%) were used as precursors. All precursors were maintained at room temperature at ~20° C. The background N$_2$ flow was set to 300 sccm which gives base pressure of 1.0 Torr in the ALD reaction chamber was measured by a heated MKS Baratron 629B model. The precursors TMA and H$_2$O were alternately pulsed in the continuously flowing N$_2$ carrier flow using high speed computer controlled pneumatics valves in a desire ALD sequence. During TMA and H$_2$O dosing, pressure transient increases of 0.2 Torr for TMA and 0.3 Torr for H$_2$O when the reactants were introduced into N$_2$ carrier flow nitrogen carrier flow. Similarly, MoF$_6$ and Si$_2$H$_6$ precursors were alternately injected into N$_2$ carrier flow. During Si$_2$H$_6$ and MoF$_6$ dosing, pressure transient increases of 0.25 Torr for Si$_2$H$_6$ and 50 mTorr for MoF$_6$. The main experimental conditions for ALD are summarized in Table 4.

TABLE 4

Experimental conditions for Mo:Al$_2$O$_3$

| No. | Parameters | Values |
|---|---|---|
| 1 | Precursor for Al$_2$O$_3$ | TMA and H$_2$O |
| 2 | Precursor for Mo | Si$_2$H$_6$ and MoF$_6$ |
| 3 | Number of ALD cycles for Mo:Al$_2$O$_3$ | Varied depend on desire thickness |
| 4 | Deposition temperature | 100-400° C. |
| 5 | Relative ratio of Mo:Al$_2$O$_3$ | Varied depend on the desire resistivity |
| 6 | Monitor Substrates | Quartz, Si(100), MCP, comb structures, Mo, Au TiN |
| 7 | ALD cycles | The purge and dose time adjusted according to desire resistivity |

The thicknesses of MoAlO$_x$ layers were determined using spectroscopic ellipsometry measurements on the Si monitor coupons. Annealing of MoAlO$_x$ composite layers were performed at 400° C. in 500 sccm flowing Ar condition for 4 hrs at pressure of 1 Torr. The film thicknesses were measured using ex-situ ellipsometry and supported by cross-section scanning electron microscopy (SEM) analysis and transmission electron microscopy (TEM). The microstructure and conformality of MoAlO$_x$ layer coatings on Si substrates and high aspect ratio glass micro-capillary plates were examined by cross-sectional scanning electron microscopy (SEM) model Hitachi 4700. The electrical I-V characteristics and thermal coefficient of resistance (TCR) of MoAlO$_x$ layers were measured using a Keithley Model 6487 pA/V source. Electrical measurements were done using either micro probes or Hg-probe contact method. The resistance stability test was performed for several days under constant applied potential in vacuum.

Figure 22:
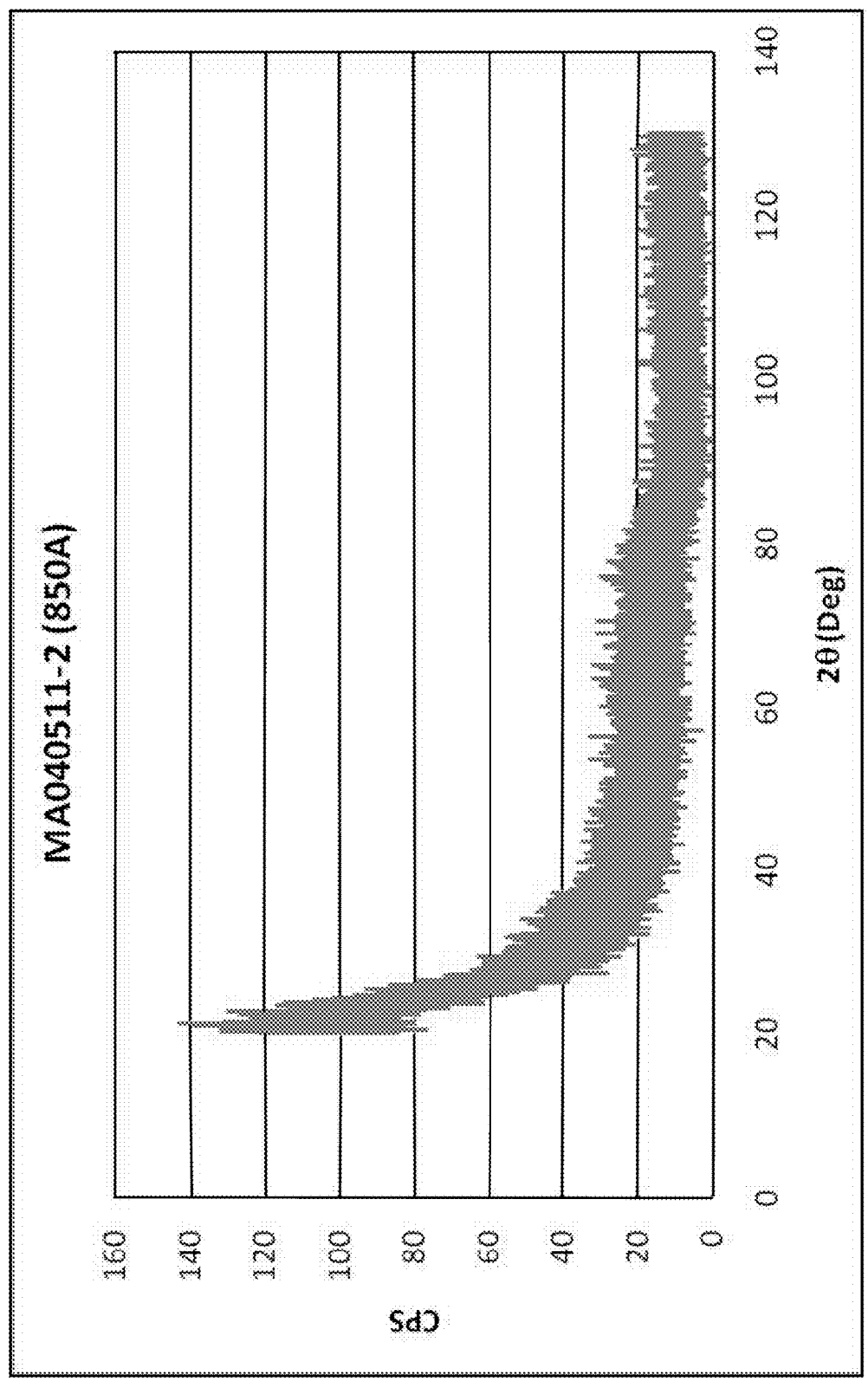
FIG. 22 shows an X-ray diffraction scan of an as-deposited MoAlO$_x$ layer having 8% Mo ALD cycles in an Al$_2$O$_3$ layer with amorphous structure.

X-ray diffraction (XRD) analysis was performed to test deposited materials crystallinity or preferred any crystallographic phase. X-ray diffraction of as deposited MoAlO$_x$ layers deposited with 8% Mo ALD cycles in Al$_2$O$_3$ layer shows an amorphous structure (see FIG. 22).

Figure 23B:
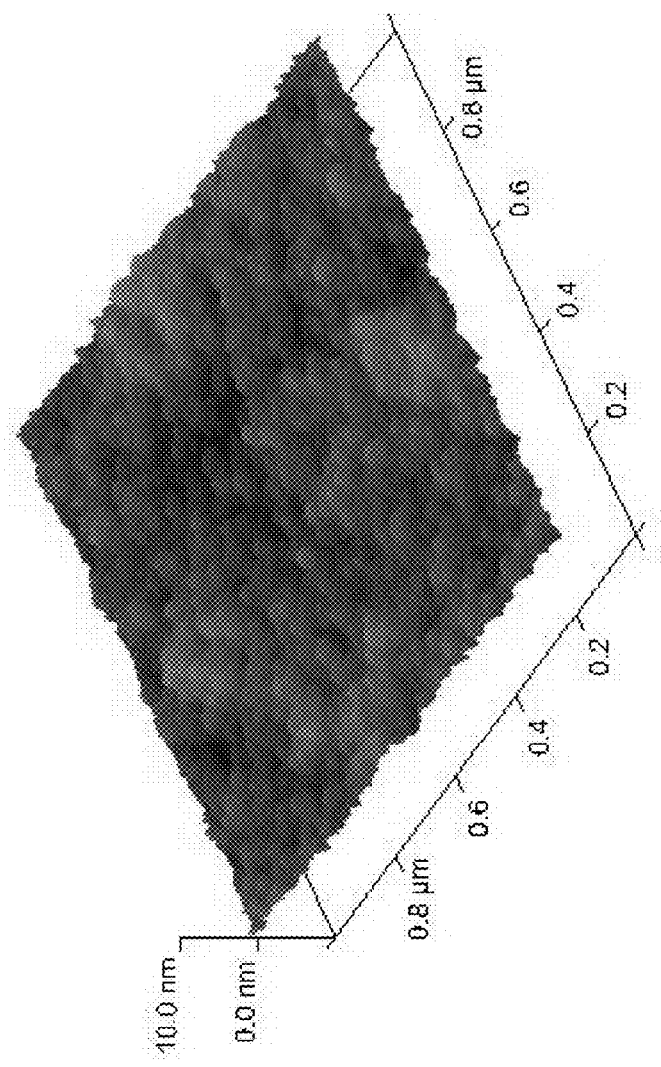
FIG. 23(b) shows an image of a surface view of the coating.
Figure 23A:
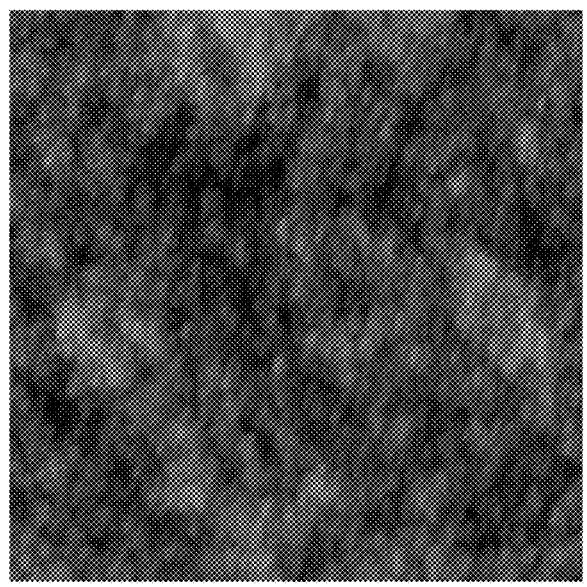
FIG. 23(a) shows AFM images of an ALD MoAlO$_x$ tunable resistance coating prepared using 8% Mo ALD cycles in a series of Al$_2$O$_3$ ALD cycles.

To evaluated the microstructure, surface roughness and uniformity of the deposited MoAlOx materials. AFM analysis (shown in FIGS. 23(a) and (b)) of ALD MoAlO$_x$ tunable resistance coating prepared using 8% Mo cycles. with a thickness of 910 Angstroms on borosilicate substrate. The film surface is very smooth and shows only fine, nanoscale features. The RMS roughness is 0.634 nm for 91 nm film.

Figure 24B:
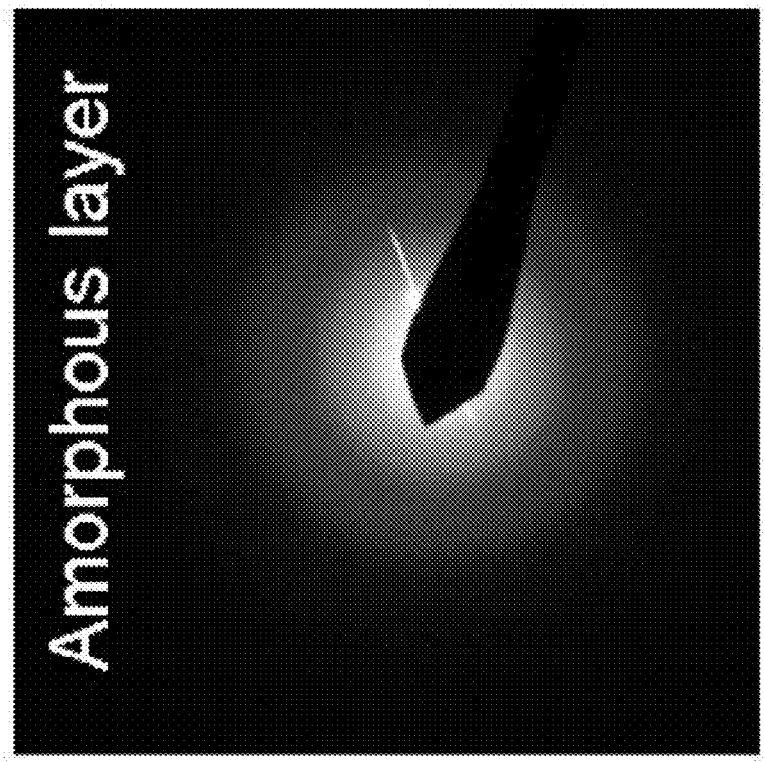
FIG. 24(b) shows a corresponding bright field TEM image.
Figure 24A:
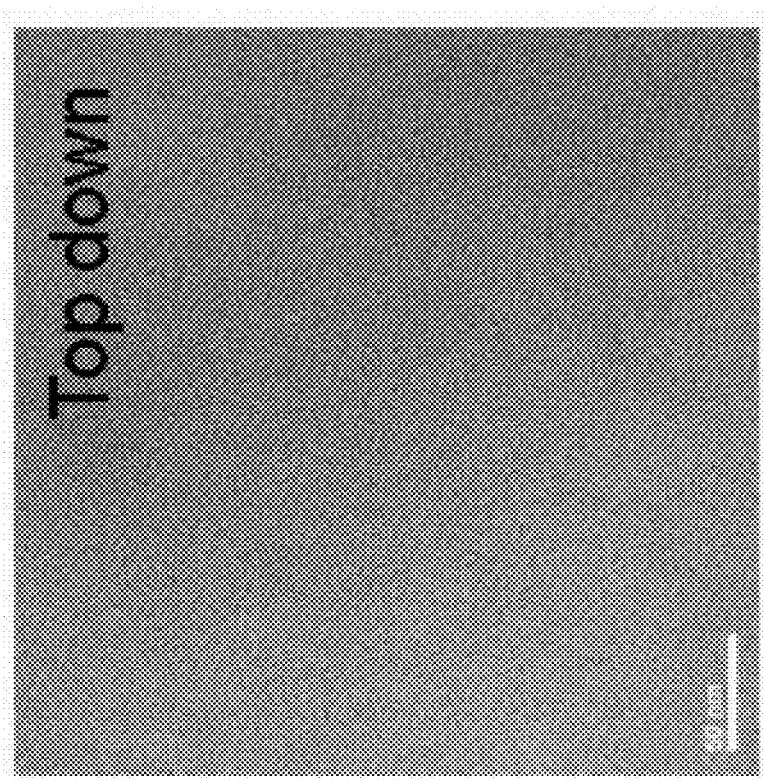
FIG. 24(a) shows a top down XTEM image of an ALD MoAlO$_x$ tunable resistance coating prepared using an 8% Mo cycle with a thickness of 760 Angstrom on a Si substrate.

To evaluated the across the layer microstructure, uniformity and crystallinity of the deposited materials MoAlOx films were analyzed with TEM. Top down transmission electron microscopy (XTEM) image FIG. 24(a) was performed on an ALD MoAlO$_x$ tunable resistance coating prepared using 8% Mo cycles with a thickness of 760 Angstroms on Si substrate. This image shows a uniform layer film on Si substrate and the TEM bright field image FIG. 24(b) confirms an amorphous layer deposited under these conditions which is desirable for the many microelectronics applications.

Figures 25A, 25B, 25C:
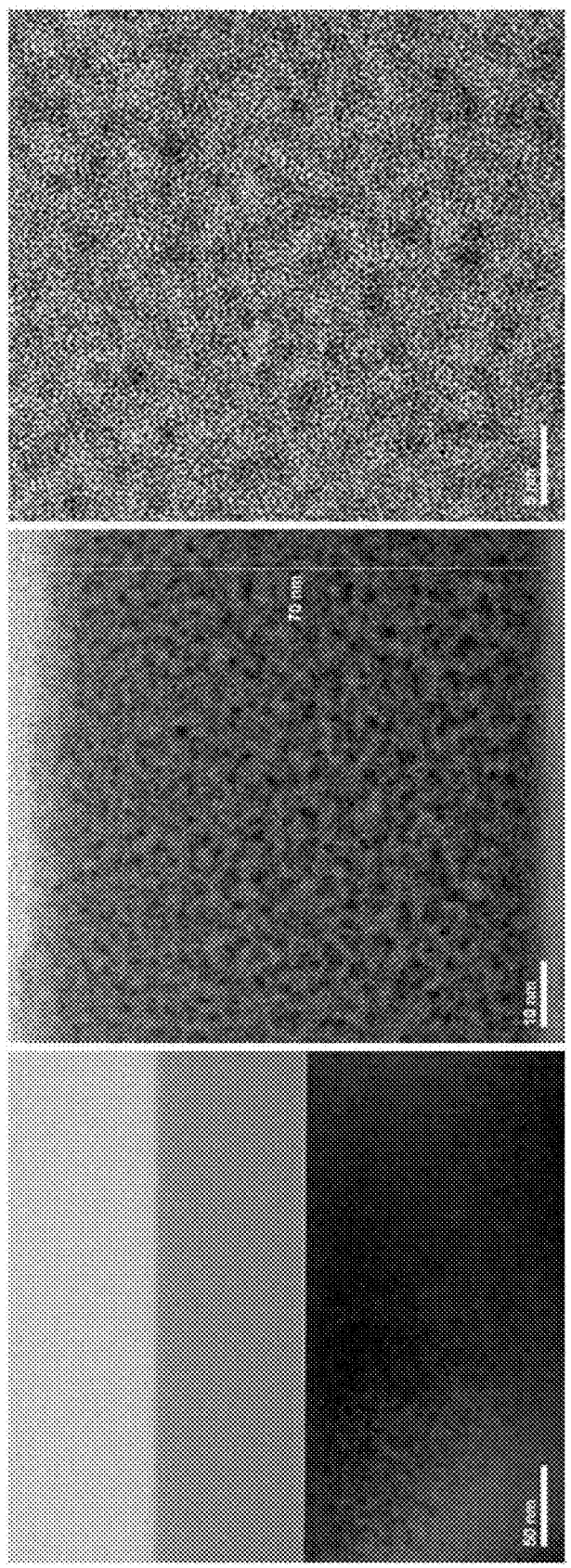
FIG. 25(a) shows a cross section XTEM image of an ALD MoAlO$_x$ tunable resistance coating prepared using 8% Mo cycles and 760 Angstrom thickness on an Si substrate.
FIGS. 25(b) and 25(c) show higher magnification views of FIG. 25(a)

The cross section transmission electron microscopy (XTEM) images of FIGS. 25(a)-(c) show an ALD MoAlO$_x$ unable resistance coatings prepared using 8% Mo cycles with a thickness of 760 Angstroms on Si substrate. These images illustrate the pinhole free film on Si substrate which contains nanoparticles of Mo embedded in amorphous Al$_2$O$_3$ matrix.

Figure 27A:
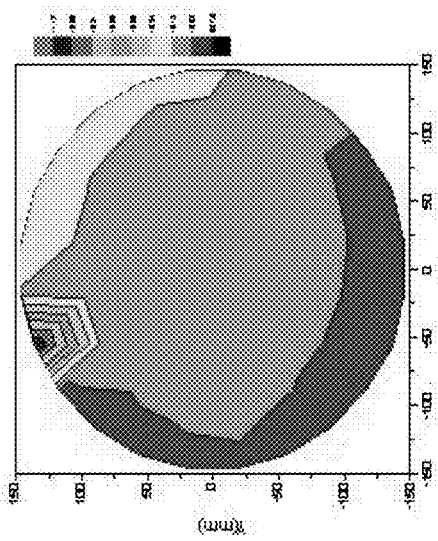
FIG. 27(a) shows a thickness contour map for 400 cycles with 5% Mo.
Figure 27B:
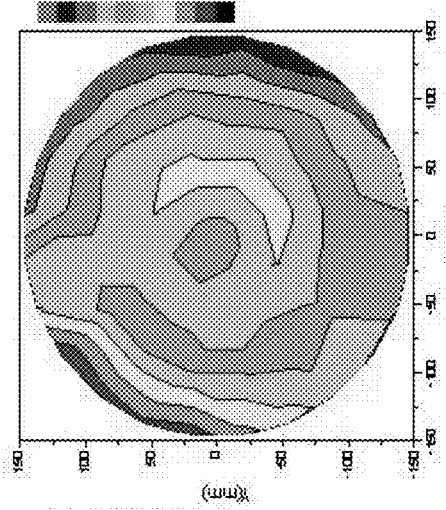
FIG. 27(b) shows refractive index for FIG. 27(a)
Figure 27C:
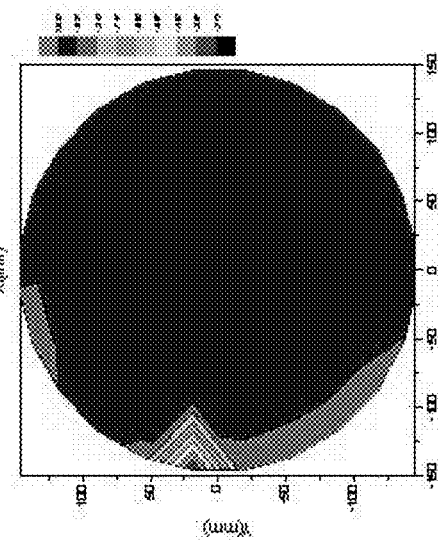
FIG. 27(c) shows contours for 8% Mo.
Figure 27D:
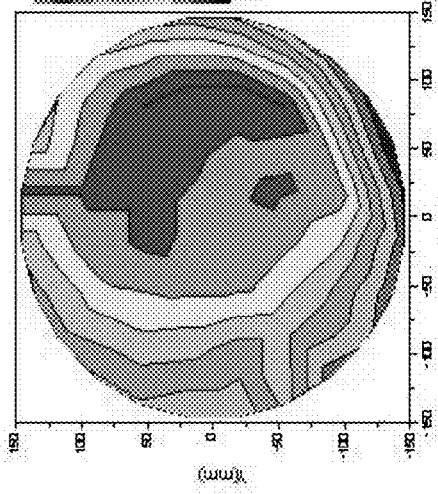
FIG. 27(d) shows refractive index for 27(c)
Figure 27E:
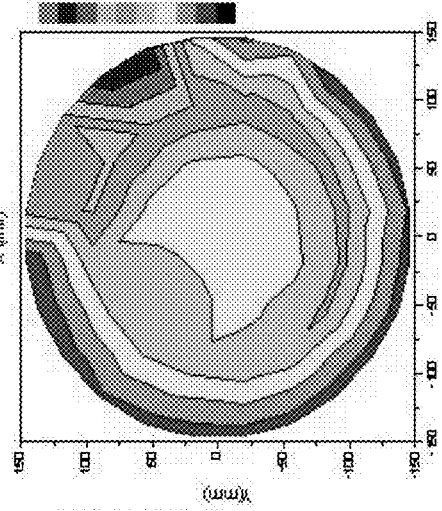
FIG. 27(e) contours for 12% Mo and FIG. 27(f) refractive index for 27(e)
Figure 27F:
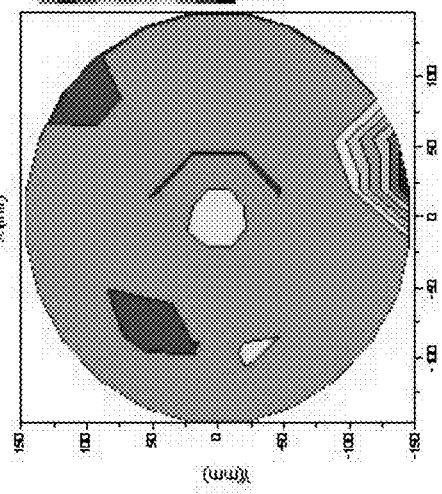

The MoAl$_2$O$_3$ processes were tested on the 300 mm Si wafer as well as 12"×12" glass substrate shown in FIG. 26(a); and it shows excellent thickness uniformity across the wafer shown in FIG. 27(b) and details are given in Table 5. Thickness contour maps are shown in FIGS. 27(a)-27(f) for MoAl$_2$O$_3$ films prepared using 500 cycles with various % Mo and also shown are associated refractive index maps for each % Mo example.

Figure 28:
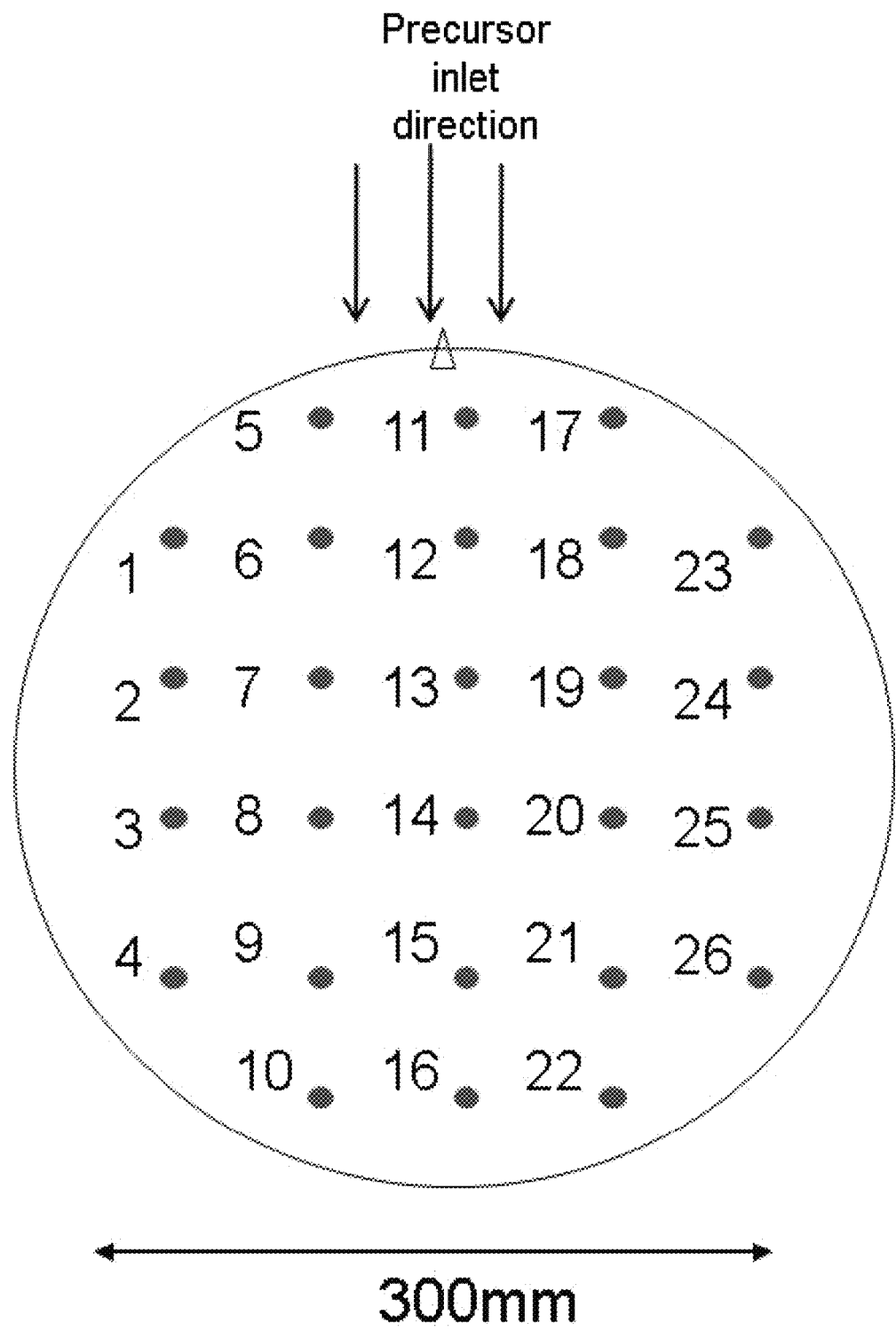
FIG. 28 is a schematic diagram of location of 26 kapton discs (back face electrodes) affixed to a Mo-coated 300 nm Si wafer prior to ALD MoAlO$_x$ film deposition with 8% Mo couple is Al$_2$O$_3$.
Figure 29A:
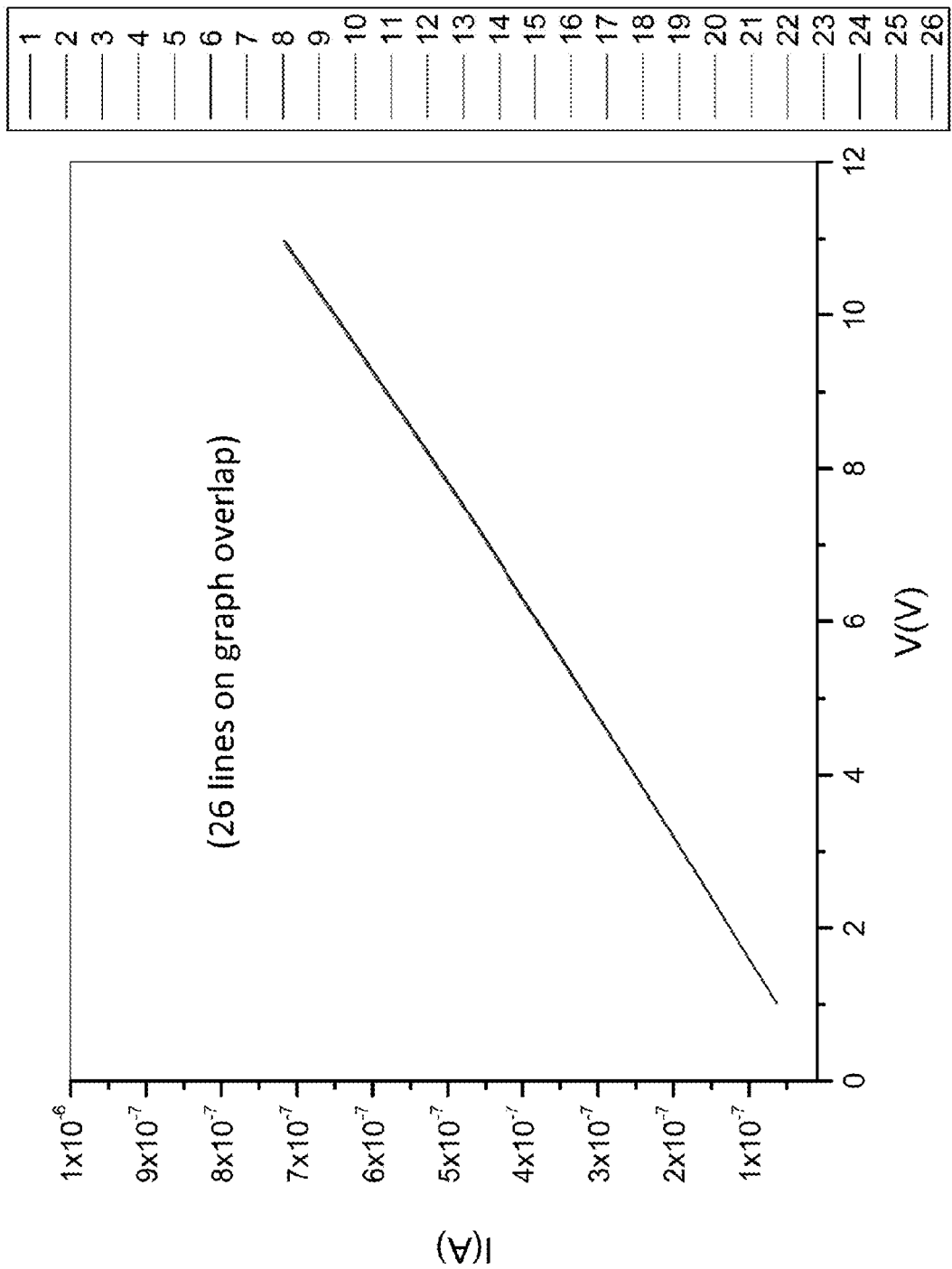
FIG. 29(a) shows a current/voltage plot of a MoAlO$_x$ film prepared using 8% Mo cycles with measurements performed at 26 locations on a 300 nm wafer (see FIG. 28)
Figure 29B:
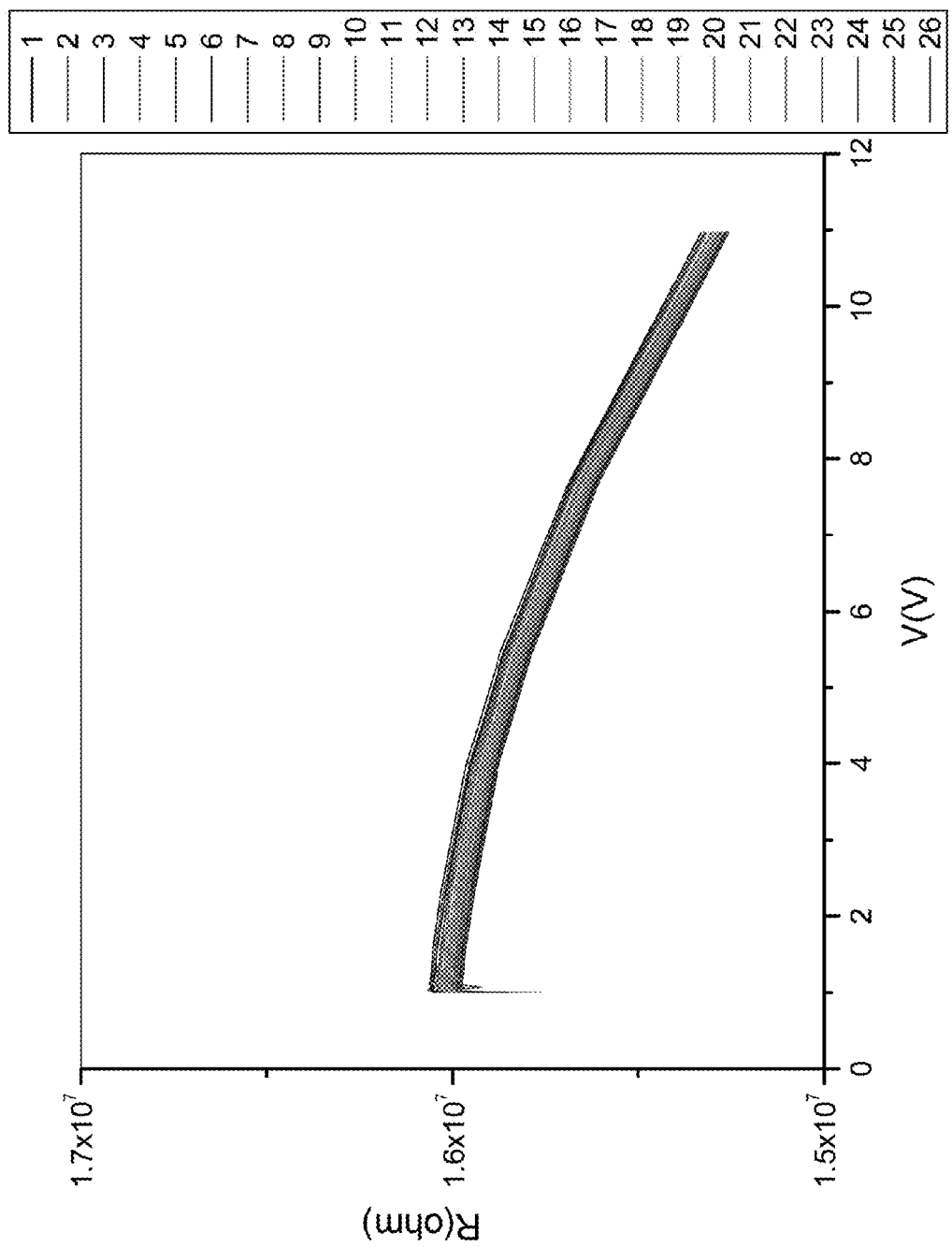
FIG. 29(b) shows a magnified portion of FIG. 29(a)
Figure 30:
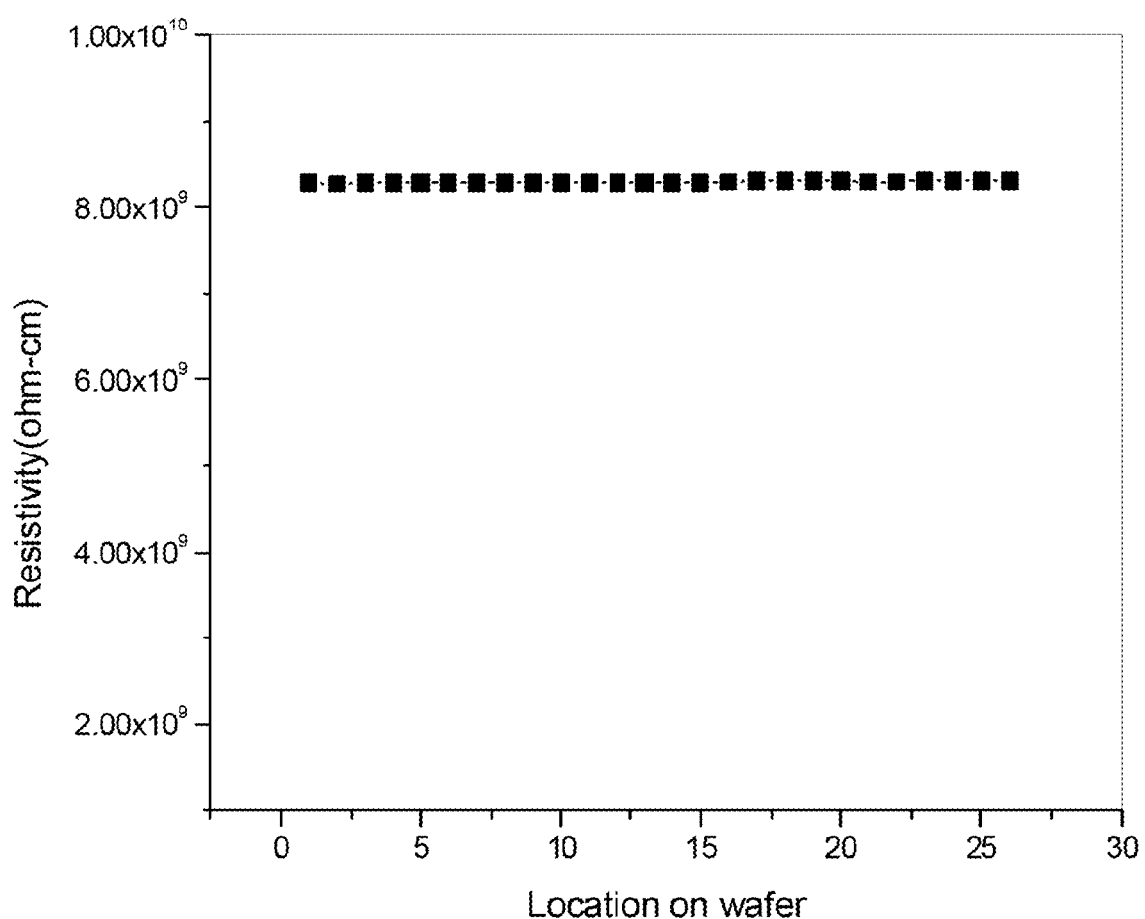
FIG. 30 shows transverse resistivity of a MoAlO$_x$ film prepared using 8% Mo cycles with resistivity obtained from I/V measurements at 26 locations on a 300 nm Si wafer (see FIG. 29(a)) with mean value of 8.29×10$^9$ ohm-cm and standard deviation 1.30×10$^7$ ohm-cm.
Figure 31B:
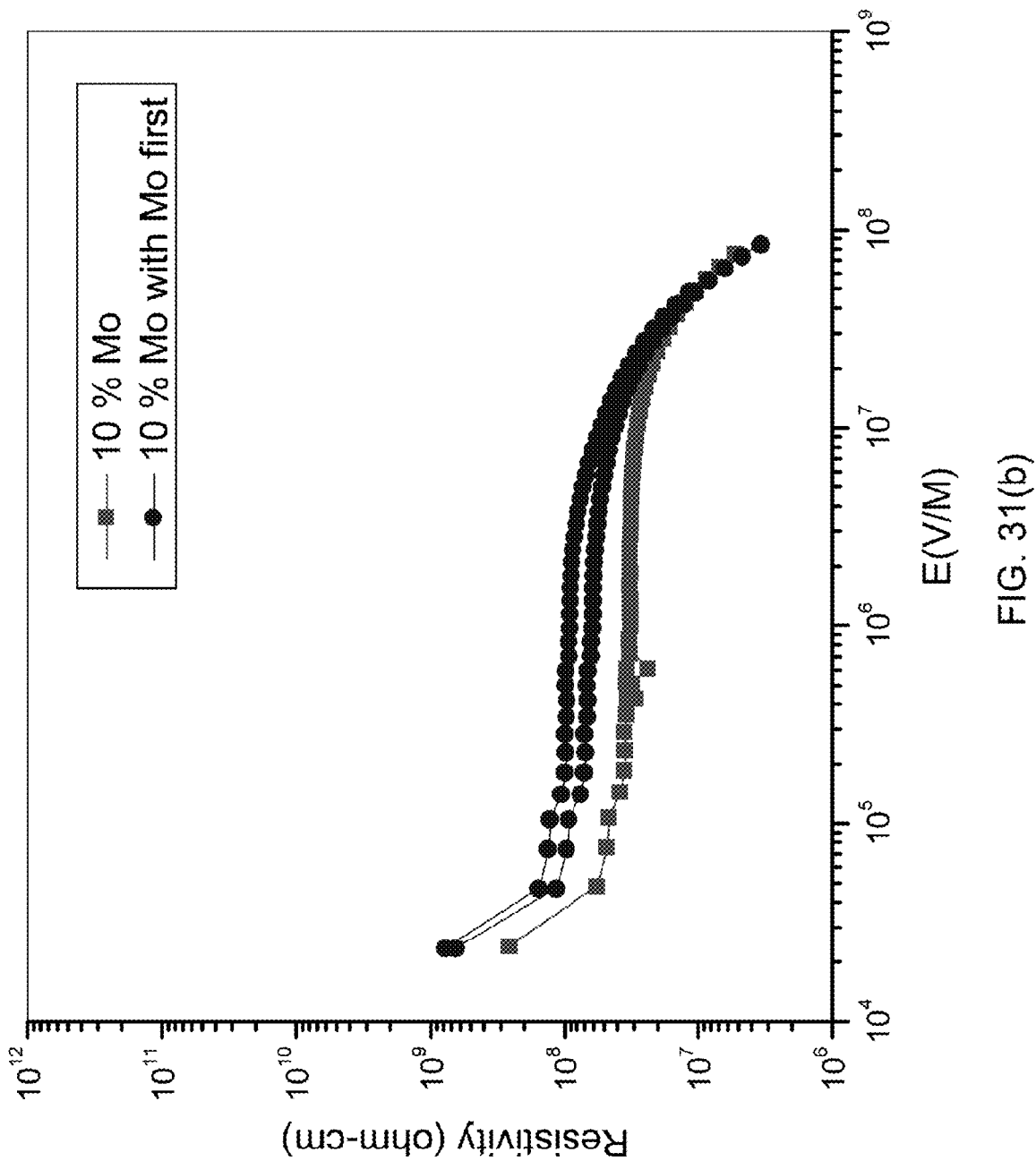
FIG. 31(b) shows longitudinal resistivity.
Figure 32:
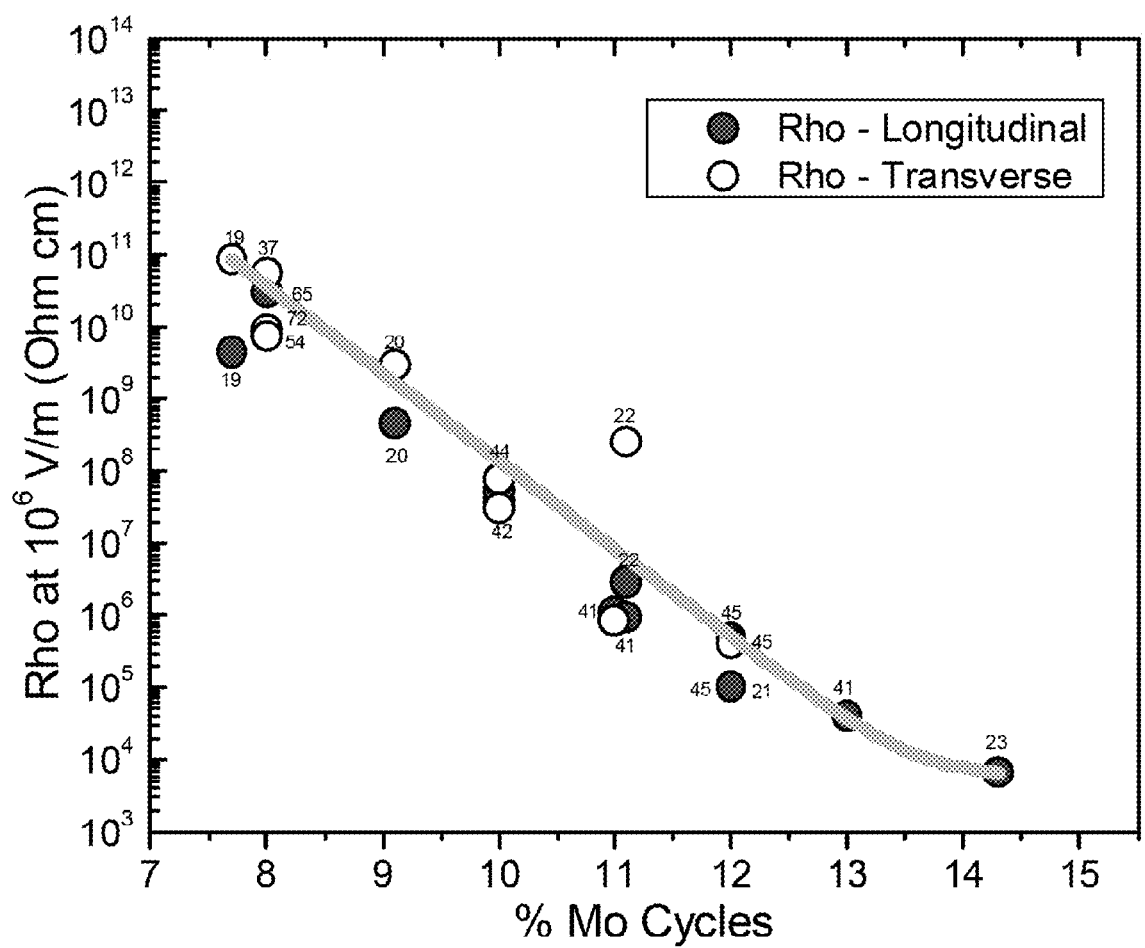
FIG. 32 shows longitudinal and transverse resistivities for ALD of MoAlO$_x$ coatings measured at a field of 10$^6$ V/m versus % Mo cycles with film thickness indicated at each data point.

Transverse electrical measurements of the MoAlOx layer were performed on the 300 mm Si wafer deposited first with Mo (served as bottom contact). The schematic of the test structures on 300 mm Si wafer is shown in FIG. 28. FIGS. 29-32 illustrate resulting data for these examples.

The MoAl$_2$O$_3$ layers were deposited with various thicknesses and compositions. The longitudinal and transverse resistivities were measured for several samples and plotted against the % of Mo ALD cycles in Al$_2$O$_3$ and shown in FIG. 32. Both transverse and longitudinal resistivities are more or less same within the experimental error limits.

Figure 33:
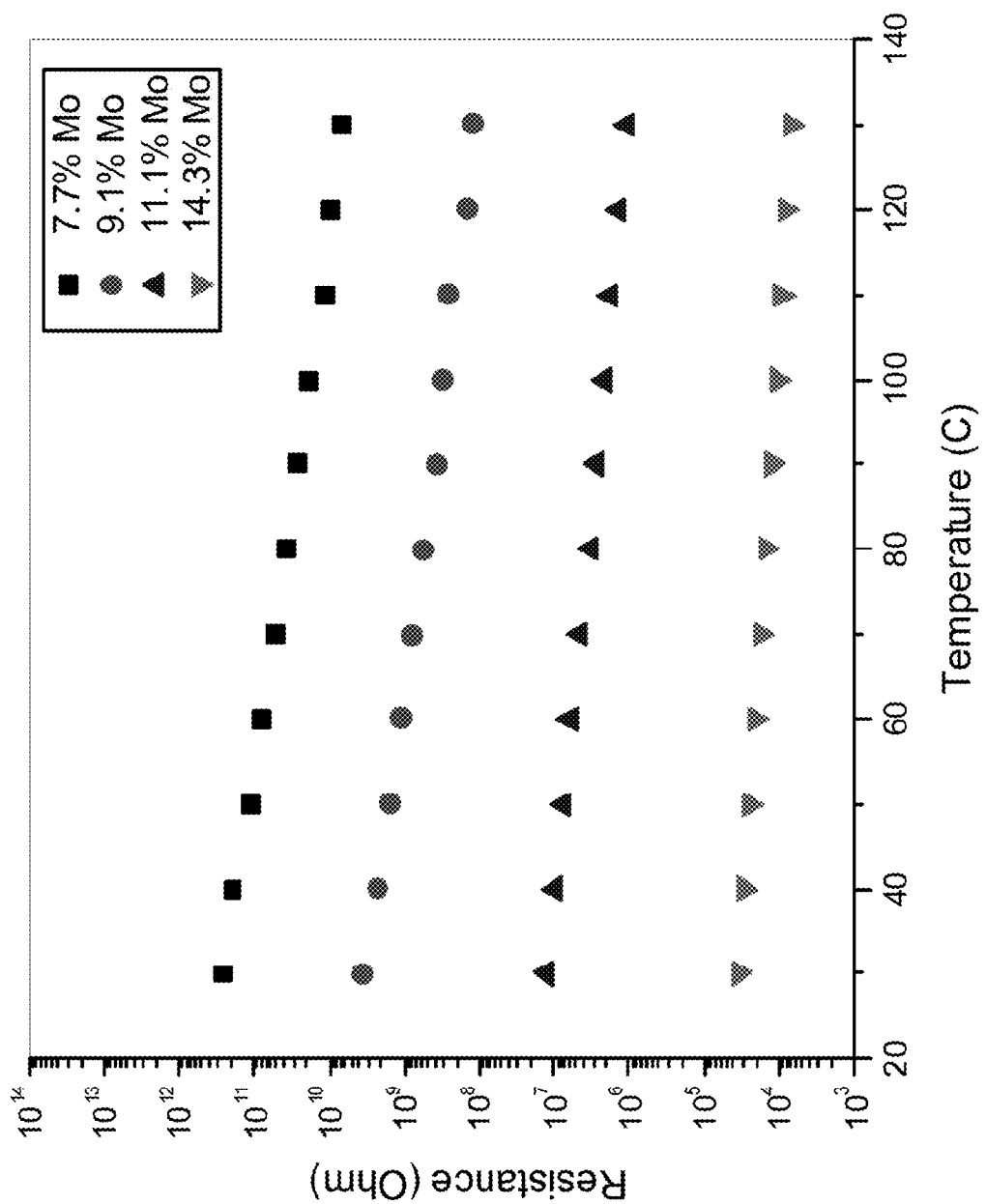
FIG. 33 shows temperature dependence of resistance of MoAlO$_x$ films of various % Mo.

I-V behavior in the temperature range 30-130° C. was measured for various Mo:Al$_2$O$_3$ layers The resistance at different temperatures are shown in FIG. 33 and plotted per $[R=Roe^{-(\beta T(T-To))}]$ A linear fit to this data give a negative slope which is a temperature coefficient of resistance. From these data we can extract the activation energy ($E_a$), which corresponds to the minimum energy required to transfer electrons from the donor level to the conduction band. Values of Ea obtained are given in last column of Table 6. This thermal coefficient and activation energy data are useful for thermistor and MEMS devices.

The temperature dependence of resistance was fit to:

$$R = Roe^{-(\beta_B T(T-To))}$$

Where R is resistance, T is temperature and R$_o$ is initial resistance at initial temperature and $\beta_T$ is the thermal coefficient of resistance.

For reference:

Commercial glass MCP: $\beta_T = -0.02$

Microchannel Silica MCP: $\beta_T = -0.036$

Aluminum zinc oxide coated MCP: $\beta_T = -0.06$

TABLE 5

Summary of data shown in FIGS. 27(a) and 27(b) giving minimum, maximum, average, and % standard deviation values for the thickness and refractive index data in these plots.

| | Thickness [A] | | | Index of refraction | | |
|---|---|---|---|---|---|---|
| Mo % => | 5 | 8 | 12 | 5 | 8 | 12 |
| Minimum | 608 | 775 | 987 | 1.62 | 1.72 | 1.92 |
| Maximum | 619 | 794 | 1112 | 1.67 | 1.77 | 2.03 |
| Average | 613 | 785 | 1010 | 1.63 | 1.73 | 1.96 |
| % STDV (1 σ) | 0.52 | 0.57 | 1.82 | 0.48 | 0.84 | 1.35 |

TABLE 6

Summary of measurements of resistance of MoAlO$_x$ films for different %
Mo. Column 6 lists the $\beta_T$ value, the thermal coefficient of resistance. $\beta_T$ decreases
with increasing % Mo. Slope and Ea are described in FIG. 33.

| Sample | # cycles | Mo % | Comments | Thickness (A) | $\beta_T$ | Slope | Ea (eV) |
|---|---|---|---|---|---|---|---|
| D20 | 130 | 7.7 | 10:120 = Mo:AlO | 193 | −0.03683 | 4509 | 0.39 |
| D21 | 132 | 9.1 | 12:120 = Mo:AlO | 201 | −0.02800 | 4056 | 0.35 |
| D22 | 135 | 11.1 | 15:120 = Mo:AlO | 215 | −0.00962 | 2987 | 0.26 |
| D37 | 140 | 14.3 | 20:120 = Mo:AlO | 230 | −0.00112 | 1940 | 0.17 |

The growth of ALD MoAlO$_x$ layer on high aspect ratio 3D structures was also evaluated. ALD MoAlO$_x$ tunable resistance coatings were prepared using 8% Mo ALD cycles in Al$_2$O$_3$ on the inside surface of a porous borosilicate capillary glass array showing excellent thickness uniformity, conformality, and smoothness of the films SEM images of ALD MoAlO$_x$ tunable resistance coating prepared using 8% Mo ALD cycles in Al$_2$O$_3$ on inside surface of porous borosilicate capillary glass array showing excellent thickness uniformity, conformality, and smoothness of the films.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of tunably forming a film of selected resistance comprising:
    selecting a starting conducting material and selecting a starting insulating material comprised of aluminum and fluorine;
    performing deposition of the starting conducting material for a first prescribed number of cycles; and
    performing deposition of the starting insulating material for a second prescribed number of cycles performing the deposition of the starting conducting and starting insulating material by circulating to intermix the layers at boundaries between the layers whereby the conducting and insulating materials are intimately intermixed with domains of the film do not exhibit bulk-like properties and do not form distinct layers of the conducting material and the insulating material, thereby achieving the selected resistance for an end product comprised of the conducting material and an aluminum fluoride compound.

2. The method as defined in claim 1 wherein the deposition step comprises an ALD process.

3. The method as defined in claim 1 wherein the deposition step comprises using a deposition method selected from the group of CVD, MOCVD, OMCVD, PECVD, PVD, MBE, reactive sputtering, PLD and evaporation.

4. The method as defined in claim 1 wherein the starting conducting material is selected from the group of metals, nitrides, sulphides and TCOs.

5. The method as defined in claim 4 wherein the metals are selected from the group of W and Mo.

6. The method as defined in claim 1 wherein the starting conducting material has a resistivity of about $10^{-5}$ to $10\Omega$ cm.

7. The method as defined in claim 1 wherein the deposited insulating material comprises aluminum fluoride trihydrate.

8. The method as defined in claim 7 wherein the starting insulating material comprises trimethyl aluminum and WF$_6$.

9. The method as defined in claim 1 wherein the starting insulating material has a resistivity of about $10^6$ to $10^{15}\Omega$ cm.

10. The method as defined in claim 1 wherein selected percentages of the deposited conducting material is less than selected percentage of the deposited insulating material.

11. The method as defined in claim 10 wherein the selected percentage of the starting conducting material ranges from about 6-12%.

12. The method as defined in claim 11 wherein the starting conducting material is selected from the group of W and Mo.

13. The method as defined in claim 12 wherein the selected starting insulating material AlO$_x$ and WF$_6$.

14. The method as defined in claim 12 wherein the starting material is selected from the group of fluorides, nitrides, oxides and carbides.

15. An article of manufacture, comprising a thin film of composite intermixed materials including at least two materials selected from the group of an insulating material comprised of aluminum fluoride trihydrate and a conducting material with a pre-selected tuned electrical resistance associated with a percentage of deposition cycles of each of the insulating and the conducting materials which are intermixed and not distinct layers.

16. The article as defined in claim 15 wherein the composite materials include islands of the conducting material disposed between the insulating material.

17. The article as defined in claim 16 wherein the islands of conducting material consist essentially of W.

18. The article of manufacture as defined in claim 15 wherein layers of the insulating and the conducting material are intermixed to form a structure unlike a bulk form for each of the materials.

19. The article of manufacture as defined in claim 18 wherein the intermixed structure comprises an amorphous structure.

* * * * *